(12) United States Patent
Tsai et al.

(10) Patent No.: US 12,507,450 B2
(45) Date of Patent: Dec. 23, 2025

(54) SEMICONDUCTOR DEVICE STRUCTURE AND METHOD FOR FORMING THE SAME

(71) Applicant: Taiwan Semiconductor Manufacturing Company, Ltd., Hsinchu (TW)

(72) Inventors: Ming-Heng Tsai, Taipei (TW); Chun-Sheng Liang, Changhua County (TW); Ta-Chun Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 383 days.

(21) Appl. No.: 18/331,436

(22) Filed: Jun. 8, 2023

(65) Prior Publication Data

US 2024/0413202 A1 Dec. 12, 2024

(51) Int. Cl.
| | |
|---|---|
| *H10D 62/10* | (2025.01) |
| *H01L 21/762* | (2006.01) |
| *H10D 30/01* | (2025.01) |
| *H10D 30/43* | (2025.01) |
| *H10D 30/67* | (2025.01) |
| *H10D 62/13* | (2025.01) |
| *H10D 64/01* | (2025.01) |
| *H10D 84/01* | (2025.01) |
| *H10D 84/03* | (2025.01) |
| *H10D 84/83* | (2025.01) |

(52) U.S. Cl.
CPC ..... *H10D 62/121* (2025.01); *H01L 21/76224* (2013.01); *H10D 30/014* (2025.01); *H10D 30/43* (2025.01); *H10D 30/6735* (2025.01); *H10D 30/6757* (2025.01); *H10D 62/151* (2025.01); *H10D 64/017* (2025.01); *H10D 84/013* (2025.01); *H10D 84/0151* (2025.01); *H10D 84/038* (2025.01); *H10D 84/83* (2025.01)

(58) Field of Classification Search
CPC .. H10D 62/121; H10D 30/014; H10D 64/017; H10D 84/0151; H01L 21/76224
USPC .......................................................... 257/288
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |

(Continued)

*Primary Examiner* — Igwe U Anya
(74) *Attorney, Agent, or Firm* — McClure, Qualey & Rodack, LLP

(57) ABSTRACT

Semiconductor device structures and methods for manufacturing the same are provided. A semiconductor device structure is provided. The semiconductor device structure includes an isolation structure formed over a substrate, and first nanostructures formed over the isolation structure along a first direction. The semiconductor device structure includes a first gate structure formed over the first nanostructures along a second direction, and a first dielectric structure formed adjacent to the first nanostructures along the first direction. The first dielectric structure is in direct contact with the first nanostructures. The semiconductor device structure includes a second gate structure formed adjacent to the first gate structure, and the second gate structure is formed directly over the first dielectric structure.

20 Claims, 51 Drawing Sheets

(56) References Cited

U.S. PATENT DOCUMENTS

| | | |
|---|---|---|
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2022/0130991 A1* | 4/2022 | Yu ................... H10D 84/0151 |
| 2023/0395677 A1* | 12/2023 | Kao ................... H10D 30/024 |

* cited by examiner

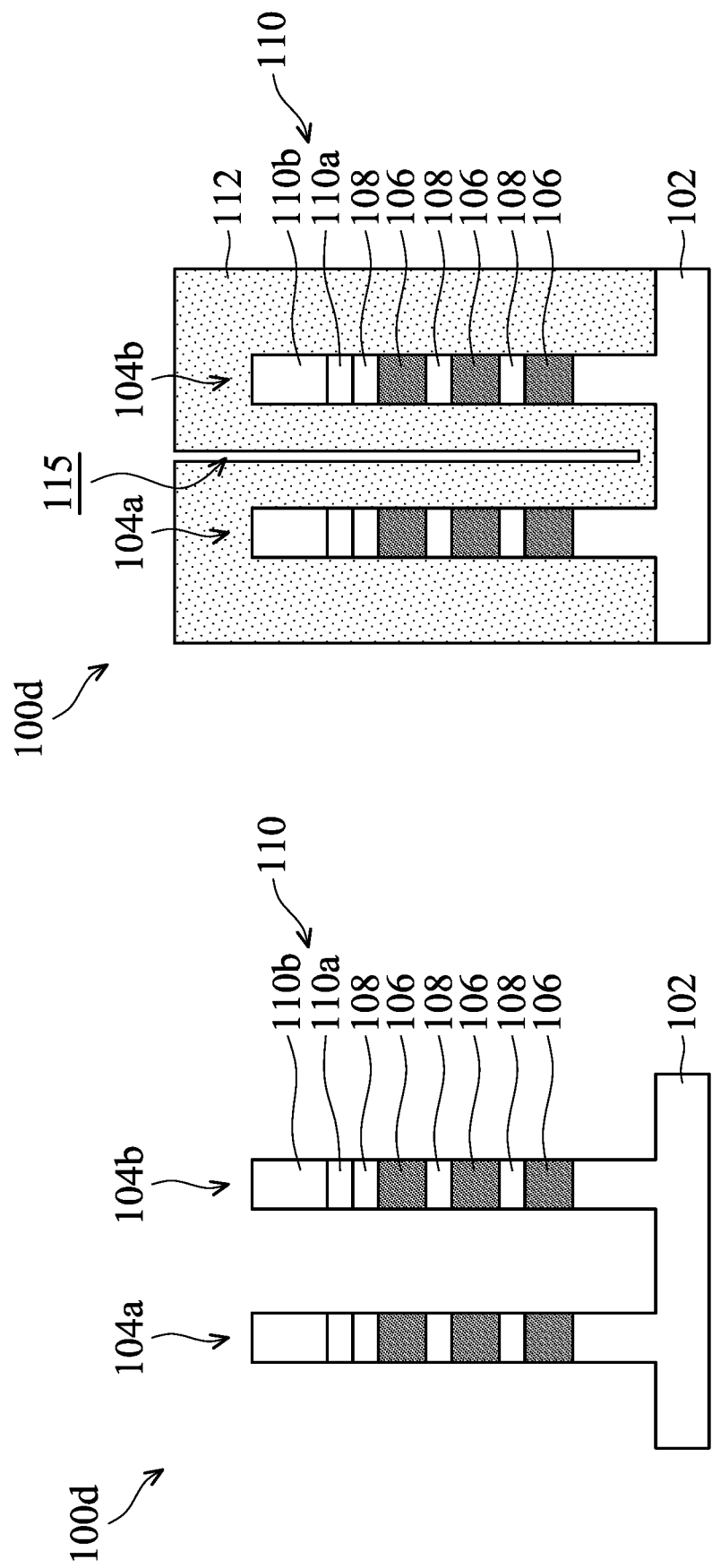

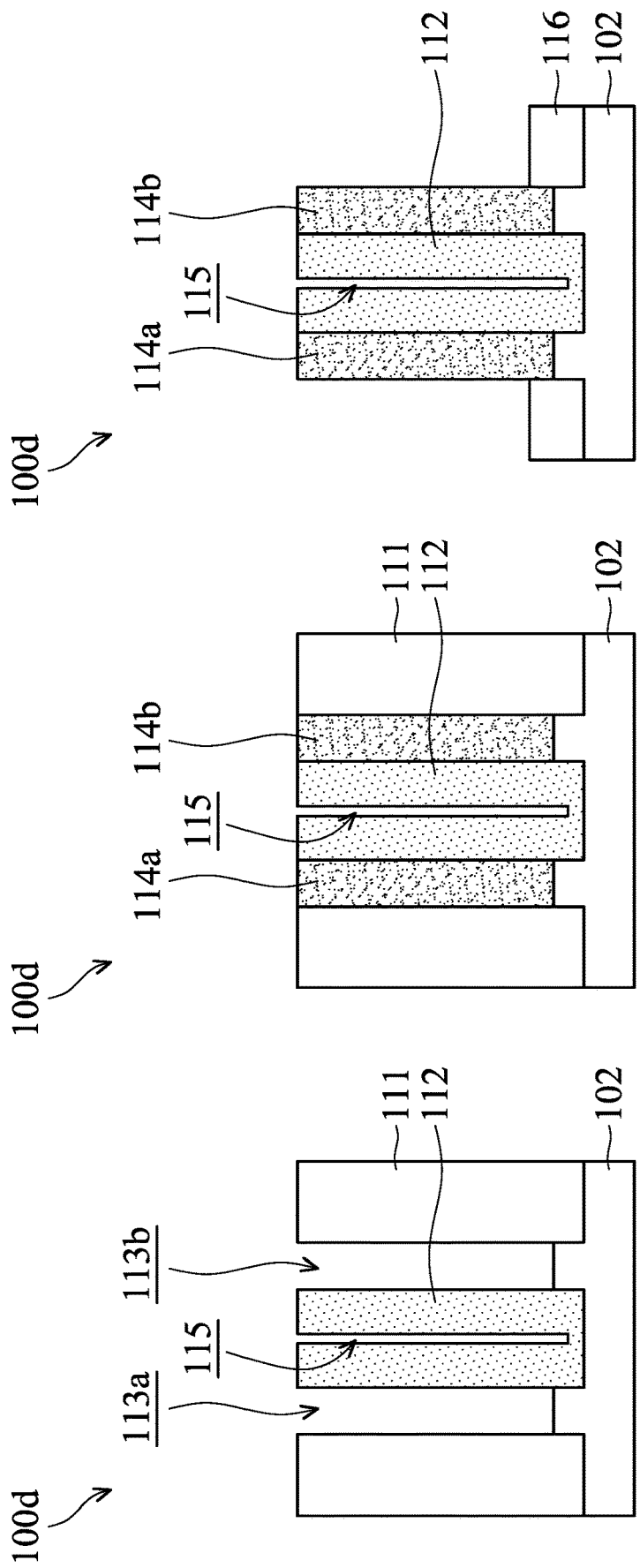

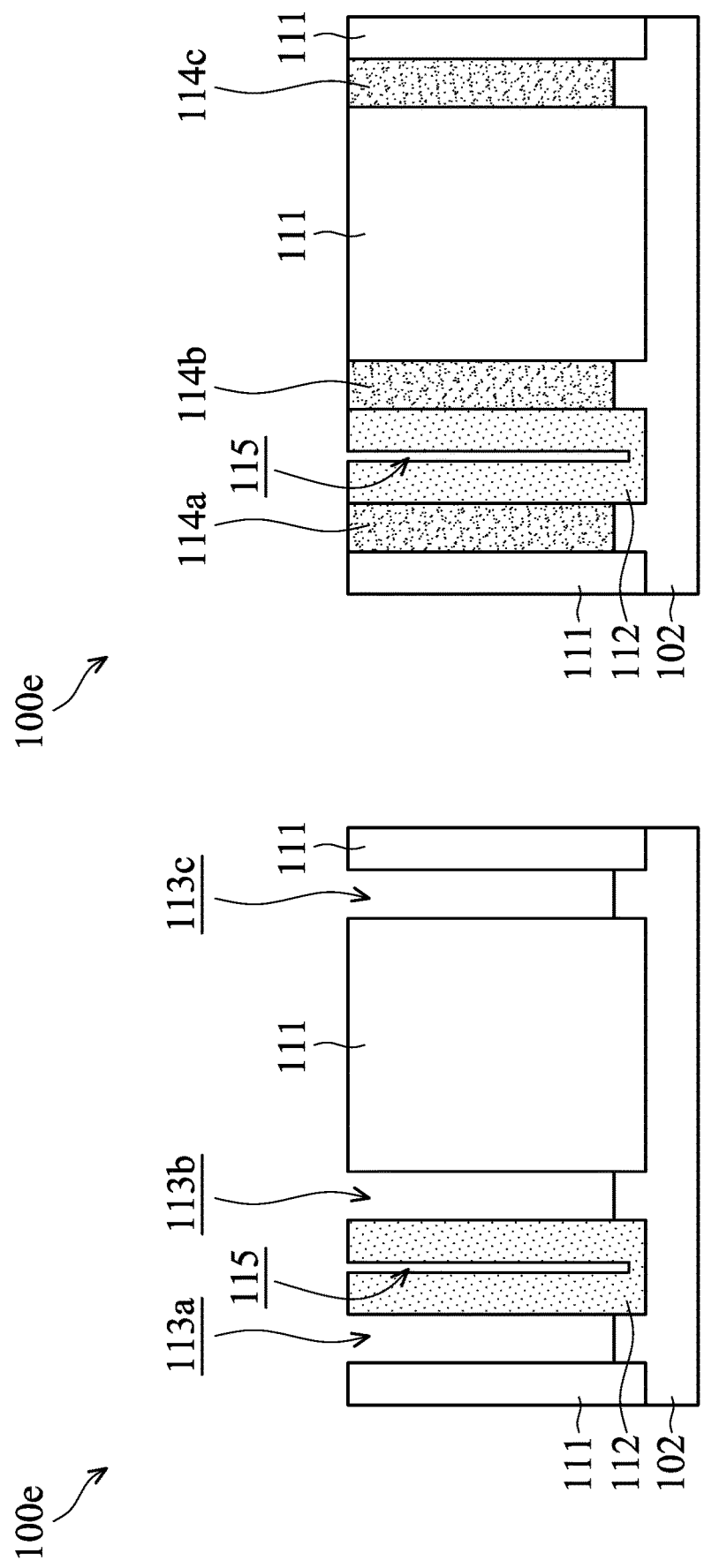

SEMICONDUCTOR DEVICE STRUCTURE AND METHOD FOR FORMING THE SAME

BACKGROUND

The electronics industry is experiencing ever-increasing demand for smaller and faster electronic devices that are able to perform a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). However, integration of fabrication of the multi-gate devices can be challenging.

BRIEF DESCRIPTION OF THE DRAWINGS

Aspects of the present disclosure are best understood from the following detailed description when read with the accompanying Figures. It should be noted that, in accordance with the standard practice in the industry, various features are not drawn to scale. In fact, the dimensions of the various features may be arbitrarily increased or reduced for clarity of discussion.

FIGS. 8A to 8G show cross-sectional representations of various stages of manufacturing the semiconductor device structure shown along line B-B' in FIGS. 7A-7F in accordance with some embodiments.

FIGS. 12A to 12G show cross-sectional representations of various stages of manufacturing the semiconductor device structure shown along line B-B' in FIGS. 7A-7F in accordance with some embodiments.

DETAILED DESCRIPTION

Figure 1A:
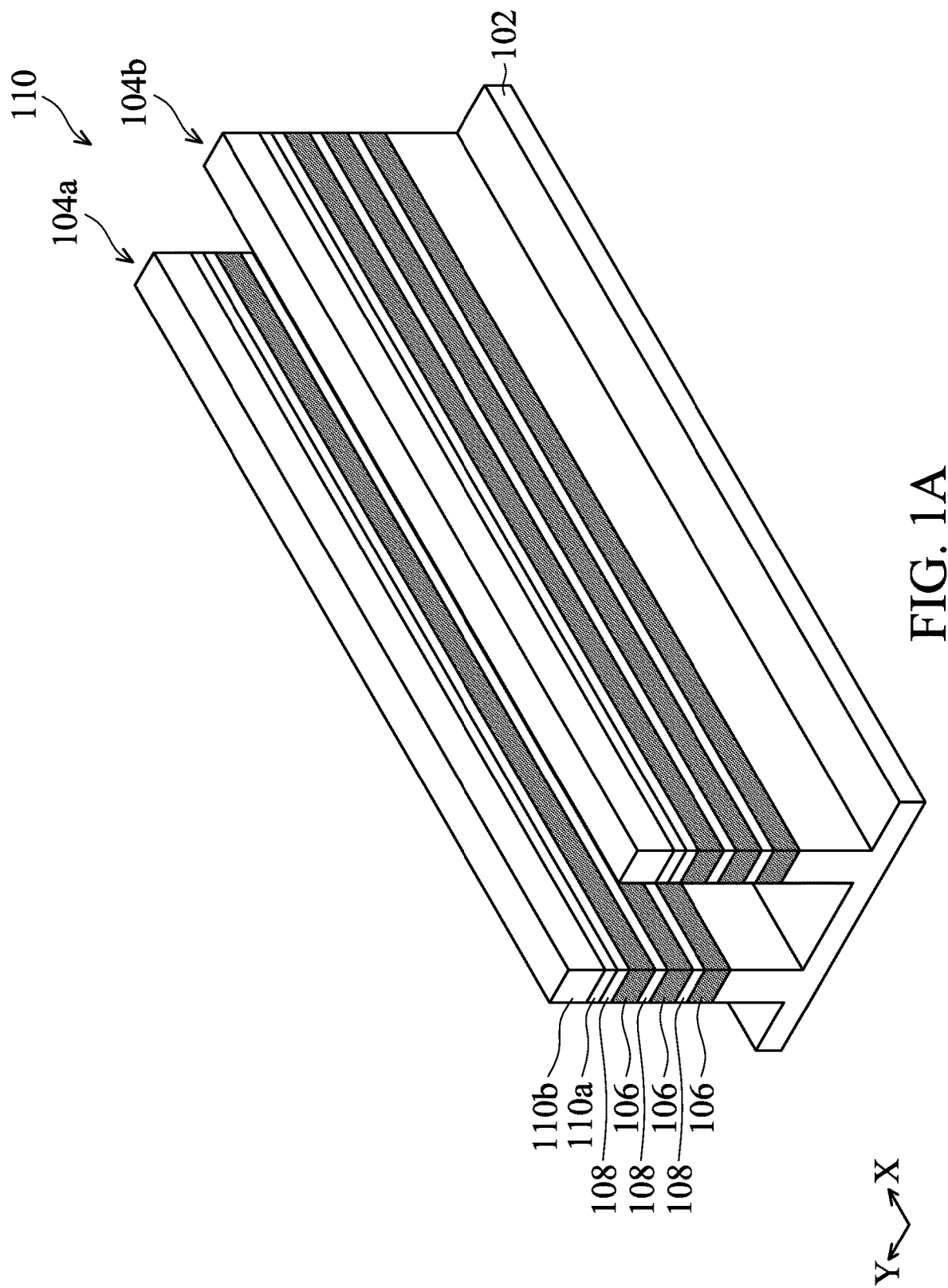
FIGS. 1A to 1G show perspective views of intermediate stages of manufacturing a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The fins described below may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Embodiments of semiconductor device structures and methods for forming the same are provided. There is a cut region to provide an isolation function. The first fin structure and the second fin structure including stacking layers are formed over the substrate. The top portion of the first fin structure is removed, leaving the remaining first fin structure. The top portion of the second fin structure is removed, leaving the remaining second fin structure. The first dielectric structure and the second dielectric structure are formed on the remaining fin structures. The first dielectric structure and the second dielectric structure provide enough support, and thus the gate structures formed on the first dielectric structure and the second dielectric structure may not collapse. In addition, the dielectric wall is formed between the first dielectric structure and the second dielectric structure in the cut region, and the damage of the dielectric wall is reduced compared with no dielectric wall in the cut region. Therefore, the performance of the semiconductor device structure is improved. The source/drain (S/D) structure or region(s) may refer to a source or a drain, individually or collectively dependent upon the context.

FIGS. 1A to 1G show perspective views of intermediate stages of manufacturing a semiconductor device structure 100a, in accordance with some embodiments. FIGS. 2A to 2G show top-views of intermediate stages of manufacturing the semiconductor device structure 100a, in accordance with some embodiments.

Figure 2A:
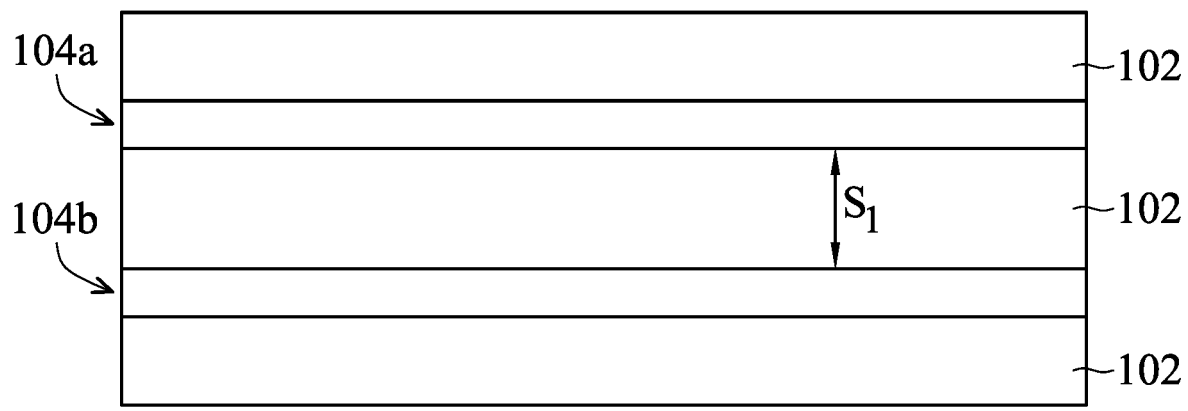
FIGS. 2A to 2G show top-views of intermediate stages of manufacturing the semiconductor device structure, in accordance with some embodiments.

As shown in FIGS. 1A and 2A, first semiconductor material layers 106 and second semiconductor material layers 108 are formed over a substrate 102.

The substrate 102 may be a semiconductor wafer such as a silicon wafer. Alternatively or additionally, the substrate 102 may include elementary semiconductor materials, compound semiconductor materials, and/or alloy semiconductor materials. Elementary semiconductor materials may include, but are not limited to, crystal silicon, polycrystalline silicon, amorphous silicon, germanium, and/or diamond. Compound semiconductor materials may include, but are not limited to, silicon carbide, gallium arsenic, gallium phosphide, indium phosphide, indium arsenide, and/or indium antimonide. Alloy semiconductor materials may include, but are not limited to, SiGe, GaAsP, AlInAs, AlGaAs, GaInAs, GaInP, and/or GaInAsP.

In some embodiments, the first semiconductor material layers 106 and the second semiconductor material layers 108 are alternately stacked over the substrate 102. In some embodiment, the first semiconductor material layers 106 and the second semiconductor material layers 108 are made of different semiconductor materials. In some embodiments, the first semiconductor material layers 106 are made of SiGe, and the second semiconductor material layers 108 are made of silicon. It should be noted that although three first semiconductor material layers 106 and three second semiconductor material layers 108 are formed, the semiconductor device structure may include more or fewer first semiconductor material layers 106 and second semiconductor material layers 108. For example, the semiconductor device structure may include two to five of the first semiconductor material layers 106 and the second semiconductor material layers.

The first semiconductor material layers 106 and the second semiconductor material layers 108 may be formed by using low-pressure chemical vapor deposition (LPCVD), epitaxial growth process, another suitable method, or a combination thereof. In some embodiments, the epitaxial growth process includes molecular beam epitaxy (MBE), metal organic chemical vapor deposition (MOCVD), or vapor phase epitaxy (VPE).

Next, after the first semiconductor material layers 106 and the second semiconductor material layers 108 are formed as a semiconductor material stack over the substrate 102, the semiconductor material stack is patterned to form a first fin structure 104a and a second fin structure 104b, in accordance with some embodiments. In some embodiments, each of the first fin structure 104a and a second fin structure 104b includes a base fin structure 105 and the semiconductor material stack of the first semiconductor material layers 106 and the second semiconductor material layers 108. The first fin structure 104a and the second fin structure 104b are arranged in parallel to each other along the first direction (e.g. X-axis). There is a first distance $S_1$ between the sidewall surface of the first fin structure 104a and the sidewall surface of the second fin structure 104b along the second direction (e.g. Y-axis). In some embodiments, the first distance $S_1$ is in a range from about 30 nm to about 500 nm.

In some embodiments, the patterning process includes forming a mask structure 110 over the semiconductor material stack, and etching the semiconductor material stack and the underlying substrate 102 through the mask structure 110. In some embodiments, the mask structure 110 is a multilayer structure including a pad oxide layer 110a and a nitride layer 110b formed over the pad oxide layer 110a. The pad oxide layer 110a may be made of silicon oxide, which is formed by thermal oxidation or chemical vapor deposition (CVD), and the nitride layer 110b may be made of silicon nitride, which is formed by chemical vapor deposition (CVD), such as low-temperature chemical vapor deposition (LPCVD) or plasma-enhanced CVD (PECVD).

Figure 1B:
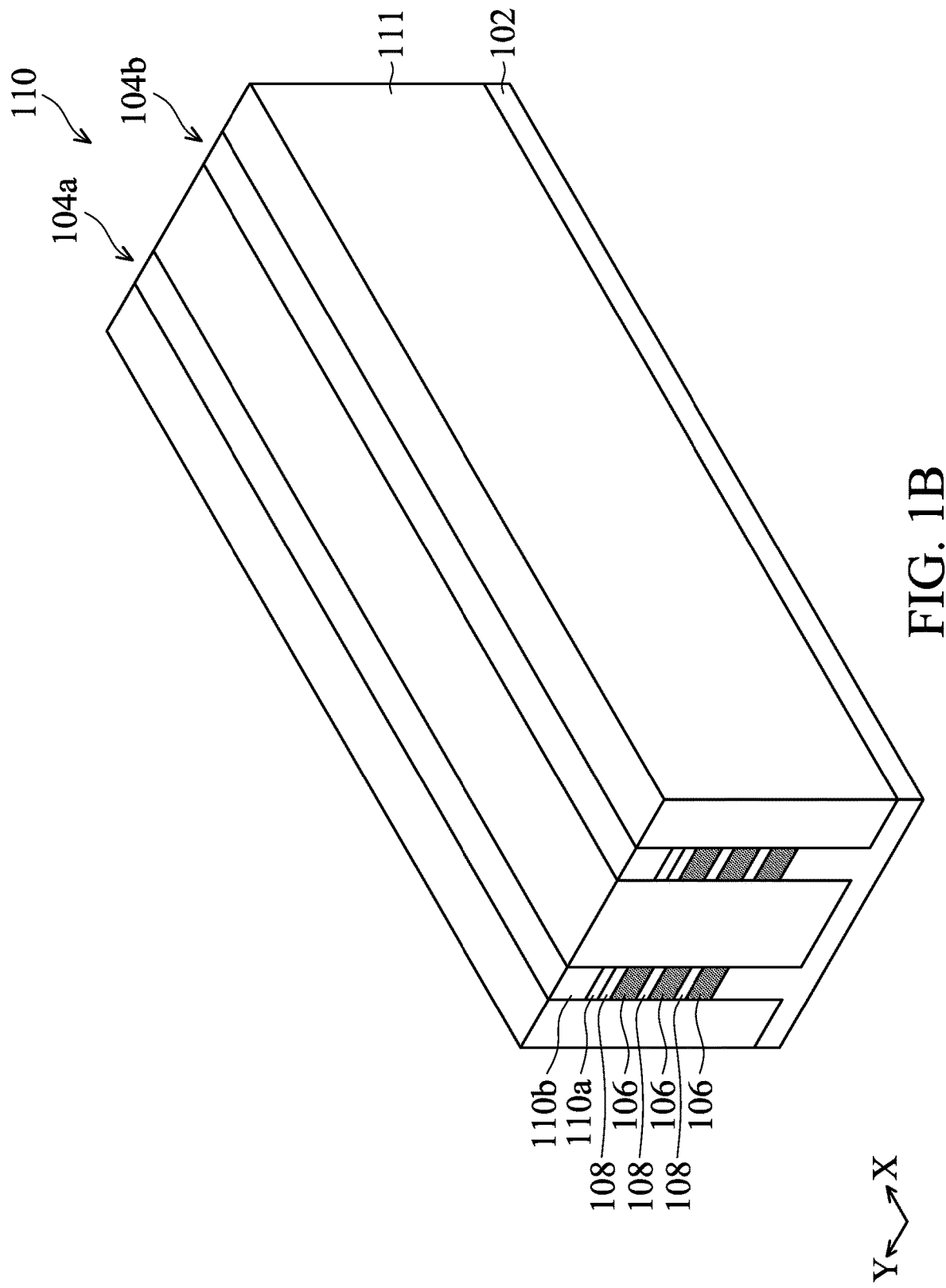
Figure 2B:
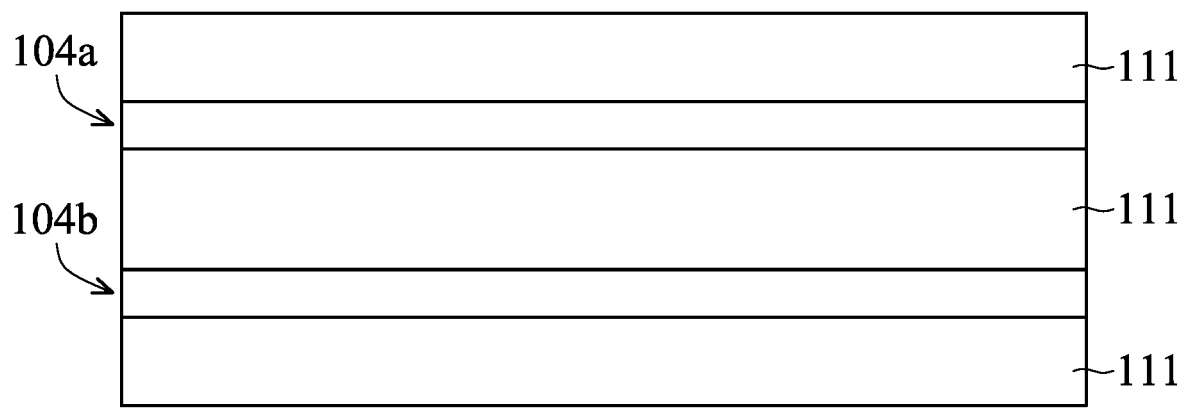

As shown in FIGS. 1B and 2B, after the first fin structure 104a and the second fin structure 104b are formed, an isolation material 111 is formed around the first fin structure 104a, the second fin structure 104b and the mask structure 110, in accordance with some embodiments. Next, a portion of the isolation material 111 is removed by a planarization process such as CMP process. As a result, the top surface of the isolation material 111 is substantially leveled with the top surface of the mask structure 110.

Figure 1C:
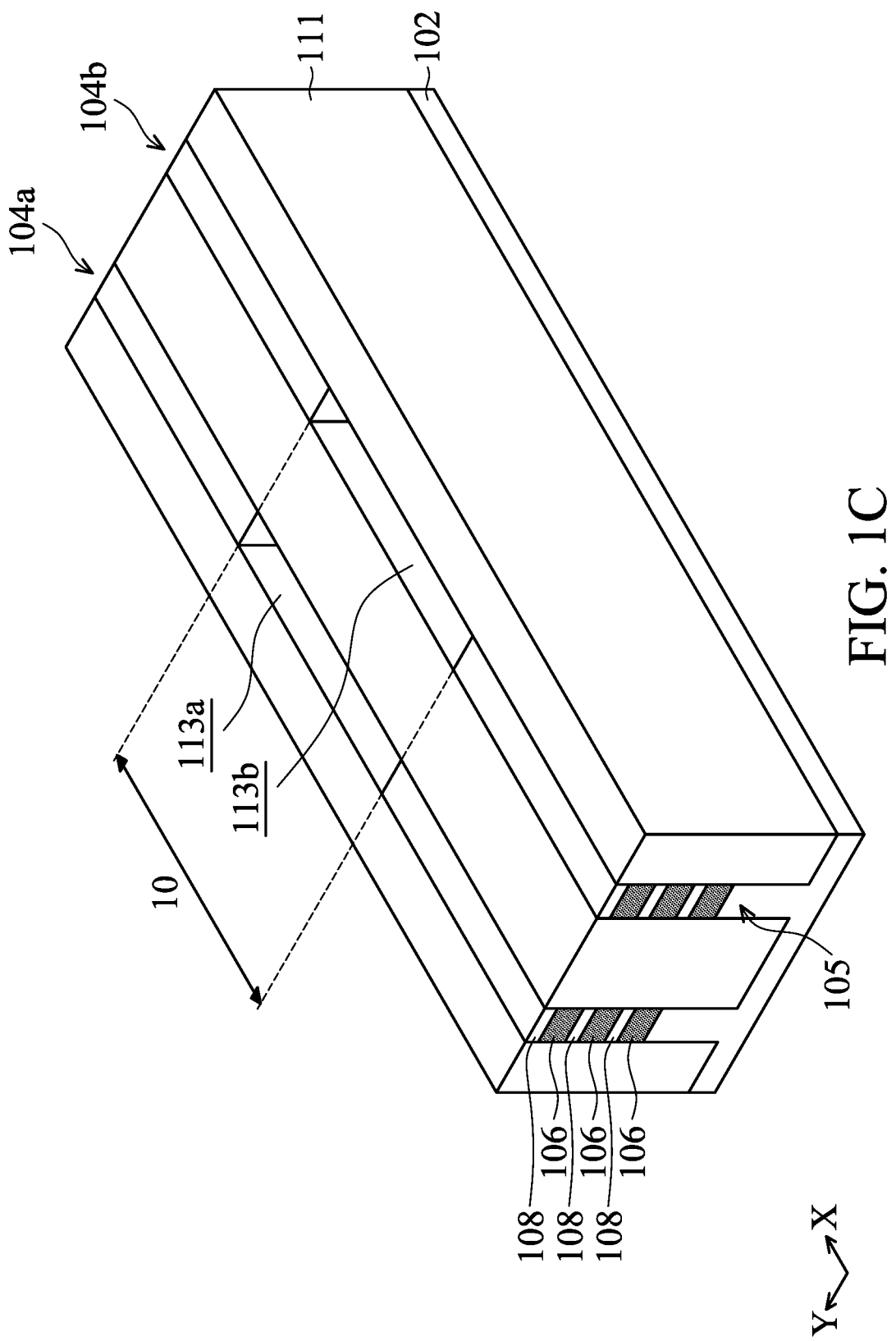
Figure 2C:
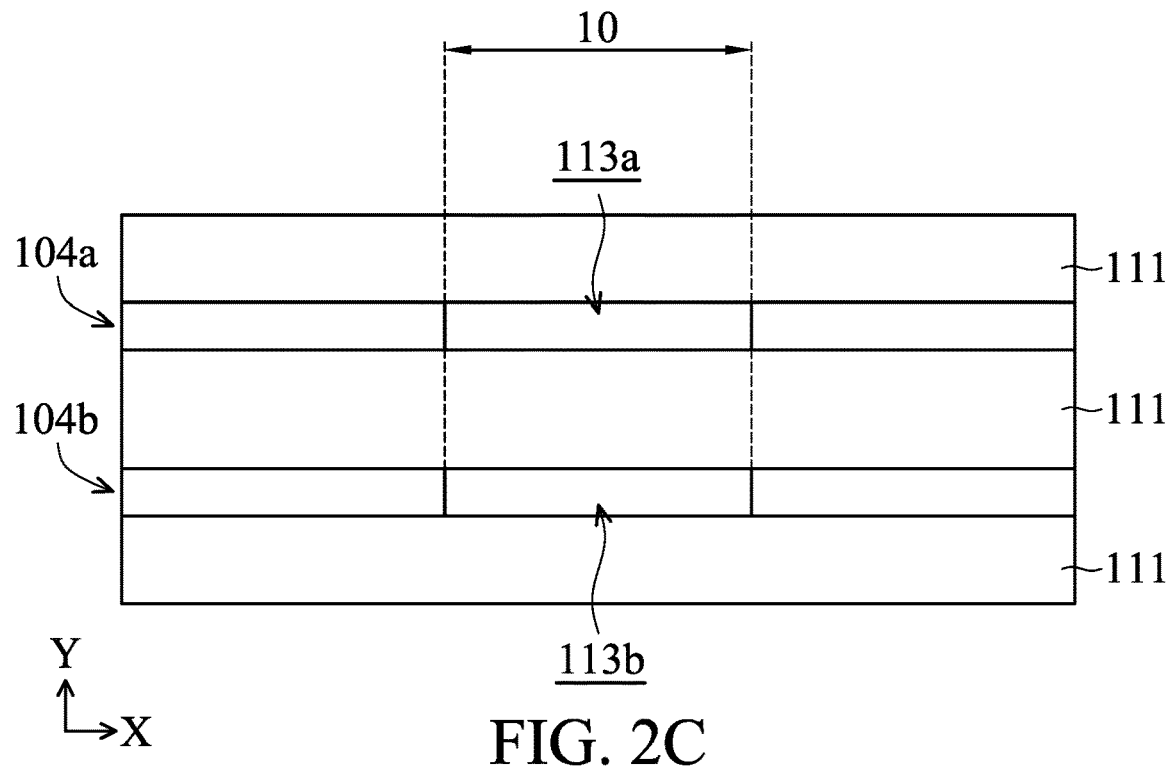

Afterwards, as shown in FIGS. 1C and 2C, after the portion of the isolation material 111 is removed, a first trench 113a and a second trench 113b are formed in a cut region 10, in accordance with some embodiments. The cut region 10 is an isolation region to separate two adjacent devices.

Figure 1D:
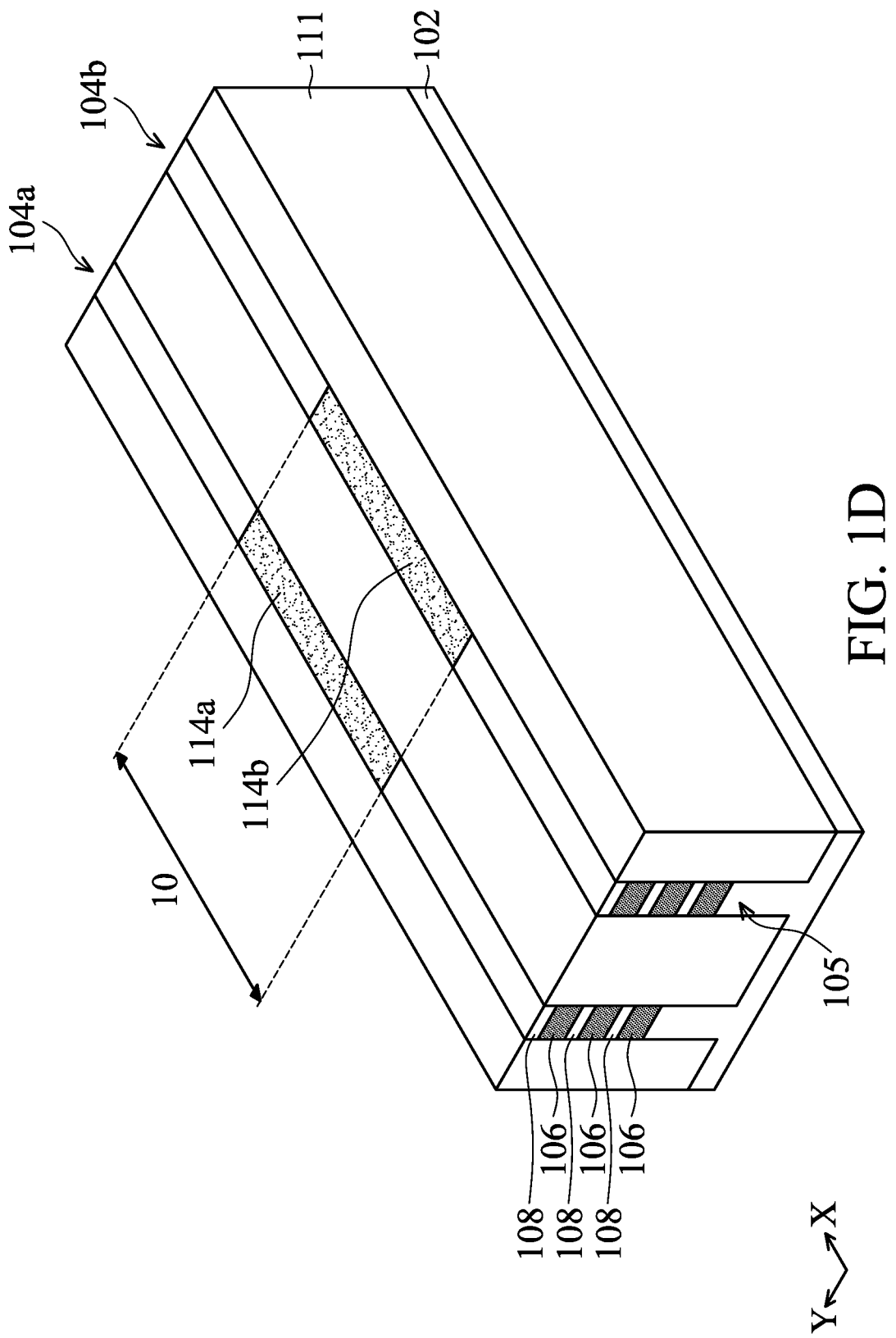
Figure 2D:
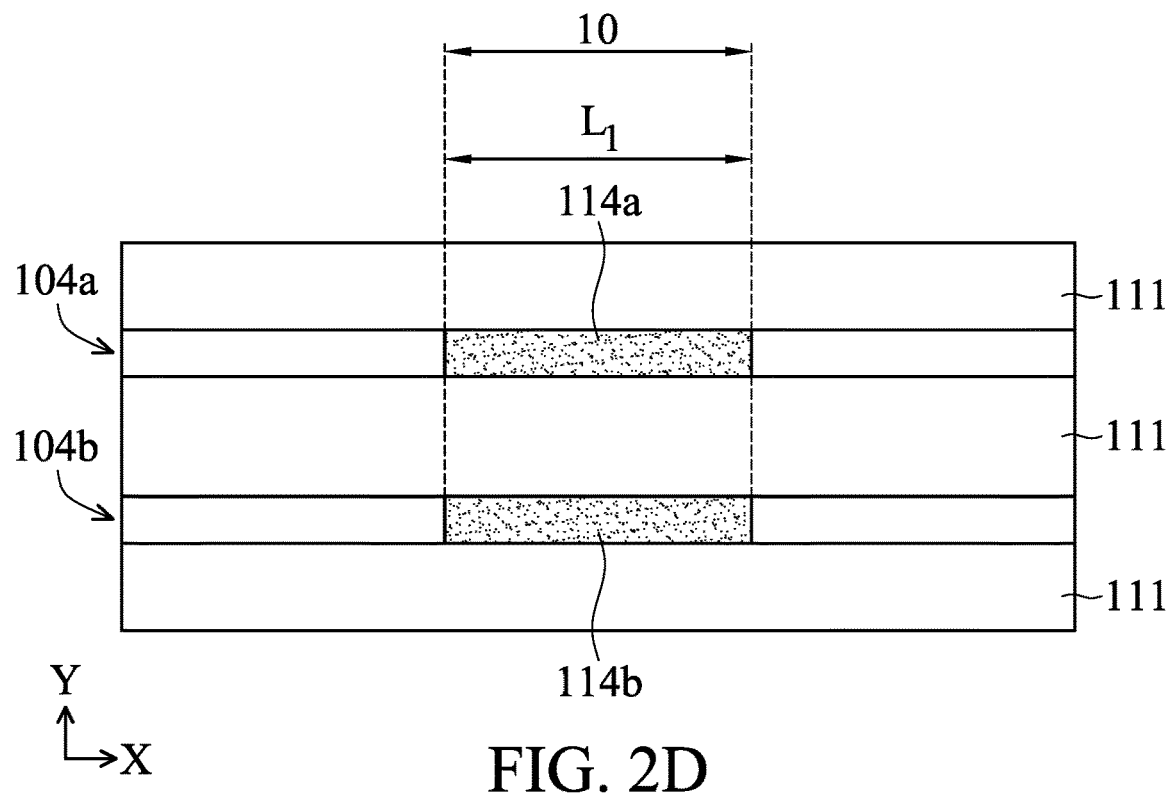

Afterwards, as shown in FIGS. 1D and 2D, after the first trench 113a and the second trench 113b are formed, a dielectric material (not shown) is formed in the first trench 113a and the second trench 113b, and the top portions outside of the first trench 113a and the second trench 113b are removed to form a first dielectric structure 114a and a second dielectric structure 114b, in accordance with some embodiments.

The material of the first dielectric structure 114a and the second dielectric structure 114b are different from the first fin structure 104a and the second fin structure 104b. In addition, the material of the first dielectric structure 114a and the second dielectric structure 114b are different from the isolation material 111.

In some embodiments, the first dielectric structure 114a and the second dielectric structure 114b are made of $SiO_2$, SiN, SiCN, SiCON, SiCO, AlO, HfO or another applicable material. In some embodiments, the first dielectric structure 114a and the second dielectric structure 114b are formed by a using thermal oxidation, chemical vapor deposition (CVD), atomic vapor deposition (ALD), physical vapor deposition (PVD), another suitable method, or a combination thereof.

There is a first length $L_1$ of the first dielectric structure 114a along the first direction (e.g. X-axis). In some embodiments, the first length $L_1$ of the first dielectric structure 114a is in a range from about 20 nm to about 500 nm.

Figure 1E:
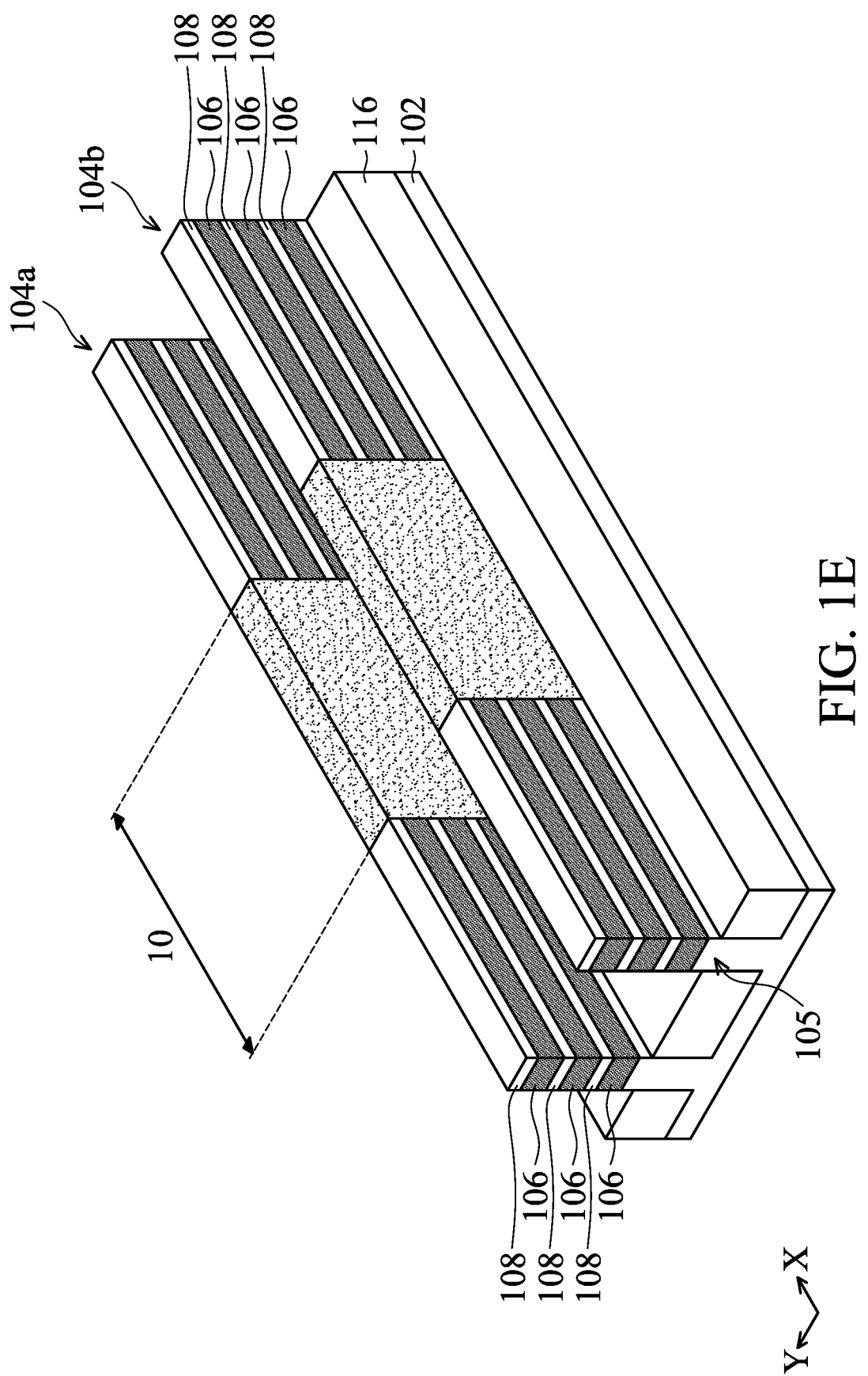
Figure 2E:
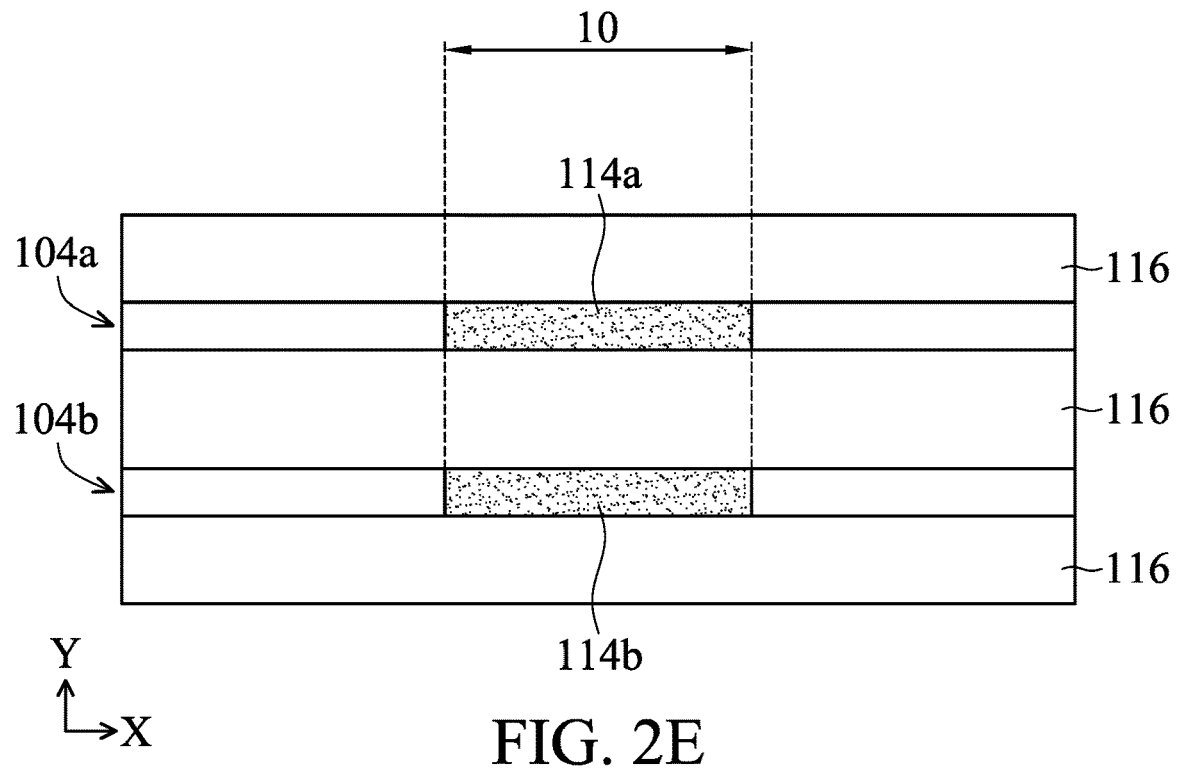

Afterwards, as shown in FIGS. 1E and 2E, after the first dielectric structure 114a and the second dielectric structure 114b are formed, a portion of the isolation material 111 is removed to form an isolation structure 116, in accordance with some embodiments. The top surface of the isolation structure 116 is higher than the bottom surface of the first dielectric structure 114a and the bottom surface of the second dielectric structure 114b.

Since the material of the first dielectric structure 114a and the second dielectric structure 114b are different from the isolation material 111, the etching selectively of the first dielectric structure 114a and the second dielectric structure 114b with respect to the isolation material 111 is high, and the first dielectric structure 114a and the second dielectric structure 114b are remaining while the top portion of the isolation material 111 is removed. In other words, the first dielectric structure 114a and the isolation structure 116 are made of different materials.

The isolation structure 116 is configured to electrically isolate active regions (e.g. the fin structure 104) of the semiconductor device structure 100a and is also referred to as shallow trench isolation (STI) feature in accordance with some embodiments.

In some embodiments, the isolation structure 116 is made of silicon oxide, silicon nitride, silicon oxynitride (SiON), another suitable insulating material, or a combination thereof. In some embodiments, a dielectric liner (not shown) is formed before the isolation structure 116 is formed, and the dielectric liner is made of silicon nitride and the isolation structure formed over the dielectric liner is made of silicon oxide.

Figure 1F:
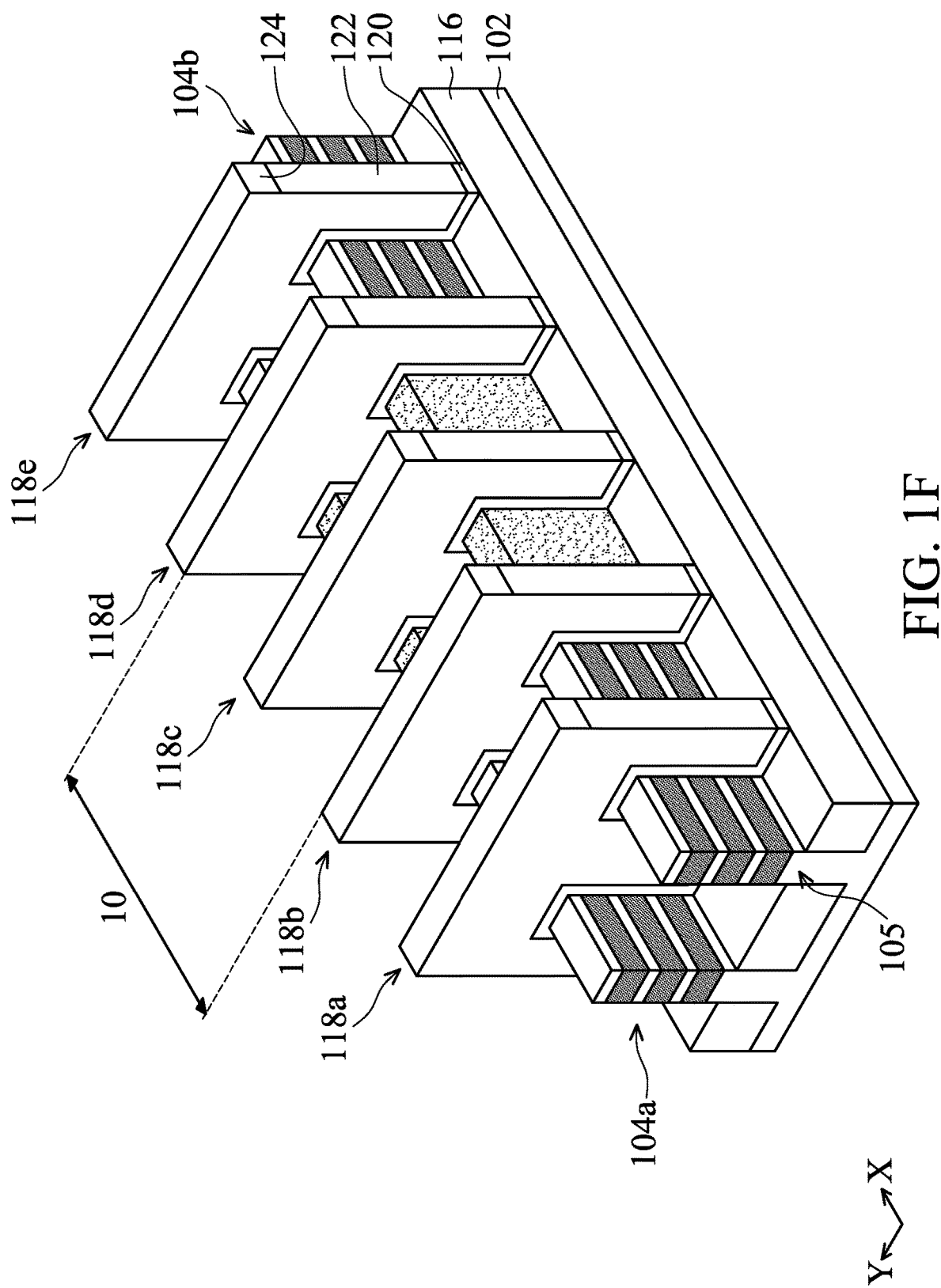
Figure 2F:
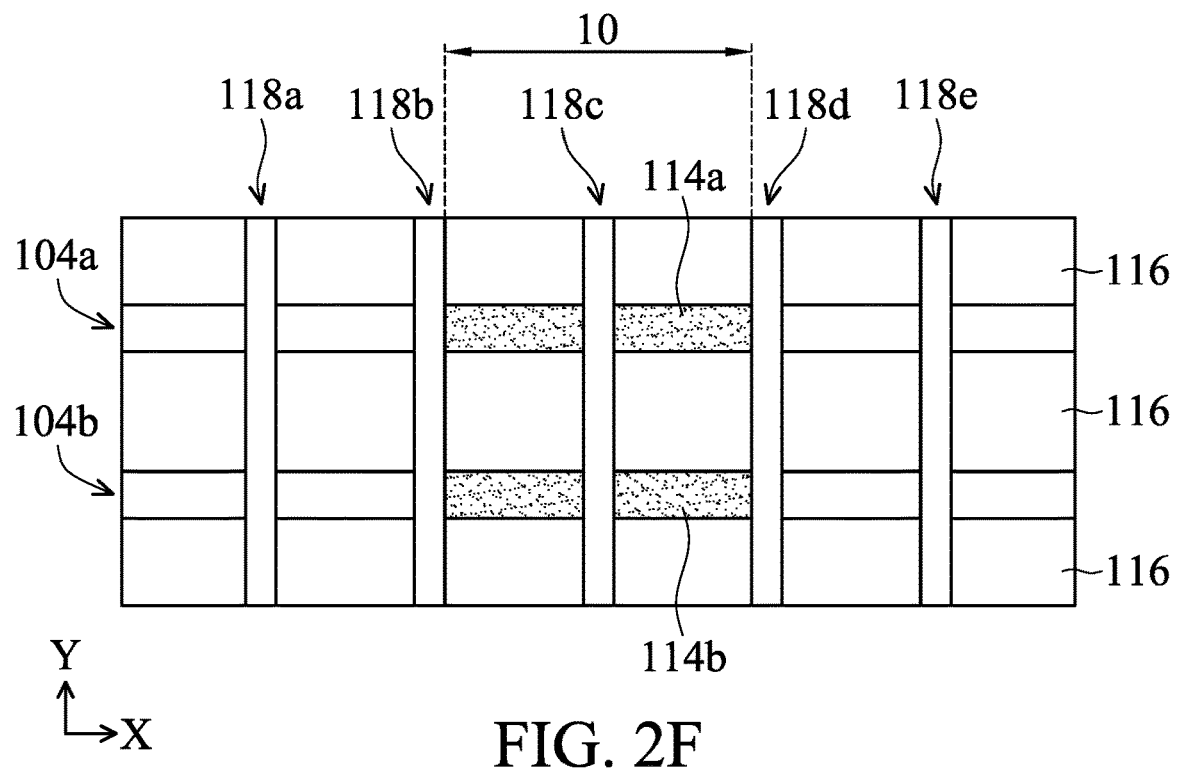

Afterwards, as shown in FIGS. 1F and 2F, after the isolation structure 116 is formed, a first dummy gate structure 118a, a second dummy gate structure 118b, a third dummy gate structure 118c, a fourth dummy gate structure 118d and a fifth dummy gate structure 118e are formed across the first fin structure 104a and the second fin structure 104b and extend over the isolation structure 116, in accordance with some embodiments.

The first dummy gate structure 118a, the second dummy gate structure 118b, the third dummy gate structure 118c, the fourth dummy gate structure 118d and the fifth dummy gate structure 118e are arranged in parallel to each other along the second direction (e.g. Y-axis). The first dummy gate structure 118a, the second dummy gate structure 118b, the third dummy gate structure 118c, the fourth dummy gate structure 118d and the fifth dummy gate structure 118e may be used to define the source/drain (S/D) regions and the channel regions of the resulting semiconductor device structure 100a.

In some embodiments, each of the first dummy gate structure 118a, the second dummy gate structures 118b, the third dummy gate structure 118c, the fourth dummy gate structure 118d and the fifth dummy gate structure 118e includes dummy gate dielectric layers 120 and dummy gate electrode layers 122.

In some embodiments, the dummy gate dielectric layers 120 are made of one or more dielectric materials, such as silicon oxide, silicon nitride, silicon oxynitride (SiON), $HfO_2$, HfZrO, HfSiO, HfTiO, HfAlO, or a combination thereof. In some embodiments, the dummy gate dielectric layers 120 are formed using thermal oxidation, chemical vapor deposition (CVD), atomic vapor deposition (ALD), physical vapor deposition (PVD), another suitable method, or a combination thereof.

In some embodiments, the conductive material includes polycrystalline-silicon (poly-Si), poly-crystalline silicon-germanium (poly-SiGe), metallic nitrides, metallic silicides, metals, or a combination thereof. In some embodiments, the dummy gate electrode layers 122 are formed using chemical vapor deposition (CVD), physical vapor deposition (PVD), or a combination thereof.

In some embodiments, the hard mask layers 124 are formed over the first dummy gate structure 118a, the second dummy gate structures 118b, the third dummy gate structure 118c, the fourth dummy gate structure 118d and the fifth dummy gate structure 118e. In some embodiments, the hard mask layers 124 include multiple layers, such as an oxide layer and a nitride layer. In some embodiments, the oxide layer is silicon oxide, and the nitride layer is silicon nitride.

The formation of the first dummy gate structure 118a, the second dummy gate structures 118b, the third dummy gate structure 118c, the fourth dummy gate structure 118d and the fifth dummy gate structure 118e may include conformally forming a dielectric material as the dummy gate dielectric layers 120. Afterwards, a conductive material may be formed over the dielectric material as the dummy gate electrode layers 122, and the hard mask layer 124 may be formed over the conductive material. Next, the dielectric material and the conductive material may be patterned through the hard mask layer 124 to form the first dummy gate structure 118a, the second dummy gate structures 118b, the third dummy gate structure 118c, the fourth dummy gate structure 118d and the fifth dummy gate structure 118e.

Figure 1G:
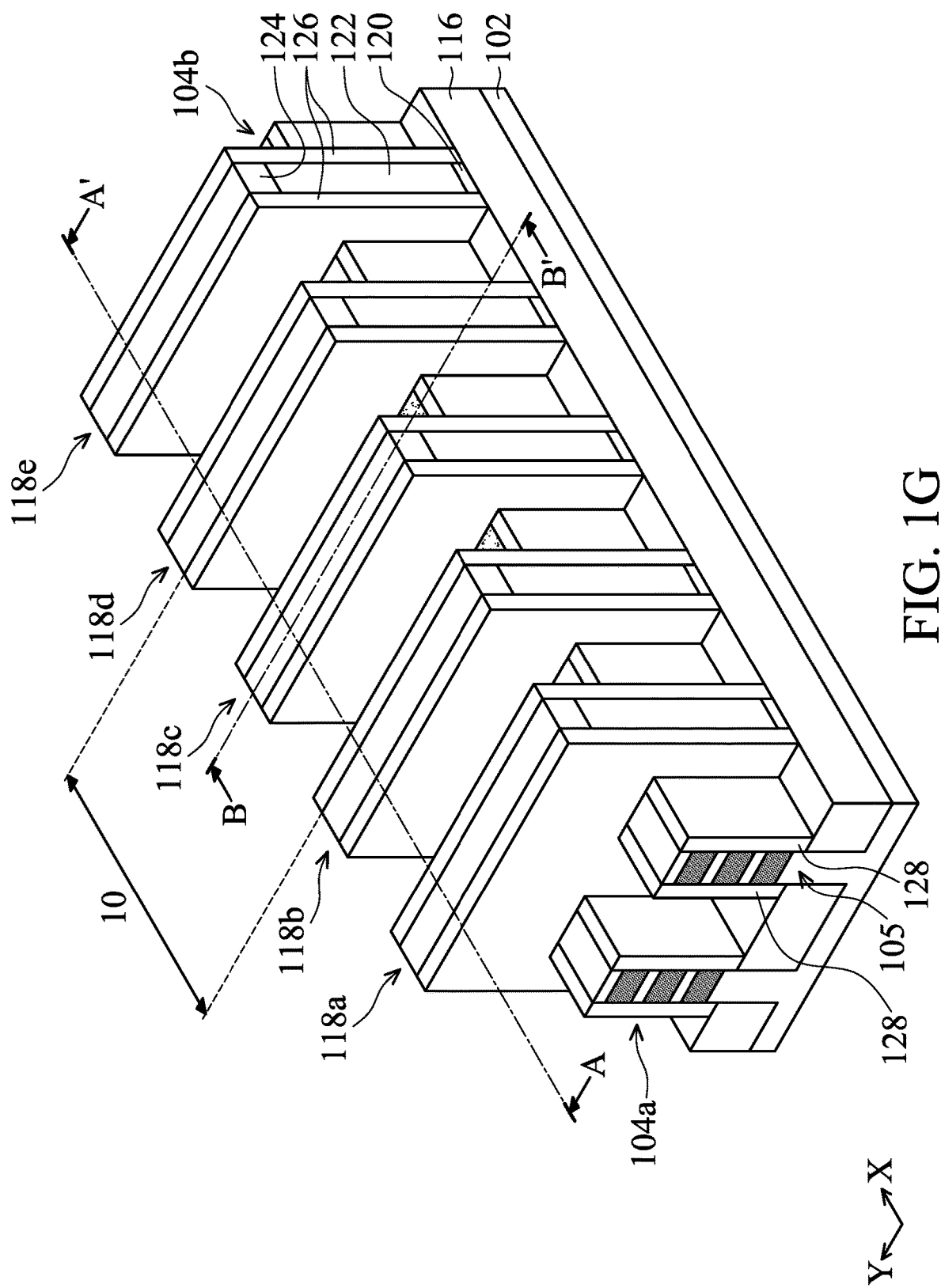
Figure 2G:
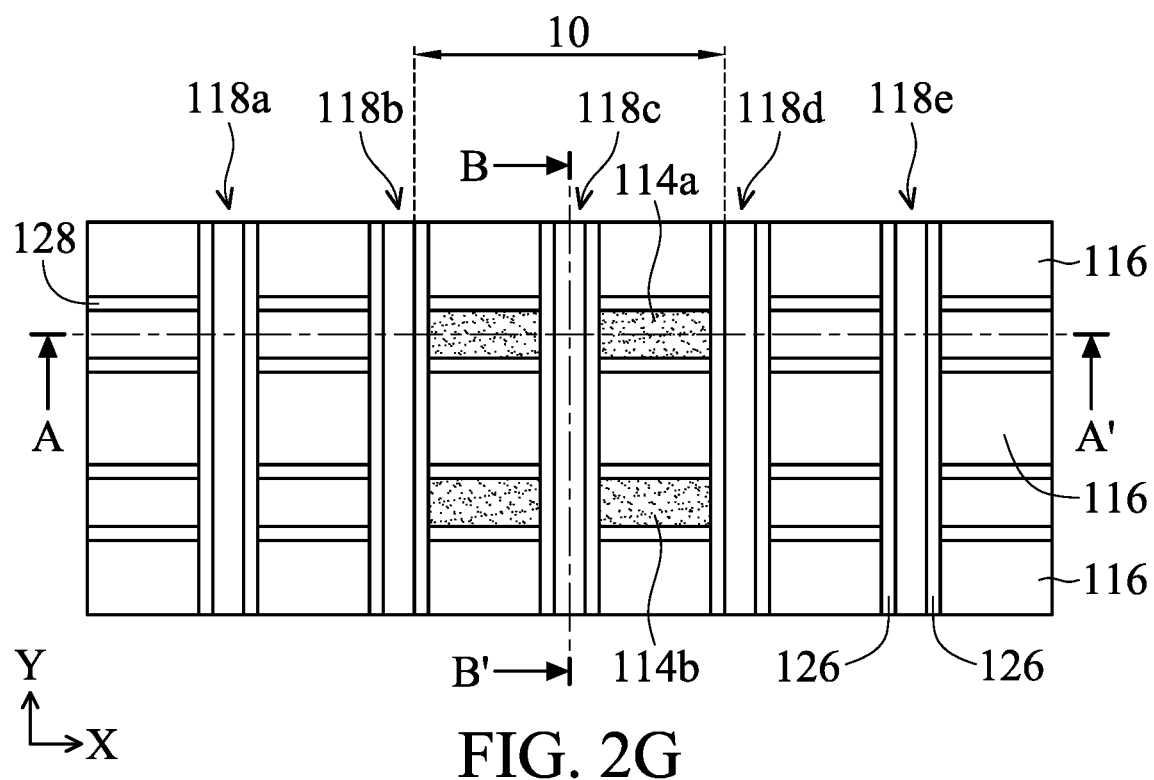

Next, as shown as shown in FIGS. 1G and 2G, after the dummy gate structures 118a, 118b, 118c, 118d and 118e are formed, gate spacers 126 are formed along and covering opposite sidewalls of the dummy gate structures 118a, 118b, 118c, 118d and 118e and fin spacers 128 are formed along and covering opposite sidewalls of the source/drain regions of the first fin structure 104a and the second fin structure 104b, in accordance with some embodiments.

The gate spacers 126 may be configured to separate source/drain structures from the dummy gate structure 118 and support the dummy gate structures 118a, 118b, 118c, 118d and 118e, and the fin spacers 128 may be configured to constrain a lateral growth of subsequently formed source/drain structure and support the fin structure 104.

In some embodiments, the gate spacers 126 and the fin spacers 128 are made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), and/or a combination thereof. The formation of the gate spacers 126 and the fin spacers 128 may include conformally depositing a dielectric material covering the dummy gate structures 118a, 118b, 118c, 118d and 118e, the fin structure 104, and the isolation structure 116 over the substrate 102, and performing an anisotropic etching process, such as dry plasma etching, to remove the dielectric layer covering the top surfaces of the dummy gate structures 118a, 118b, 118c, 118d and 118e, the fin structures 104a and 104b, and portions of the isolation structure 116.

FIGS. 3A to 3G show cross-sectional representations of various stages of manufacturing the semiconductor device structure 100a shown along line A-A' in FIGS. 1G and 2G, in accordance with some embodiments.

Figure 3A:
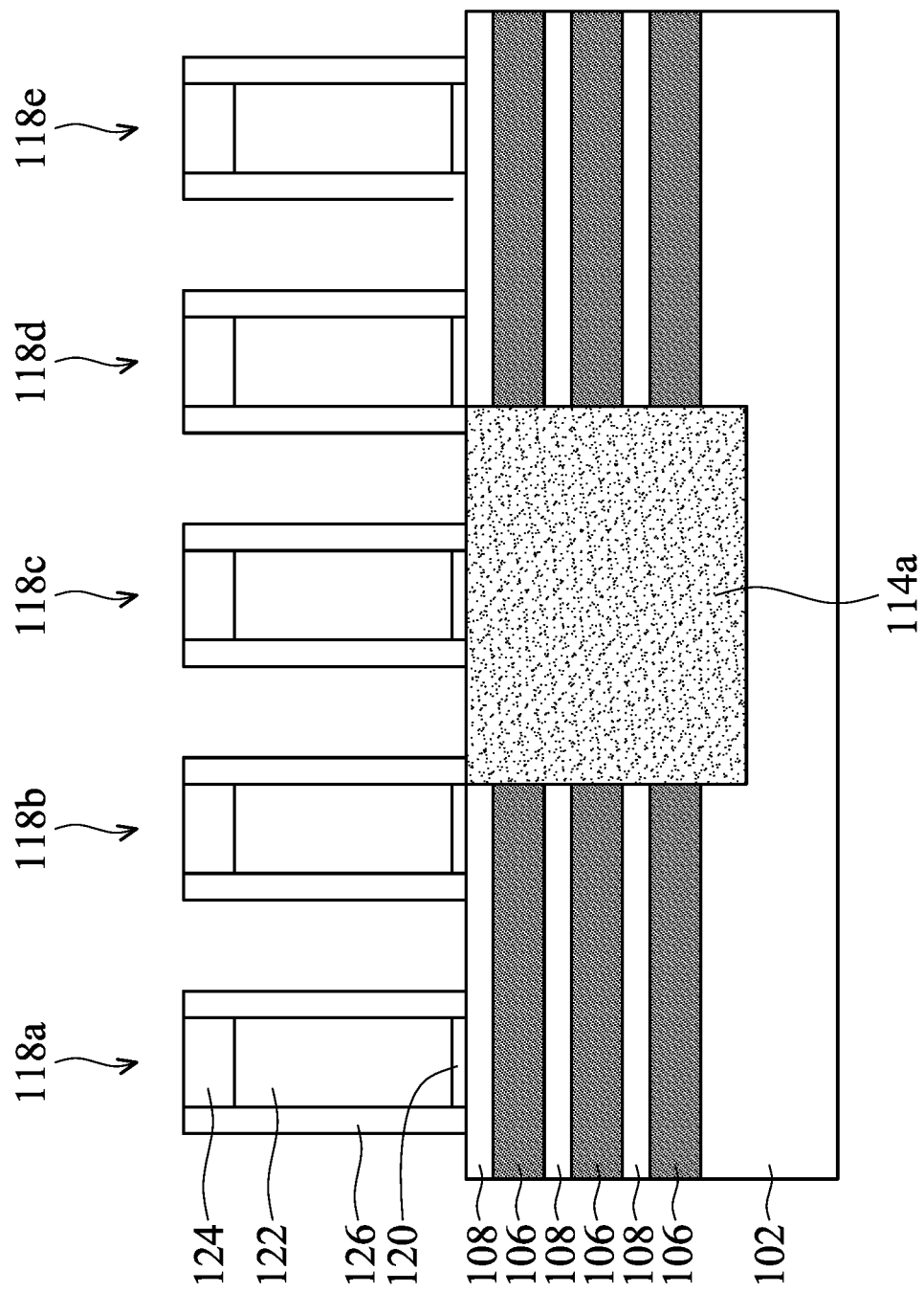
FIGS. 3A to 3G show cross-sectional representations of various stages of manufacturing the semiconductor device structure shown along line A-A' in FIGS. 1G and 2G, in accordance with some embodiments.

More specifically, FIG. 3A shows the cross-sectional representation shown along line A-A' FIGS. 1G and 2G. As shown in FIG. 3A, the first dielectric structure 114a is directly formed below the third dummy gate structure 118c. In some embodiments, the sidewall surface of the dummy gate electrode layer 122 of the second dummy gate structure 118b is aligned with the sidewall surface of the first dielectric structure 114a. In some other embodiments, the sidewall surface of the dummy gate electrode layer 122 of the fourth dummy gate structure 118d is aligned with the sidewall surface of the first dielectric structure 114a. In some embodiments, the sidewall surface of the inner sidewall surface of the gate spacer 126 of the second dummy gate structure 118b is aligned with the sidewall surface of the first dielectric structure 114a.

Figure 3B:
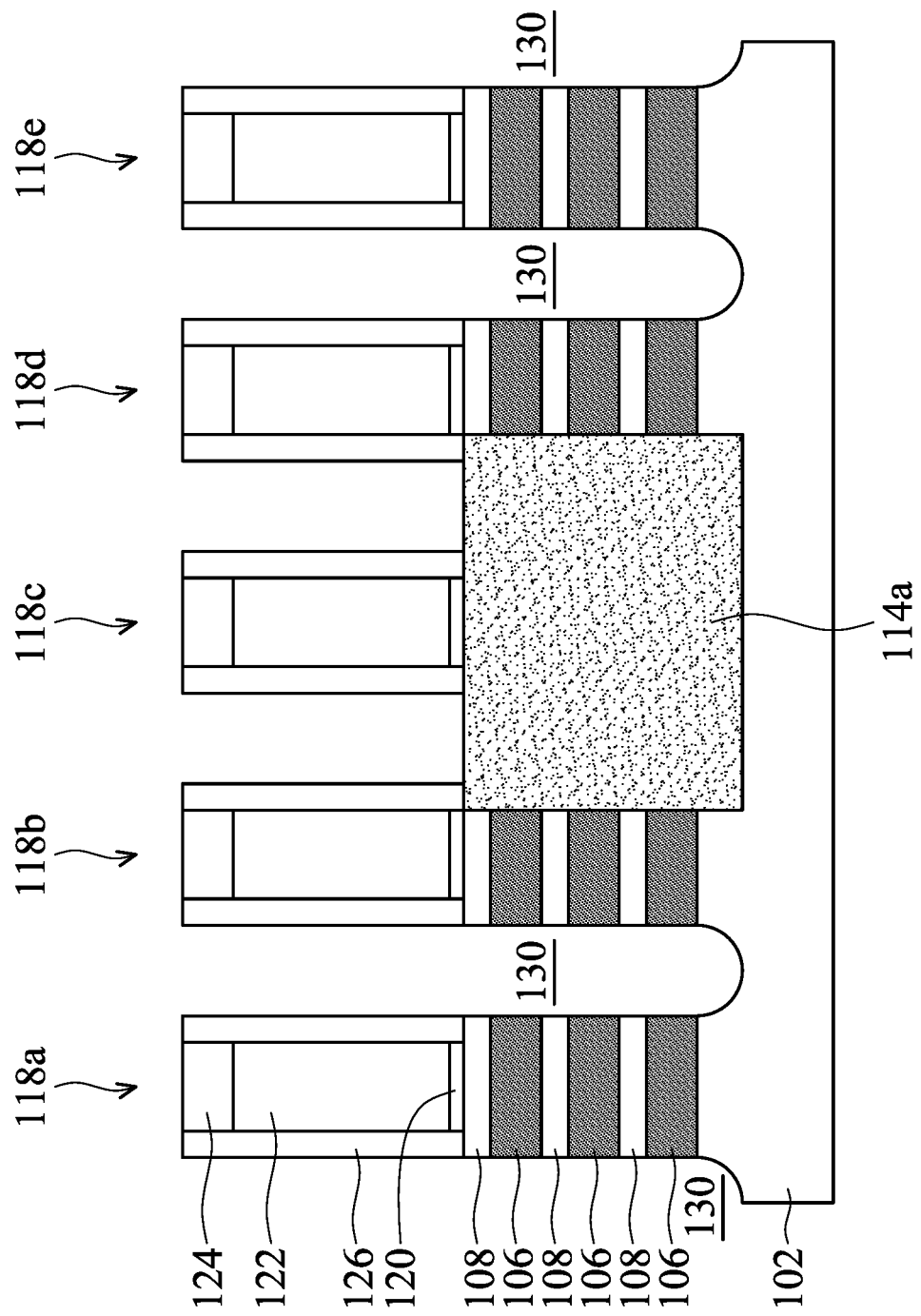

Next, as shown in FIG. 3B, after the gate spacers 126 and the fin spacers 128 are formed, the source/drain (S/D) regions of the first fin structure 104a are recessed to form source/drain (S/D) recesses 130, as shown in in accordance with some embodiments. More specifically, the first semiconductor material layers 106 and the second semiconductor material layers 108 not covered by the dummy gate structures 118a, 118b, 118c, 118d and 118e and the gate spacers 126 are removed in accordance with some embodiments. In addition, some portions of the base fin structure 105 are also recessed to form curved top surfaces, as shown in FIG. 3B, in accordance with some embodiments.

In some embodiments, the S/D structure recess 130 and the first dielectric structure 114a are formed on opposite sidewalls of the second dummy gate structure 118b. In some embodiments, the S/D structure recess 130 and the first dielectric structure 114a are formed on opposite sidewalls of fourth dummy gate structure 118d.

In some embodiments, the fin structures 104a, 104b are recessed by performing an etching process. The etching process may be an anisotropic etching process, such as dry plasma etching, and the dummy gate structures 118a, 118b, 118c, 118d and 118e and the gate spacers 126 are used as etching masks during the etching process. In some embodiments, the fin spacers 128 are also recessed to form lowered fin spacers 128'.

Figure 3C:
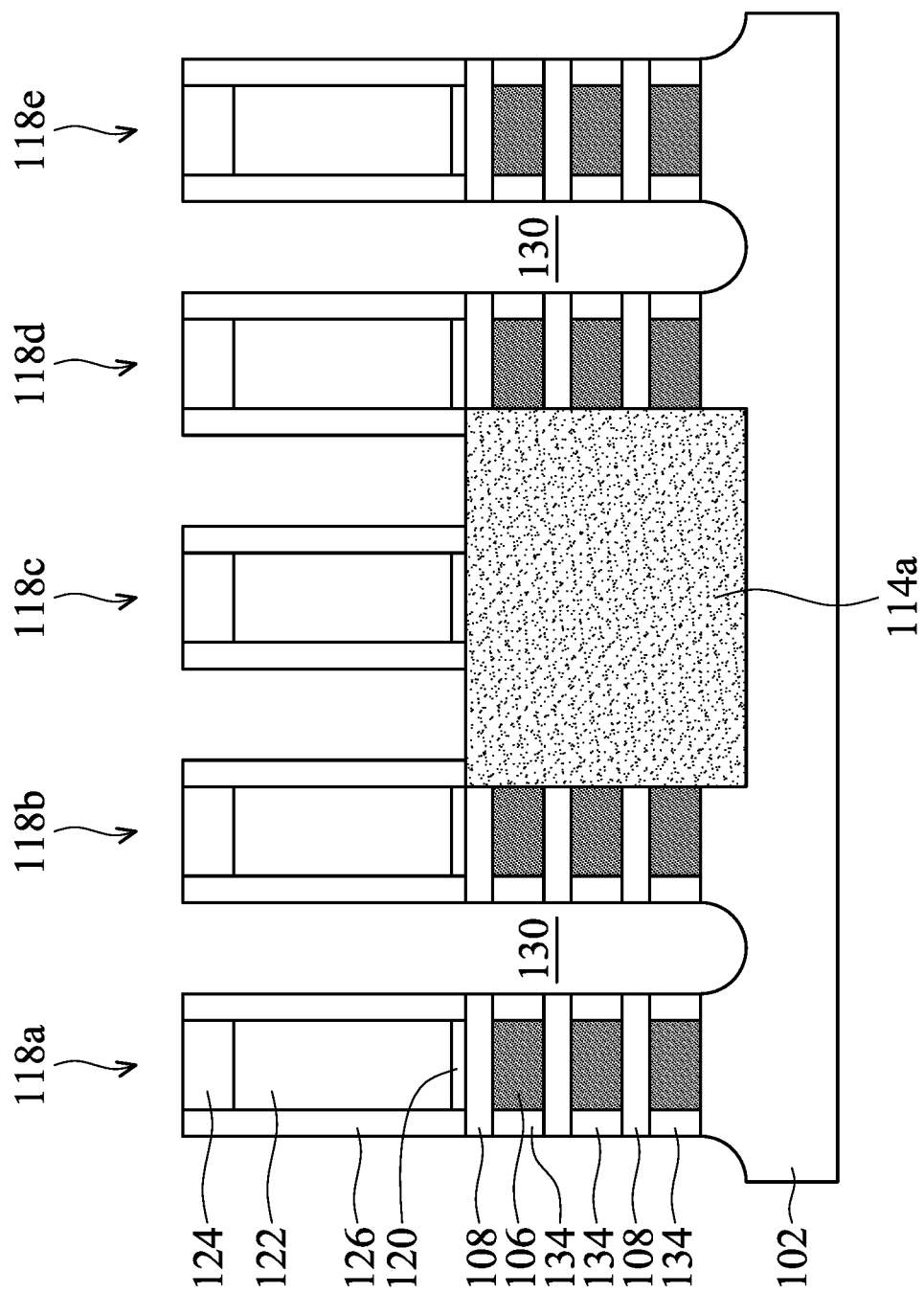

Afterwards, as shown in FIG. 3C, after the source/drain (S/D) recesses 130 are formed, the first semiconductor material layers 106 exposed by the source/drain (S/D) recesses 130 are laterally recessed to form notches (not shown), in accordance with some embodiments. Next, inner spacers 134 are formed in the notches between the second semiconductor material layers 108, in accordance with some embodiments.

In some embodiments, an etching process is performed on the semiconductor device structure 100a to laterally recess the first semiconductor material layers 106 of the first fin structure 104a from the source/drain (S/D) recesses 130. In some embodiments, during the etching process, the first semiconductor material layers 106 have a greater etching rate (or etching amount) than the second semiconductor material layers 108, thereby forming notches between adjacent second semiconductor material layers 108. In some embodiments, the etching process is an isotropic etching such as dry chemical etching, remote plasma etching, wet chemical etching, another suitable technique, and/or a combination thereof.

The inner spacers 134 are configured to separate the source/drain (S/D) structures and the gate structures 142a, 142b, 142c, 142d and 142e formed in subsequent manufacturing processes in accordance with some embodiments. In some embodiments, the inner spacers 134 are made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), or a combination thereof. In some embodiments, the inner spacer layer 134 is formed by a deposition process, such as chemical vapor deposition (CVD) process, atomic layer deposition (ALD) process, another applicable process, or a combination thereof.

Figure 3D:
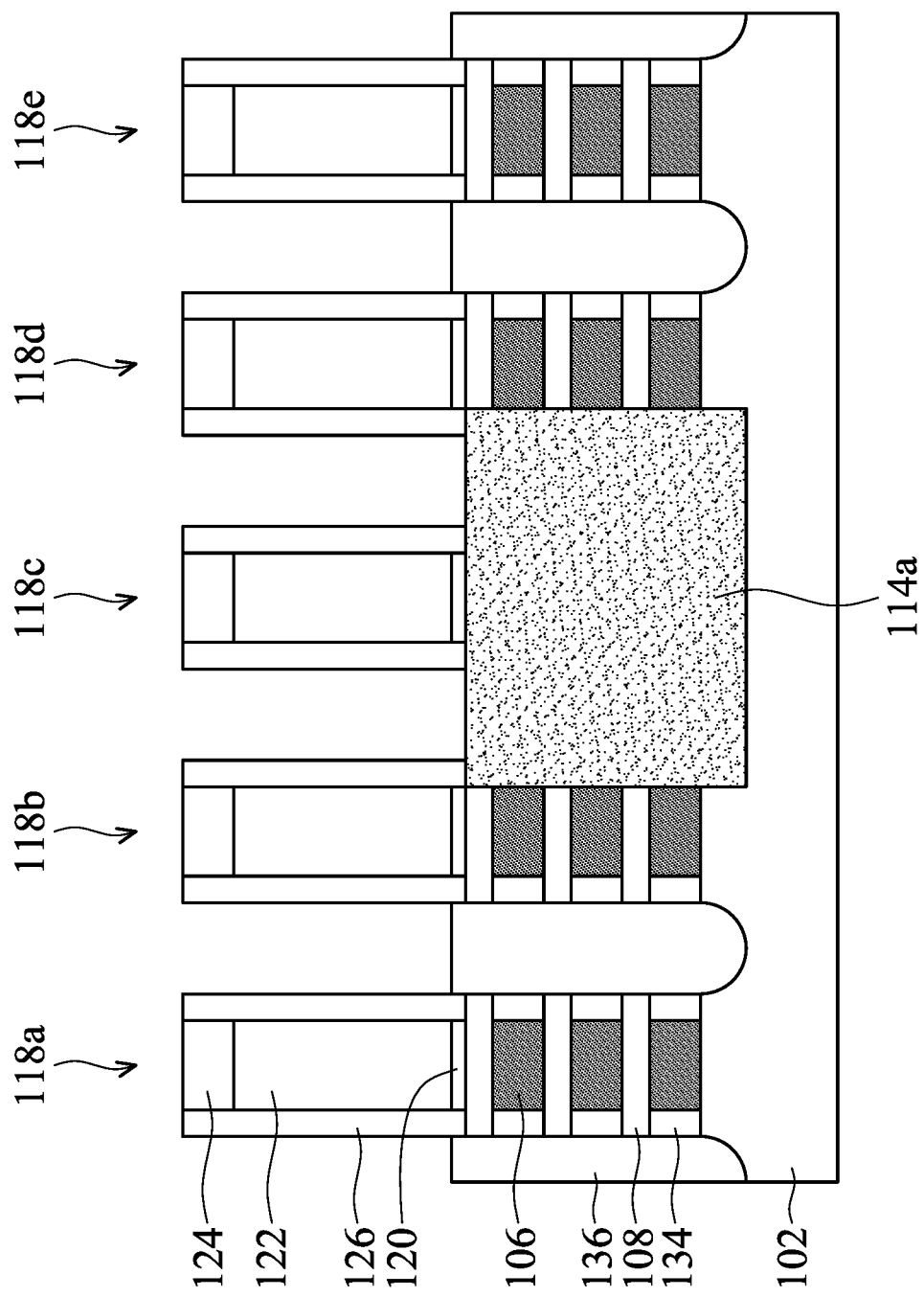

Afterwards, as shown in FIG. 3D, after the inner spacers 134 are formed, source/drain (S/D) structures 136 are formed in the S/D recesses 130, in accordance with some embodiments. In some embodiments, the S/D structures 136 are formed using an epitaxial growth process, such as Molecular beam epitaxy (MBE), Metal-organic Chemical Vapor Deposition (MOCVD), Vapor-Phase Epitaxy (VPE), other applicable epitaxial growth process, or a combination thereof. In some embodiments, the S/D structures 136 are made of any applicable material, such as Ge, Si, GaAs, AlGaAs, SiGe, GaAsP, SiP, SiC, SiCP, or a combination thereof.

In some embodiments, the S/D structures 136 are in-situ doped during the epitaxial growth process. For example, the S/D structures 136 may be the epitaxially grown SiGe doped with boron (B). For example, the S/D structures 136 may be the epitaxially grown Si doped with carbon to form silicon:carbon (Si:C) source/drain features, phosphorous to form silicon:phosphor (Si:P) source/drain features, or both carbon and phosphorous to form silicon carbon phosphor (SiCP) source/drain features. In some embodiments, the S/D structures 136 are doped in one or more implantation processes after the epitaxial growth process.

Figure 3E:
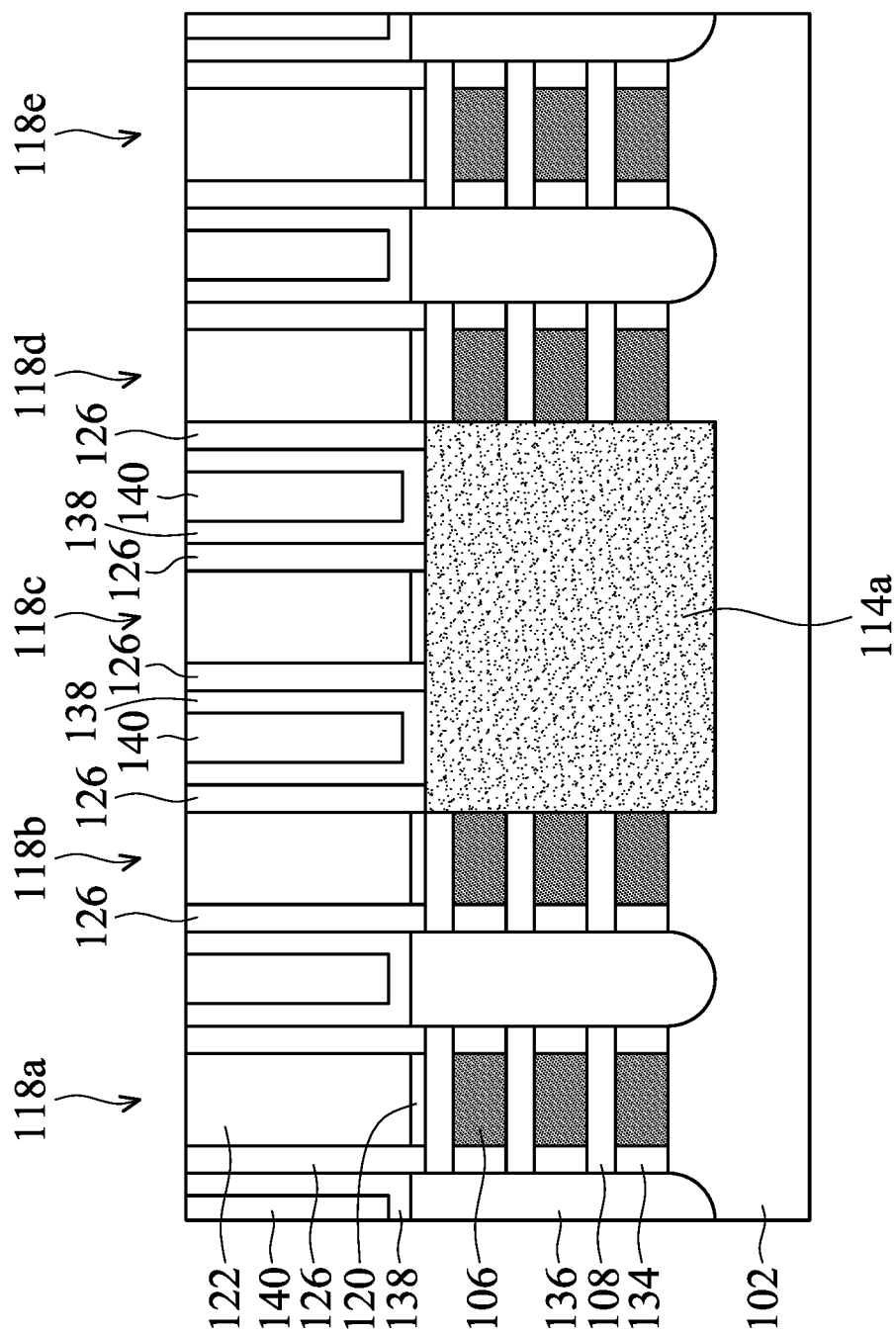

Next, as shown in FIG. 3E, after the S/D structures 136 are formed, a contact etch stop layer (CESL) 138 is conformally formed to cover the S/D structures 136 and an interlayer dielectric (ILD) layer 140 is formed over the contact etch stop layers 138, in accordance with some embodiments.

In some embodiments, the CESL 138 is made of a dielectric materials, such as silicon nitride, silicon oxide, silicon oxynitride, another suitable dielectric material, or a combination thereof. The dielectric material for the CESL 138 may be conformally deposited over the semiconductor device structure by performing chemical vapor deposition (CVD), ALD, other application methods, or a combination thereof.

The ILD layer 140 may include multilayers made of multiple dielectric materials, such as silicon oxide, silicon nitride, silicon oxynitride, phosphosilicate glass (PSG), borophosphosilicate glass (BPSG), and/or other applicable low-k dielectric materials. The ILD layer 140 may be formed by chemical vapor deposition (CVD), physical vapor deposition, (PVD), atomic layer deposition (ALD), or other applicable processes.

After the CESL 138 and the ILD layer 140 are deposited, a planarization process such as CMP or an etch-back process may be performed until the gate electrode layers 120 of the dummy gate structures 118 are exposed, as shown in FIG. 3E, in accordance with some embodiments.

Figure 3F:
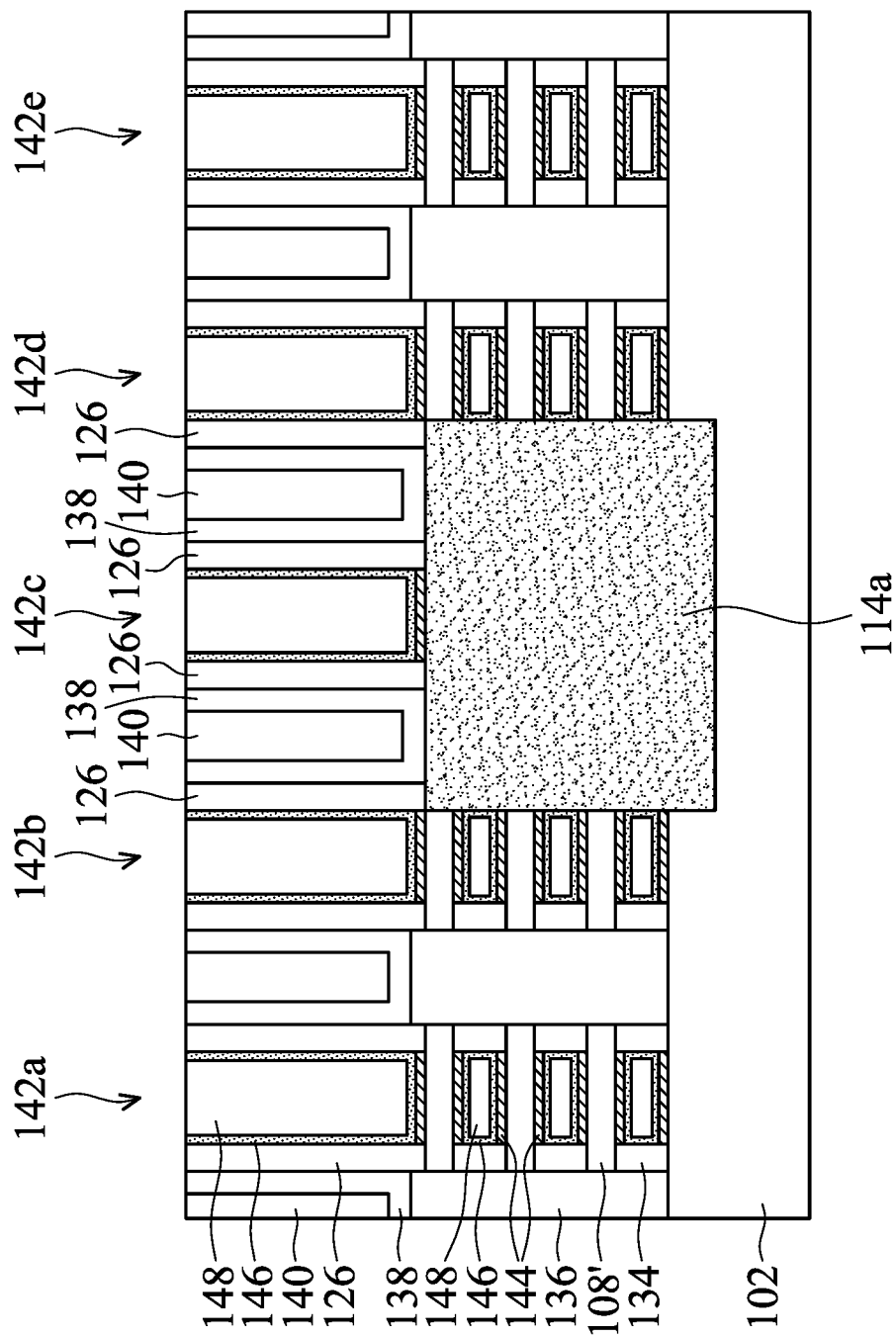

Afterwards, as shown in FIG. 3F, the dummy gate structures 118a, 118b, 118c, 118d and 118e are replaced with a first gate structure 142a, a second gate structure 142b, a third gate structure 142c, a fourth gate structure 142d and a fifth gate structure 142e, in accordance with some embodiments. The third gate structure 142c which is directly above the first dielectric structure 114a is between the second gate structure 142b and the fourth gate structure 142d. The first gate structure 142a, the second gate structure 142b, the third gate structure 142c, the fourth gate structure 142d and the fifth gate structure 142e are arranged parallel to each other along the second direction (e.g. Y-axis).

More specifically, the dummy gate structures 118a, 118b, 118c, 118d and 118e and the first semiconductor material layers 106 are removed to form nanostructures 108' with the second semiconductor material layers 108, in accordance with some embodiments. The S/D structure 136 is attached to the nanostructures 108'. The first dielectric structure 114a is between the nanostructure 108' of the second gate structure 142b and the nanostructure 108' of the fourth gate structure 142d.

The removal process may include one or more etching processes. For example, when the dummy gate electrode layers 122 are polysilicon, a wet etchant such as a tetramethylammonium hydroxide (TMAH) solution may be used to selectively remove the dummy gate electrode layers 122. Afterwards, the dummy gate dielectric layers 120 may be removed using a plasma dry etching, a dry chemical etching, and/or a wet etching. The first semiconductor material layers 106 may be removed by performing a selective wet etching process, such as APM (e.g., ammonia hydroxide-hydrogen peroxide-water mixture) etching process. For example, the wet etching process uses etchants such as ammonium hydroxide ($NH_4OH$), TMAH, ethylenediamine pyrocatechol (EDP), and/or potassium hydroxide (KOH) solutions. In some embodiments, the upper portions of the gate spacers 126 are also removed.

After the nanostructures 108' are formed, the gate structures 142a, 142b, 142c, 142d and 142e are formed wrapped around the nanostructures 108'. The gate structures 142a, 142b, 142c, 142d and 142e wrap around the nanostructures 108' to form gate-all-around transistor structures in accordance with some embodiments. In some embodiments, each of the gate structures 142a, 142b, 142c includes an interfacial layer 144, a gate dielectric layer 146, and a gate electrode layer 148.

In some embodiments, the interfacial layers 144 are oxide layers formed around the nanostructures 108' and on the top of the base fin structure 105. In some embodiments, the interfacial layers 144 are formed by performing a thermal process.

In some embodiments, the gate dielectric layers 146 are formed over the interfacial layers 144, so that the nanostructures 108' are surrounded (e.g. wrapped) by the gate dielectric layers 146. In addition, the gate dielectric layers 146 also cover the sidewalls of the gate spacers 126 and the inner spacers 134 in accordance with some embodiments. In some embodiments, the gate dielectric layers 146 are made of one or more layers of dielectric materials, such as $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, another suitable high-k dielectric material, or a combination thereof. In some embodiments, the gate dielectric layers 146 are formed using chemical vapor deposition (CVD), atomic layer deposition (ALD), another applicable method, or a combination thereof.

In some embodiments, the gate electrode layers 148 are formed on the gate dielectric layer 146. In some embodiments, the gate electrode layers 148 are made of one or more layers of conductive material, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another suitable material, or a combination thereof. In some embodiments, the gate electrode layers 148 are formed using chemical vapor deposition (CVD), atomic layer deposition (ALD), electroplating, another applicable method, or a combination thereof. Other conductive layers, such as work function metal layers, may also be formed in the gate structures 142, although they are not shown in the figures. In some embodiments, the n-work function layer includes tungsten (W), copper (Cu), titanium (Ti), silver (Ag), aluminum (Al), titanium nitride (TiN), tantalum nitride (TaN), tantalum carbide (TaC), titanium aluminum alloy (TiAl), titanium aluminum nitride (TiAlN), tantalum carbon nitride (TaCN), tantalum silicon nitride (TaSiN), manganese (Mn), zirconium (Zr) or a combination thereof. In some embodiments, the p-work function layer includes titanium (Ti), titanium nitride (TiN), tantalum nitride (TaN), tantalum carbide (TaC), molybdenum nitride, tungsten nitride (WN), ruthenium (Ru) or a combination thereof.

After the interfacial layers 144, the gate dielectric layers 146, and the gate electrode layers 148 are formed, a planarization process such as CMP or an etch-back process may be performed until the ILD layer 140 is exposed.

Figure 3G:
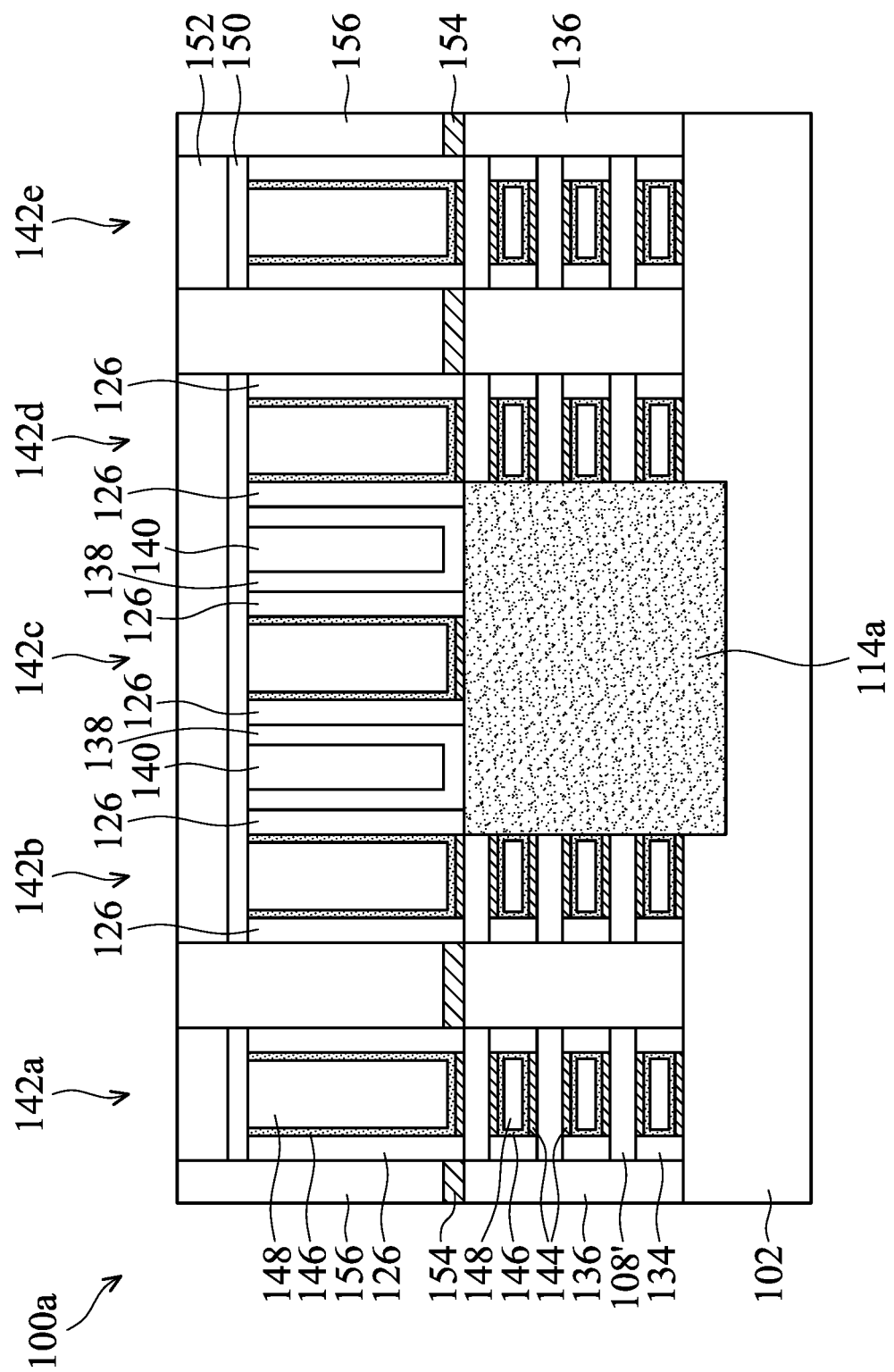

Afterwards, as shown in FIG. 3G, an etch stop layer 150 is formed over the gate structure 142, and a dielectric layer 152 is formed over the etch stop layer 150, in accordance with some embodiments.

In some embodiments, the etch stop layer 150 is made of a dielectric materials, such as silicon nitride, silicon oxide, silicon oxynitride, another suitable dielectric material, or a combination thereof. The dielectric material for the etch stop layers 150 may be conformally deposited over the semiconductor device structure by performing chemical vapor deposition (CVD), ALD, other application methods, or a combination thereof.

The dielectric layer 152 may include multilayers made of multiple dielectric materials, such as silicon oxide, silicon nitride, silicon oxynitride, phosphosilicate glass (PSG), borophosphosilicate glass (BPSG), and/or other applicable low-k dielectric materials. The dielectric layer 152 may be formed by chemical vapor deposition (CVD), physical vapor deposition, (PVD), atomic layer deposition (ALD), or other applicable processes.

Next, a silicide layer 154 and an S/D contact structure 156 are formed over the S/D structure. In some embodiments, the contact openings may be formed through the contact etch stop layer 138, the interlayer dielectric layer 140, the etch stop layer 150 and the dielectric layer 152 to expose the top surfaces of the S/D structures, and then the silicide layers 154 and the S/D contact structure 156 may be formed in the contact openings. The contact openings may be formed using a photolithography process and an etching process. In addition, some portions of the S/D structure exposed by the contact openings may also be etched during the etching process.

The silicide layers 154 may be formed by forming a metal layer over the top surfaces of the S/D structure 136 and annealing the metal layer so the metal layer reacts with the S/D structure 136 to form the silicide layers 154. The unreacted metal layer may be removed after the silicide layers 154 are formed.

The S/D contact structure 156 may include a barrier layer and a conductive layer. In some other embodiments, the S/D contact structure 156 does not include a barrier layer. In some embodiments, the barrier layer is made of titanium (Ti), titanium nitride (TiN), tantalum (Ta), tantalum nitride (TaN), or another applicable material. In some embodiments, the barrier layer is formed by using a process such as chemical vapor deposition (CVD), physical vapor deposition (PVD), plasma enhanced CVD (PECVD), plasma enhanced physical vapor deposition (PEPVD), atomic layer deposition (ALD), or any other applicable deposition processes. In some embodiments, the conductive layer is made of tungsten (W), ruthenium (Ru), molybdenum (Mo), or the like. In some embodiments, the conductive layer is formed by performing a deposition process, such as chemical vapor deposition (CVD), physical vapor deposition, (PVD), atomic layer deposition (ALD), or other applicable processes.

As shown in FIG. 3G, the third gate structure 142c is formed directly over the first dielectric structure 114a. The third gate structure 142c is in direct contact with the first dielectric structure 114a. Furthermore, the nanostructure 108' directly below the second gate structure 142b is in direct contact with the first dielectric structure 114a. The S/D structure 136 and the first dielectric structure 114a are formed on opposite sidewall surfaces of the nanostructure 108' directly below the second gate structure 142b. The second gate structure 142b is between the S/D structure 136 and the first dielectric structure 114a.

It should be noted that the inner spacer 134 is between the S/D structure 136 and the second gate structure 142b, but no inner spacer is between the second gate structure 142b and the first dielectric structure 114a. In addition, the inner spacer 134 is between the S/D structure 136 and the fourth gate structure 142d, but no inner spacer is between the fourth gate structure 142d and the first dielectric structure 114a. The second gate structure 142b, the third gate structure 142c and the fourth gate structure 142d cannot perform the normal function of the gate structure, and therefore they are dummy gate structures. The first gate structure 142a and the fifth gate structure 142e can perform the normal function of the gate structure, and they are real gate structures.

In some embodiments, the sidewall surface of the first dielectric structure 114a is aligned with the inner sidewall surface of the gate spacer 126. In some other embodiments, the sidewall surface of the first dielectric structure 114a is aligned with the outer sidewall surface of the gate spacer 126.

In a comparable embodiment, an isolation region is formed by removing a portion of the fin structure and leaving the remaining fin structure, and the gate structure is formed directly on the remaining fin structure. Since the remaining fin structure is lower than the real fin structure, the dummy gate structure which was formed on the low remaining fin structure should be higher than the real gate structure which is formed on the real fin structure. The dummy gate structure may easily collapse due to the height (high aspect ratio). In order to prevent such a collapse, the dielectric structures 114a, 114b are formed in the remaining first fin structure 104a and the remaining second fin structure 104b. Since the first dielectric structure 104a and the second dielectric structure 104b are higher than the top surface of the isolation structure 116, the first dielectric structure 104a and the second dielectric structure 104b provide support for the dummy gate structure 142c. Therefore, the risk of collapse is reduced and the performance of the semiconductor device structure 100a is improved.

Figure 4:
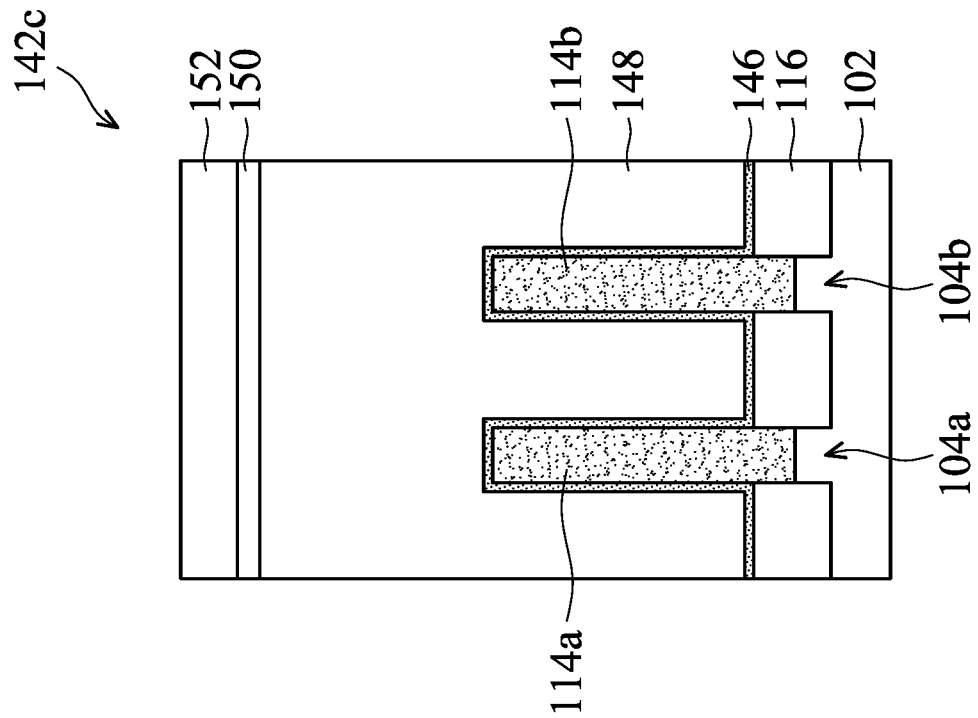
FIG. 4 shows a cross-sectional representation of the semiconductor device structure shown along line B-B' in FIGS. 1G and 2G, in accordance with some embodiments.

FIG. 4 shows a cross-sectional representation of the semiconductor device structure 100a shown along line B-B' in FIGS. 1G and 2G, in accordance with some embodiments.

As shown in FIG. 4, the first dielectric structure 114a is formed over the first fin structure 104a, and the second dielectric structure 114b is formed over the second fin structure 104b. The interface between the first dielectric structure 114a and the first fin structure 104a is lower than the top surface of the isolation structure 116. In other words, the top surface of the isolation structure 116 is higher than the interface between the first dielectric structure 114a and the first fin structure 104a.

In addition, the top surface of the first fin structure 104a is in direct contact with the bottom surface of the first dielectric structure 114a. The bottom surface of the first dielectric structure 114a is lower than the bottom surface of the bottommost nanostructure 108'. Therefore, the top surface of the remaining first fin structure 104a in the cut region 10 is lower than the bottom surface of the bottommost nanostructure 108'.

Figure 5:
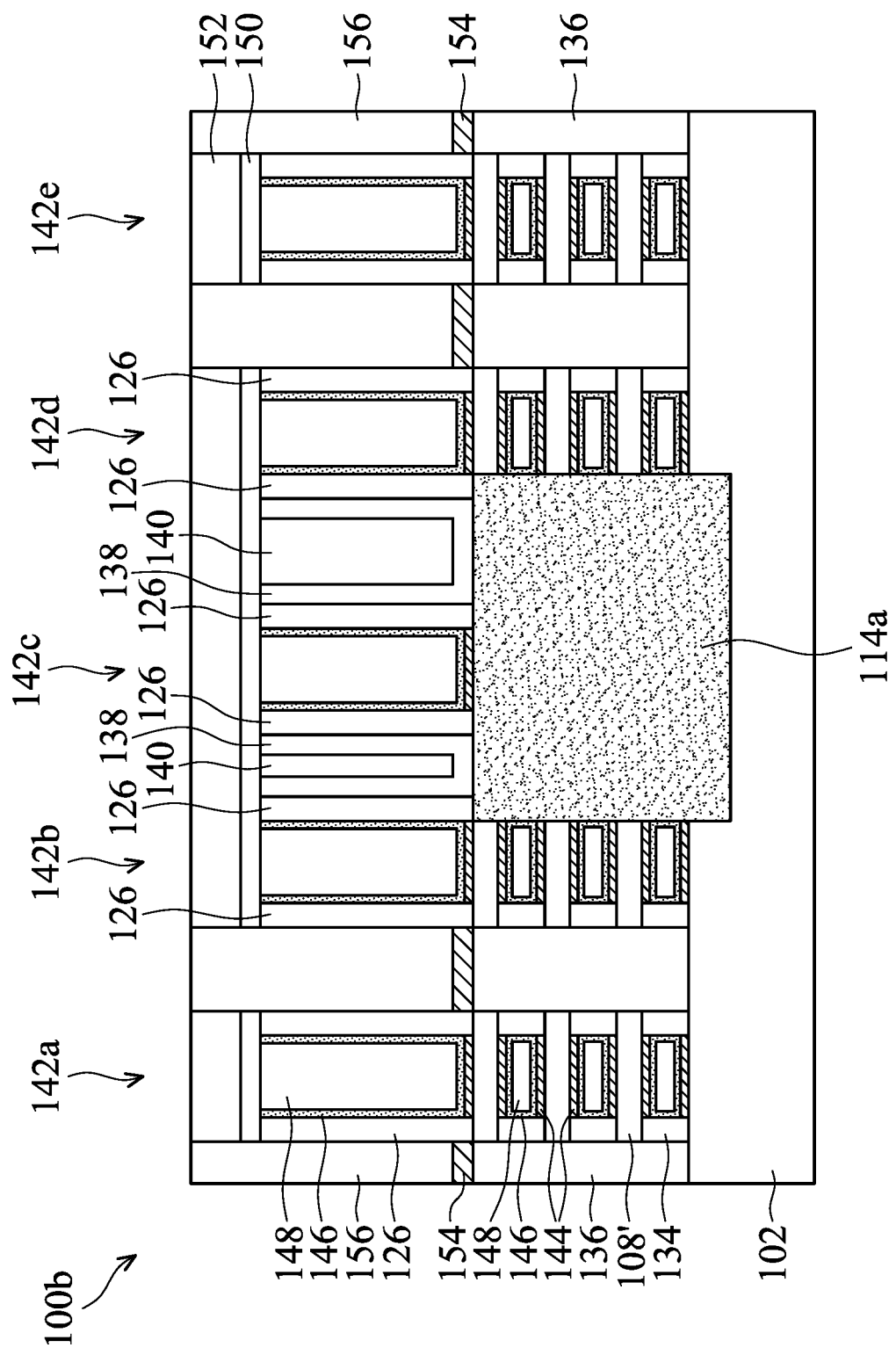
FIG. 5 shows a cross-sectional view of a semiconductor device structure, in accordance with some embodiments.

FIG. 5 shows a cross-sectional view of a semiconductor device structure 100b, in accordance with some embodiments. The semiconductor device structure 100b of FIG. 5 includes elements that are similar to, or the same as, elements of the semiconductor device structure 100a of FIG. 3G, the difference between FIG. 5 and FIG. 3G is that the third gate structure 142c is not at the middle position between the second gate structure 142b and the fourth gate structure 142d. The third gate structure 142c is closer to the second gate structure 142b than the fourth gate structure 142d. The distance between the third gate structure 142c and the second gate structure 142b is smaller than the distance between the third gate structure 142c and the fourth gate structure 142d.

Figure 6:
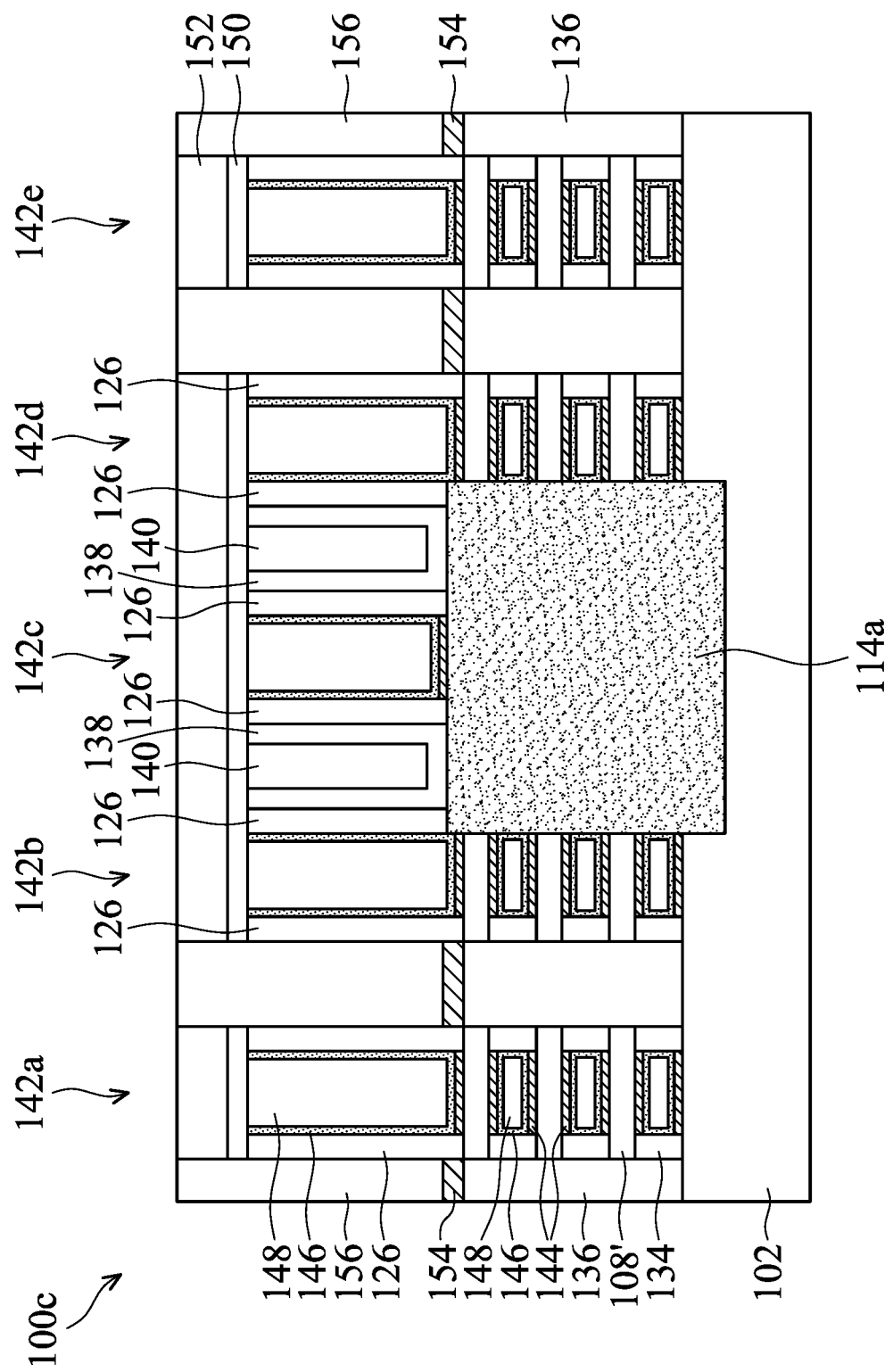
FIG. 6 shows a cross-sectional view of a semiconductor device structure, in accordance with some embodiments.

FIG. 6 shows a cross-sectional view of a semiconductor device structure 100c, in accordance with some embodiments. The semiconductor device structure 100c of FIG. 6 includes elements that are similar to, or the same as, elements of the semiconductor device structure 100c of FIG. 6, the difference between FIG. 6 and FIG. 3G is that the top surface of the first dielectric structure 114a is higher than the topmost surface of the nanostructure 108' directly below the second gate structure 142b or the topmost surface of the nanostructure 108' directly below the fourth gate structure 142d. In some embodiments, the top surface of the first dielectric structure 114a is lower than the top surface of the S/D structure 136. In some other embodiments, the top surface of the first dielectric structure 114a is higher than the top surface of the S/D structure 136. In addition, the bottom surface of the third gate structure 142c is higher than the bottom surface of the second gate structure 142b or the bottom surface of the fourth gate structure 142d.

FIGS. 7A to 7G show top-views of intermediate stages of manufacturing a semiconductor device structure 100d, in accordance with some embodiments. FIGS. 8A to 8G show cross-sectional representations of various stages of manufacturing the semiconductor device structure 100d shown along line B-B' in FIGS. 7A-7F in accordance with some embodiments. FIG. 8A shows a cross-sectional representation of the semiconductor device structure 100d shown along line B-B' in FIG. 7A, in accordance with some embodiments.

Figure 7A:
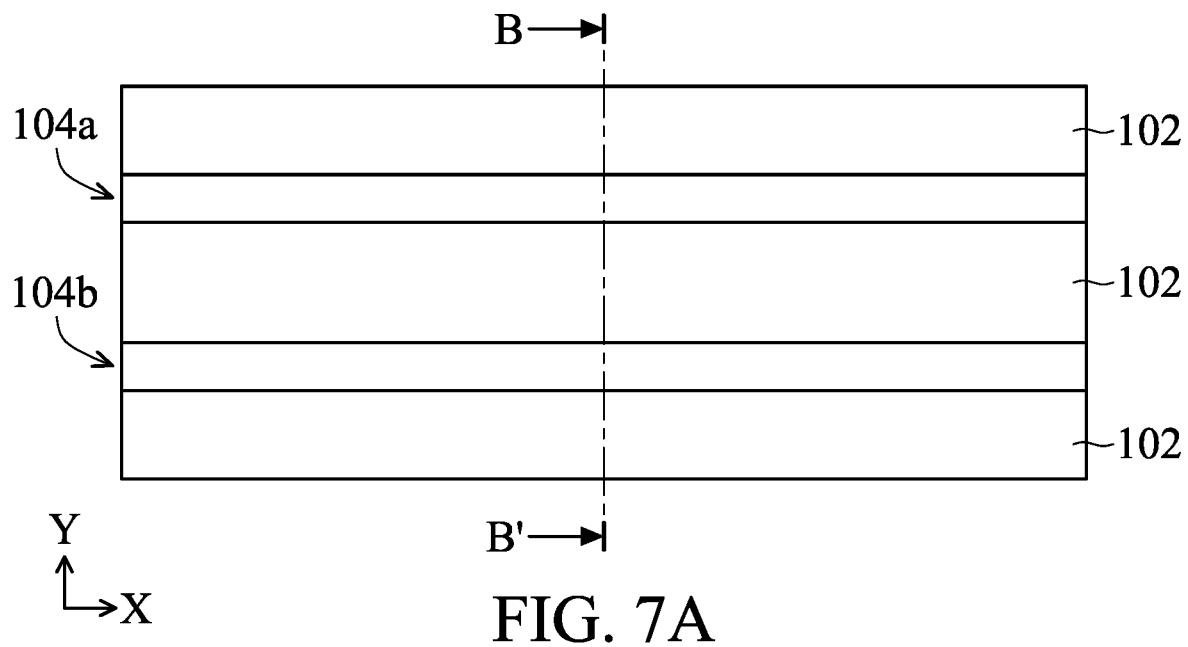
FIGS. 7A to 7G show top-views of intermediate stages of manufacturing a semiconductor device structure, in accordance with some embodiments.
Figures 8C, 8D:
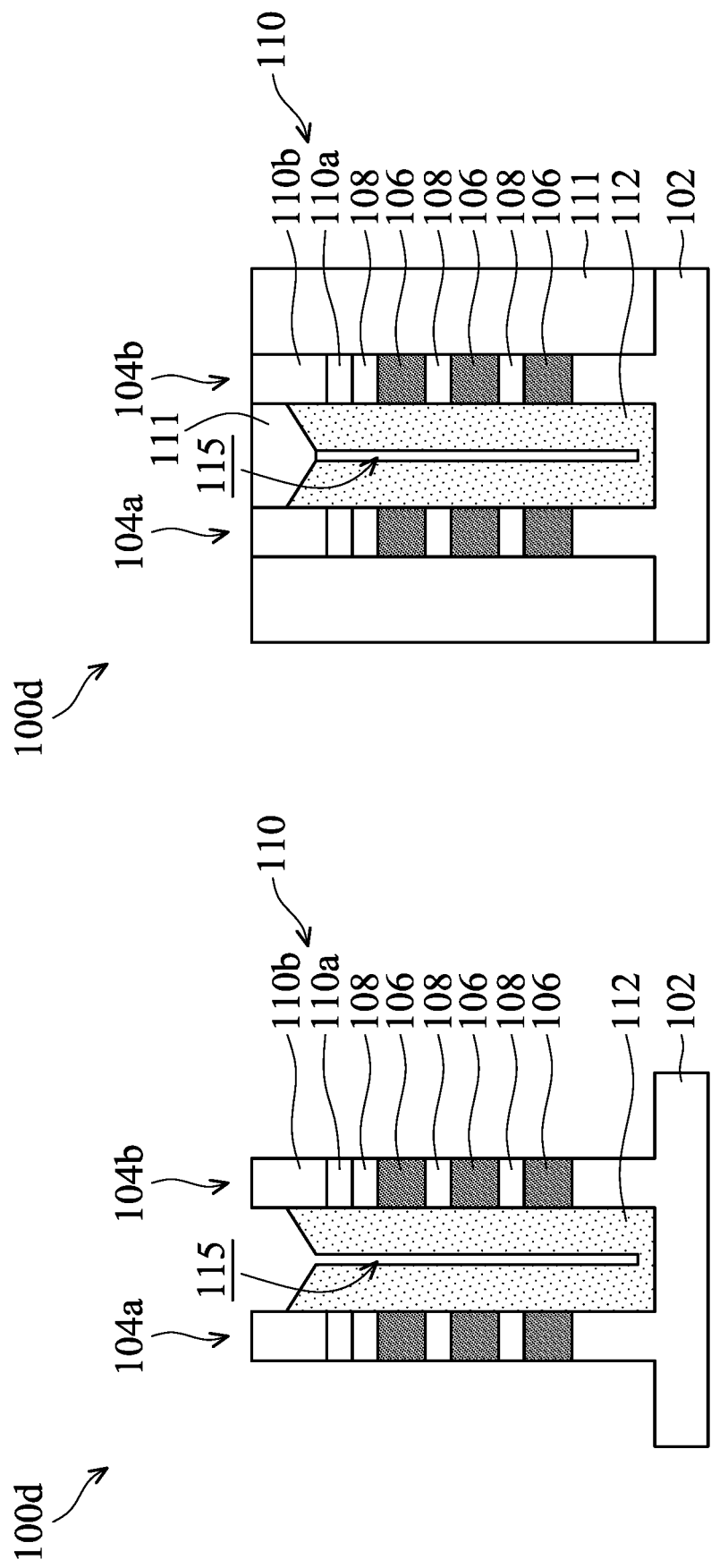

As shown in FIGS. 7A and 8A, the first fin structure 104a and the second fin structure 104b are arranged in parallel to each other along the first direction (e.g. X-axis). The mask structures 110 including the pad oxide layer 110a and the nitride layer 110b are formed on the first fin structure 104a and the second fin structure 104b.

Figure 7B:
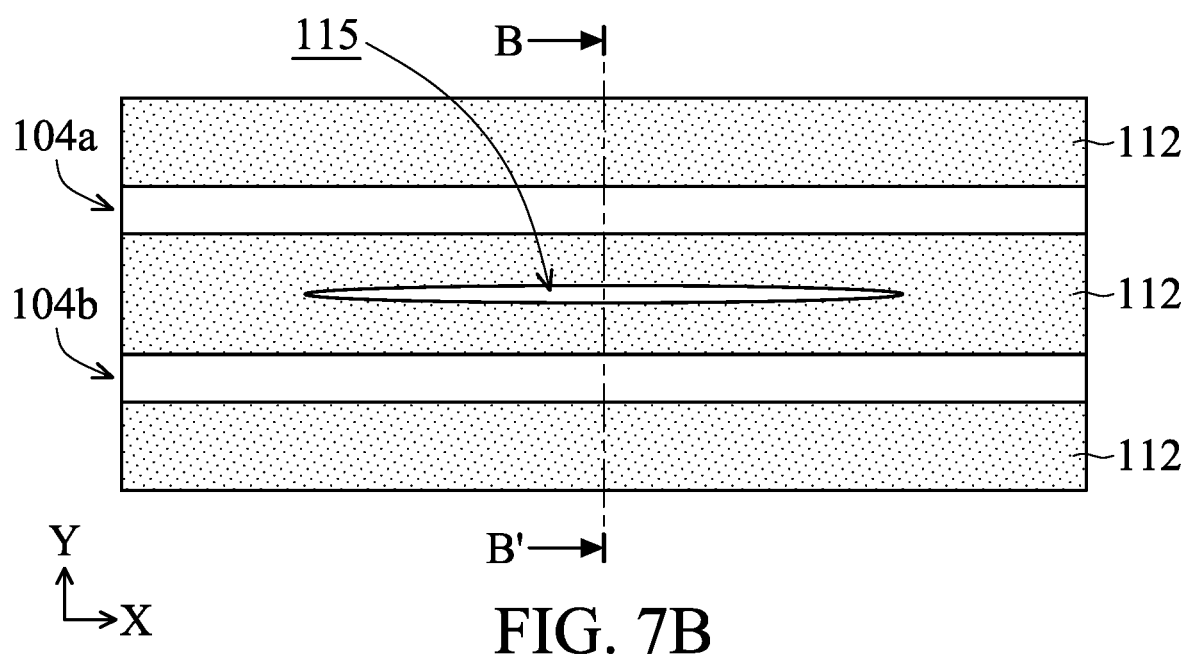

Next, as shown in FIGS. 7B and 8B, a dielectric wall 112 is formed in the recess between the first fin stricter 104a and the second fin structure 104b and over the substrate 102, in accordance with some embodiments. There is a void 115 is formed in the dielectric wall 112 when depositing the dielectric wall 112. In some other embodiments, no void is formed in the dielectric wall 112.

The dielectric wall 112 and the first dielectric structure 114a are made of different materials. In some embodiments, the dielectric wall 112 is made of SiN, SiCN, SiOC, SiOCN or applicable material. In some embodiments, the dielectric wall 112 is formed by chemical vapor deposition (CVD), atomic vapor deposition (ALD), physical vapor deposition (PVD), another suitable method, or a combination thereof.

Figure 7C:
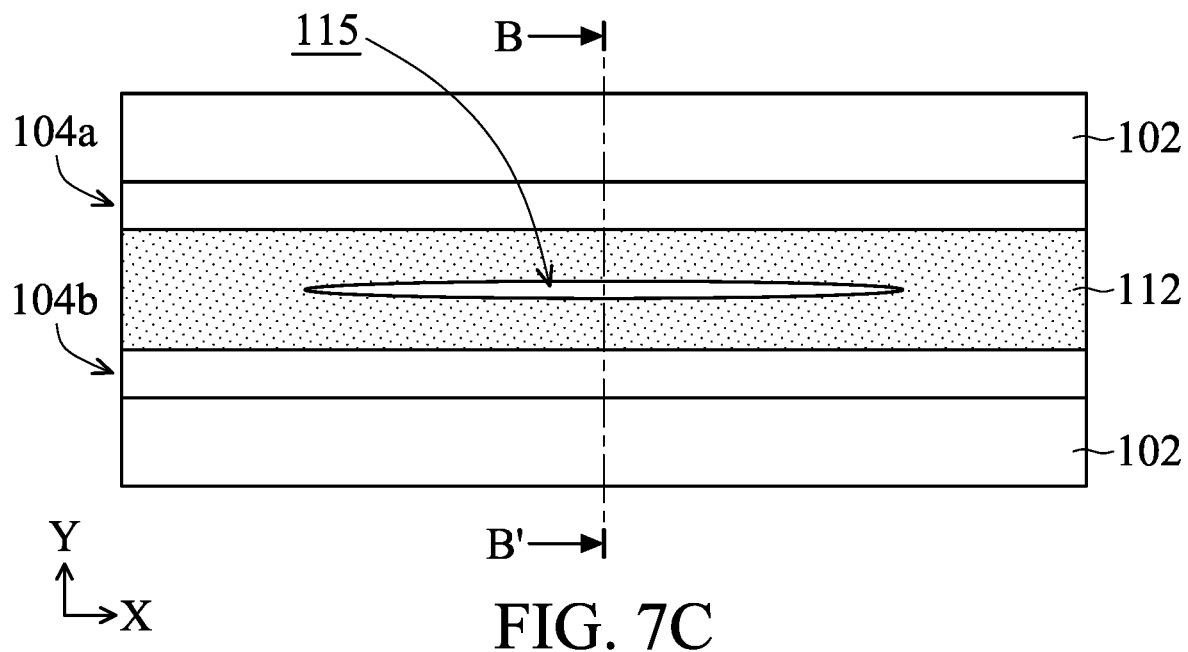

Next, as shown in FIGS. 7C and 8C, the portion of the dielectric wall 112 which is outside of the recess is removed, in accordance with some embodiments. As a result, the remaining dielectric wall 112 is between the first fin structure 104a and the second fin structure 104b. In addition, the top surface of the dielectric wall 112 is lower than the top surface of the mask structure 110, but higher than the top surface of the topmost second semiconductor material layer 108.

Figure 7D:
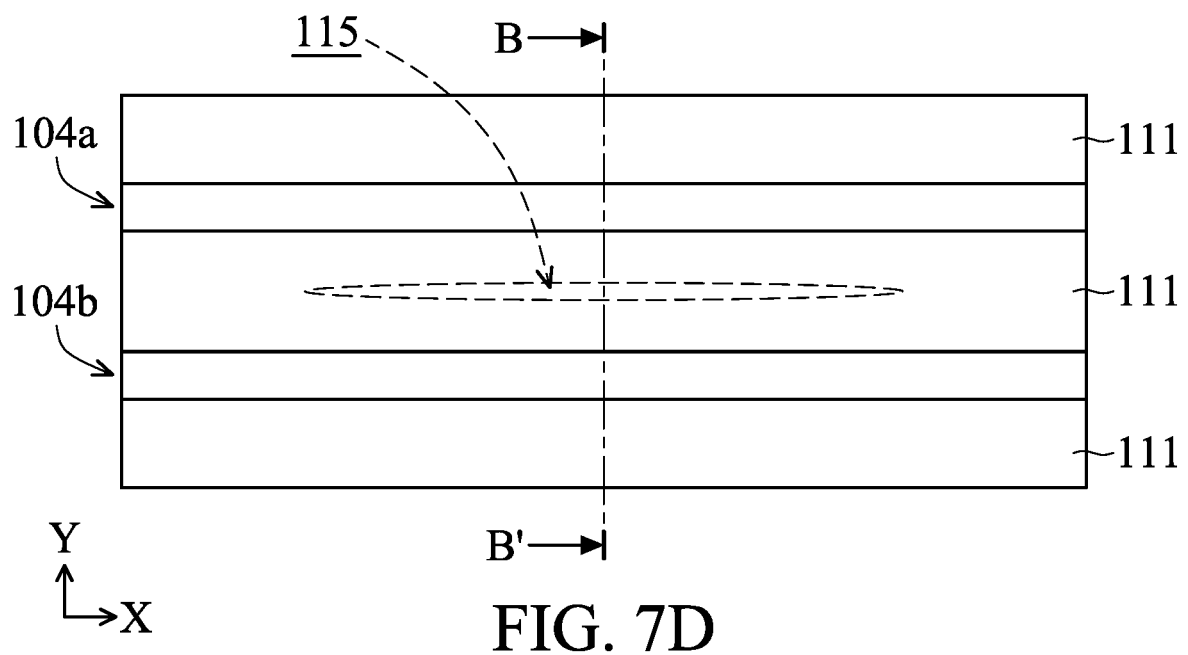

Afterwards, as shown in FIGS. 7D and 8D, the isolation material 111 is formed around the first fin structure 104a and the second fin structure 104b, and over the mask structure 110, in accordance with some embodiments. Next, the top portion of the isolation material 111 is removed by a planarization process such as CMP process.

Figure 7E:
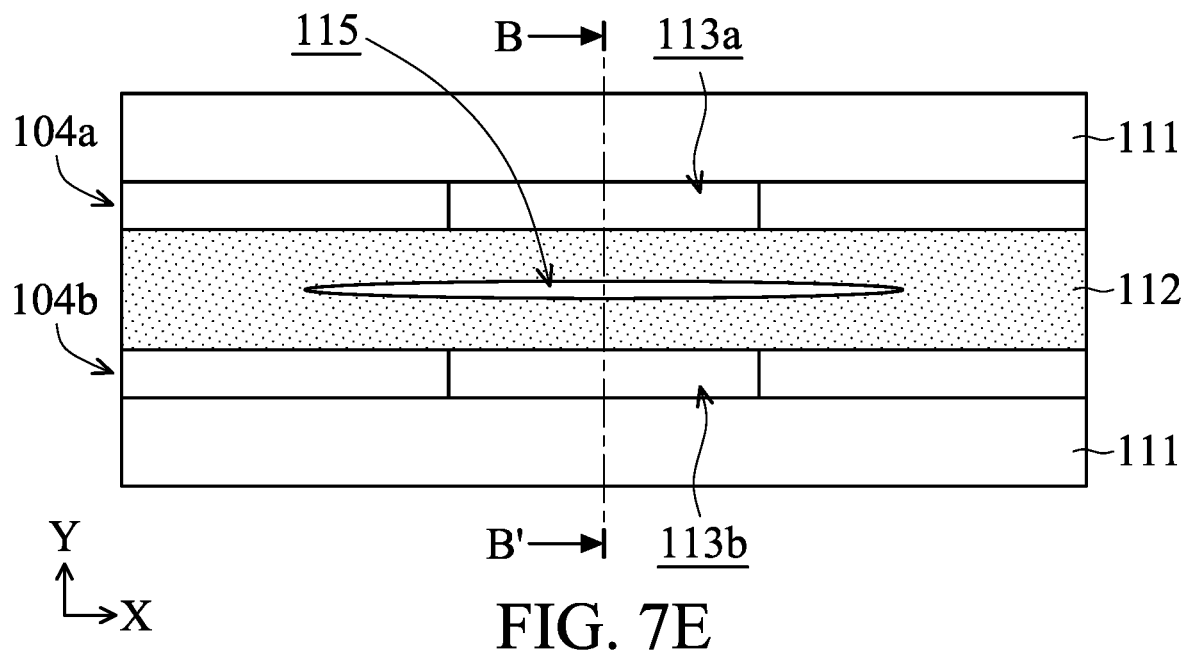

Next, as shown in FIGS. 7E and 8E, the mask structure 110 and the top portions of the first fin structure 104a and the second fin structure 104b are removed to form the first trench 113a and the second trench 113b, in accordance with some embodiments. As a result, the remaining fin structure 104a and the remaining fin structure 104b are exposed by the first trench 113a and the second trench 113b. The dielectric wall 112 is not removed and is between the first trench 113a and the second trench 113b.

Figure 7F:
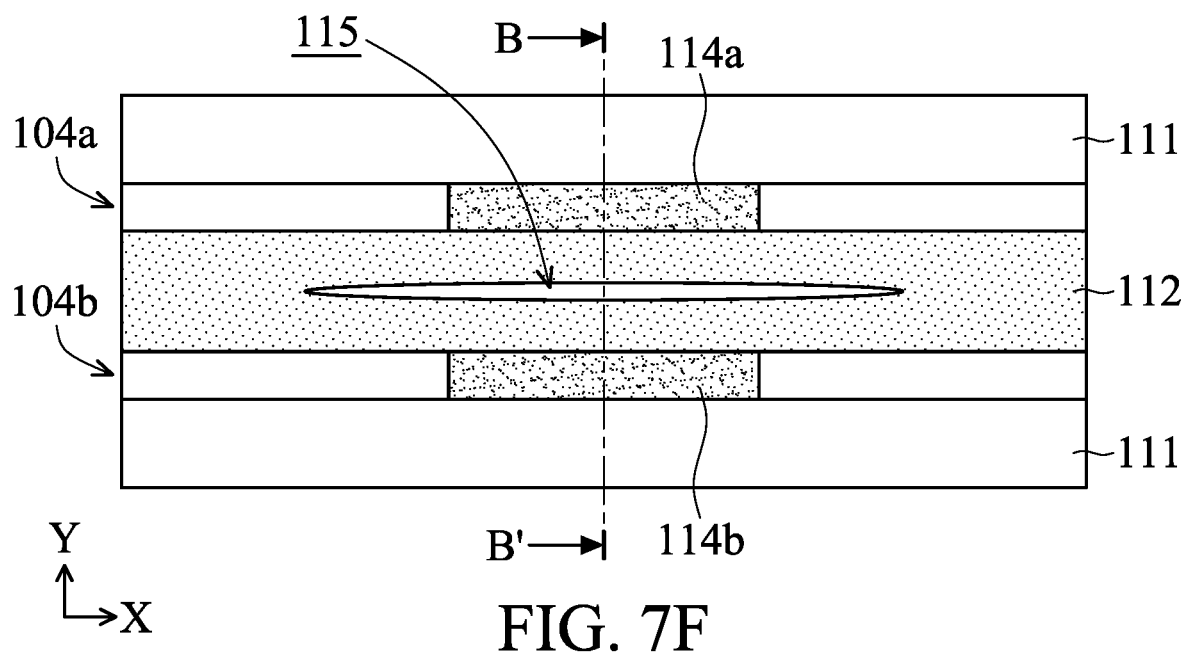

Afterwards, as shown in FIGS. 7F and 8F, a dielectric material (not shown) is formed in the first trench 113a and the second trench 113b, and the top portions outside of the first trench 113a and the second trench 113b are removed to form the first dielectric structure 114a and the second dielectric structure 114b, in accordance with some embodiments. The dielectric wall 112 is between the first dielectric structure 114a and the second dielectric structure 114b.

The material of the first dielectric structure 114a and the second dielectric structure 114b are different from the first fin structure 104a and the second fin structure 104b. In addition, the material of the first dielectric structure 114a and the second dielectric structure 114b are different from the isolation material 111.

Figure 7G:
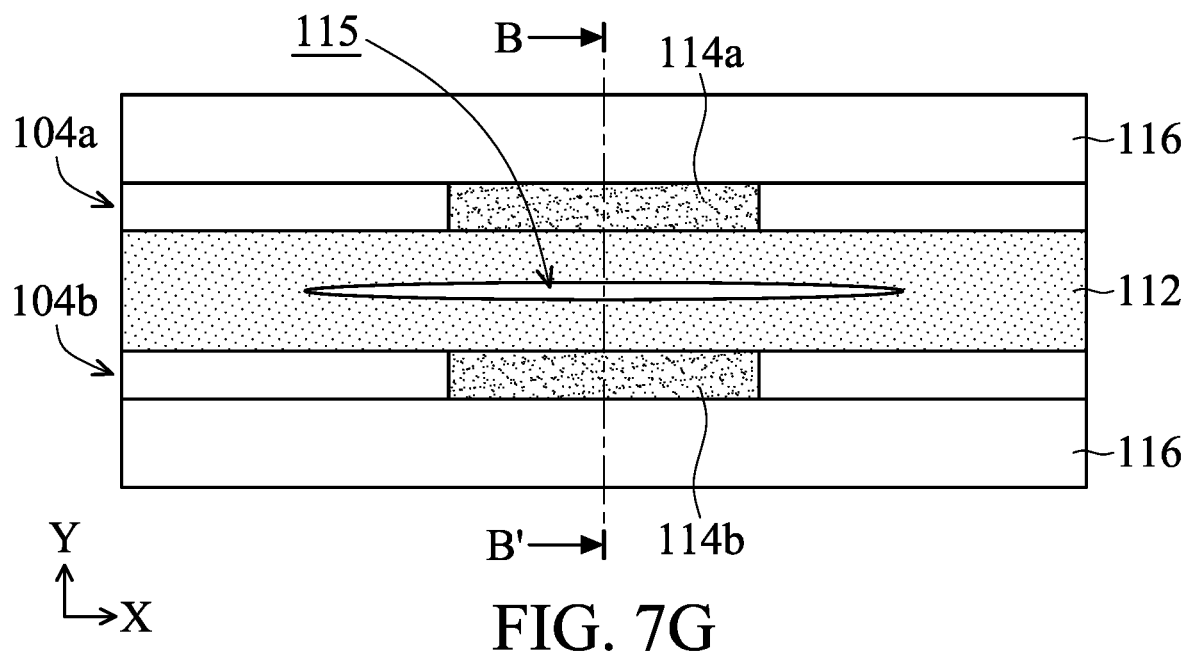

Afterwards, as shown in FIGS. 7G and 8G, the top portion of the isolation material 111 is removed to form the isolation structure 116, in accordance with some embodiments.

The top surface of the isolation structure 116 is higher than the interface between the first dielectric structure 114a and the first fin structure 104a. The top surface of the isolation structure 116 is higher than the interface between the second dielectric structure 114b and the second fin structure 104b.

Figure 9:
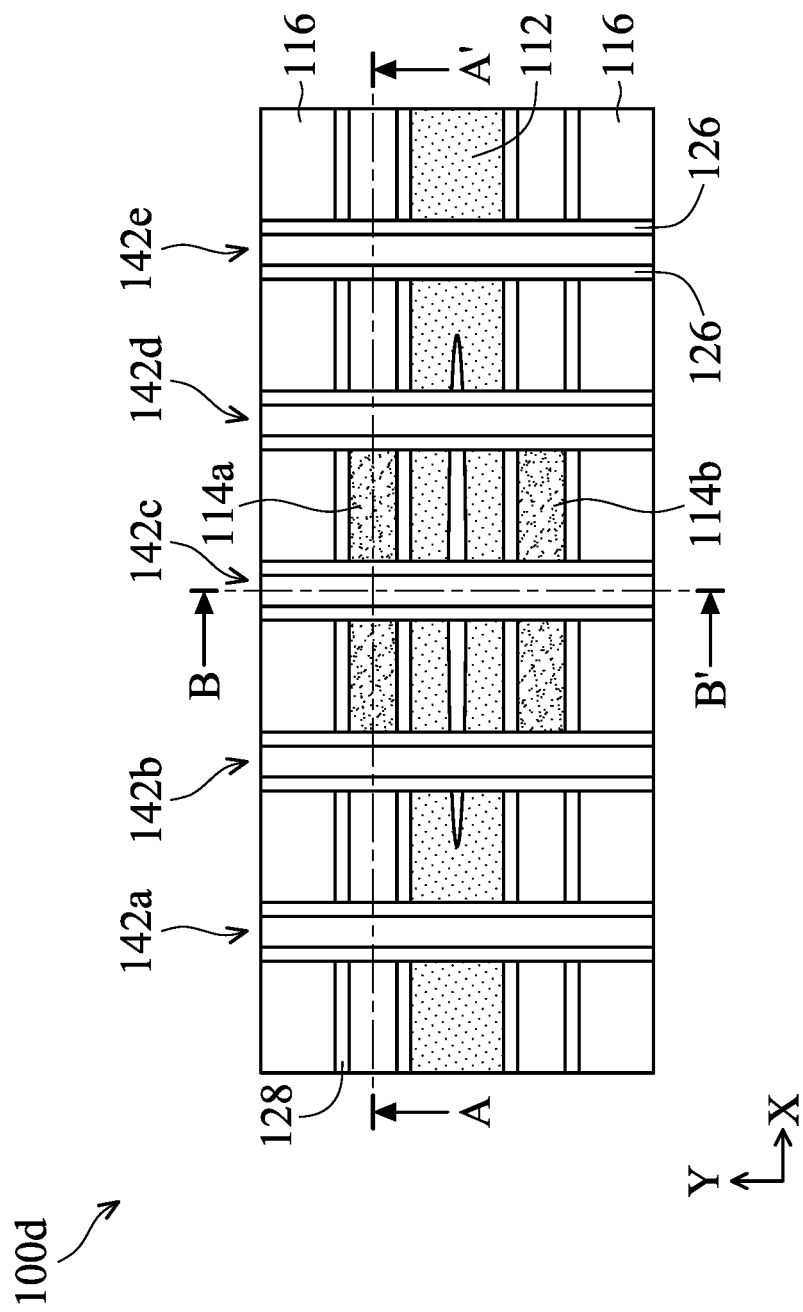
FIG. 9 shows a top-view of manufacturing the semiconductor device structure after FIGS. 7G and 8G, in accordance with some embodiments.

FIG. 9 shows a top-view of manufacturing the semiconductor device structure 100d after FIGS. 7G and 8G, in accordance with some embodiments. The semiconductor device structure 100d of FIG. 9 includes elements that are similar to, or the same as, elements of the semiconductor device structure 100a of FIGS. 2A-2G and 3A-3G. The semiconductor device structure 100d is a forksheet device.

After FIGS. 7G and 8G, as shown in FIG. 9, the dummy gate structures (not shown) are formed across the first fin structure 104a and the second fin structure 104b and extend over the isolation structure 116, in accordance with some embodiments. Next, performing the steps similar to FIGS. 1F-1G, 3A-3F, the dummy gate structures are replaced with the first gate structure 142a, the second gate structure 142b, the third gate structure 142c, the fourth gate structure 142d and the fifth gate structure 142e, in accordance with some embodiments. The third gate structure 142c which is directly above the first dielectric structure 114a is between the second gate structure 142b and the fourth gate structure 142d. The first gate structure 142a, the second gate structure 142b, the third gate structure 142c, the fourth gate structure 142d and the fifth gate structure 142e are arranged parallel to each other along the second direction (e.g. Y-axis).

Figure 10A:
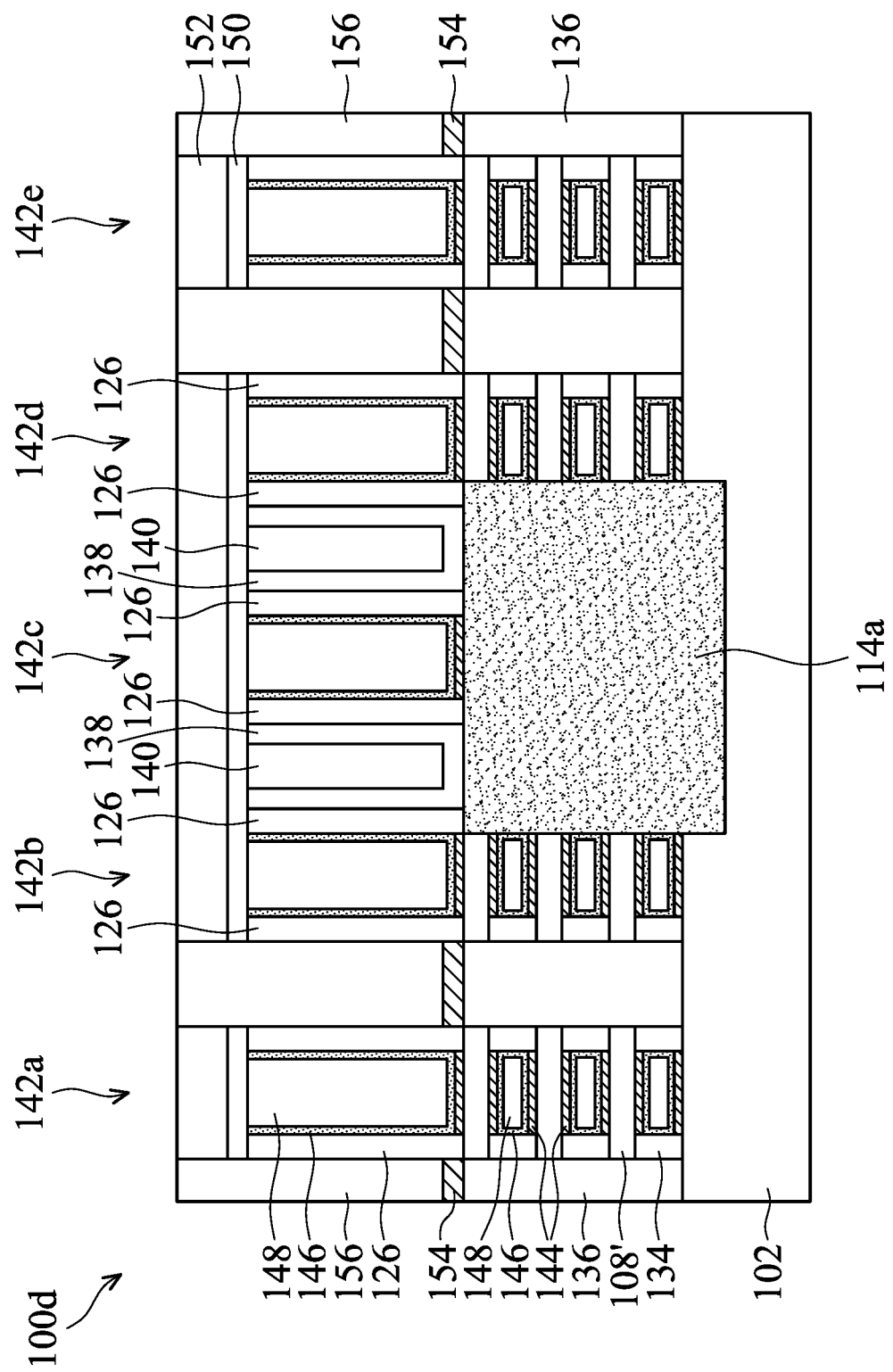
FIG. 10A shows a cross-sectional representation of the semiconductor device structure shown along line A-A' in FIG. 9, in accordance with some embodiments.

FIG. 10A shows a cross-sectional representation of the semiconductor device structure 100d shown along line A-A' in FIG. 9, in accordance with some embodiments.

As shown in FIG. 10A, the semiconductor device structure 100d is similar to semiconductor device structure 100a as shown in FIG. 3G. The third gate structure 142c is directly above the first dielectric structure 114a. The first dielectric structure 114a is in direct contact with the nanostructures 108' of the second gate structure 142b. The S/D structure 136 and the first dielectric structure 114a are formed on opposite sidewall surfaces of the second gate structure 142b.

Figure 10B:
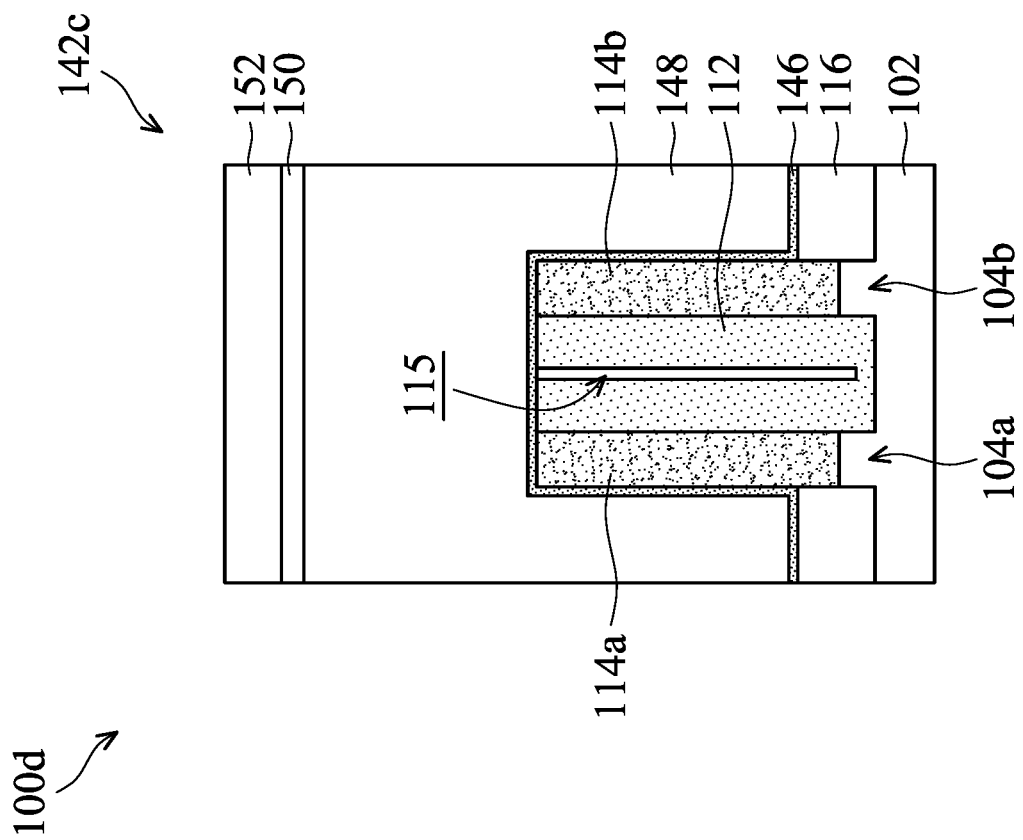
FIG. 10B shows a cross-sectional representation of the semiconductor device structure shown along line B-B' in FIG. 9, in accordance with some embodiments.

FIG. 10B shows a cross-sectional representation of the semiconductor device structure 100d shown along line B-B' in FIG. 9, in accordance with some embodiments.

As shown in FIG. 10B, the dielectric wall 112 is between the first dielectric structure 114a and the second dielectric structure 114b. The interface between the first dielectric structure 114a and the remaining first fin structure 104a is lower than the top surface of the isolation structure 116. The bottom surface of the dielectric wall 112 is lower than the bottom surface of the first dielectric structure 114a.

In the forksheet device, the dielectric wall is formed between two adjacent fin structures 104. When removing a portion of the fin structure to leave the remaining fin structure in the cut region, a portion of the dielectric wall is also removed. The edge of the remaining dielectric wall is exposed and therefore it may be easily damaged. In order to prevent or reduce the damage of the remaining dielectric wall, the dielectric wall 112 of this disclosure is not removed and is between first dielectric structure 114a and the second dielectric structure 114b in the cut region. Therefore, the performance of the semiconductor device structure 100d is improved.

FIGS. 11A to 11G show top-views of intermediate stages of manufacturing a semiconductor device structure 100e, in accordance with some embodiments. FIGS. 12A to 12G show cross-sectional representations of various stages of manufacturing the semiconductor device structure 100e shown along line B-B' in FIGS. 11A-11G in accordance with some embodiments. FIG. 12A shows a cross-sectional representation of the semiconductor device structure 100e shown along line B-B' in FIG. 11A, in accordance with some embodiments. The semiconductor device structure 100e of FIGS. 11A-11G and 12A-12G includes elements that are similar to, or the same as, elements of the semiconductor device structure 100a of FIGS. 2A-2G and 3A-3G.

Figure 11A:
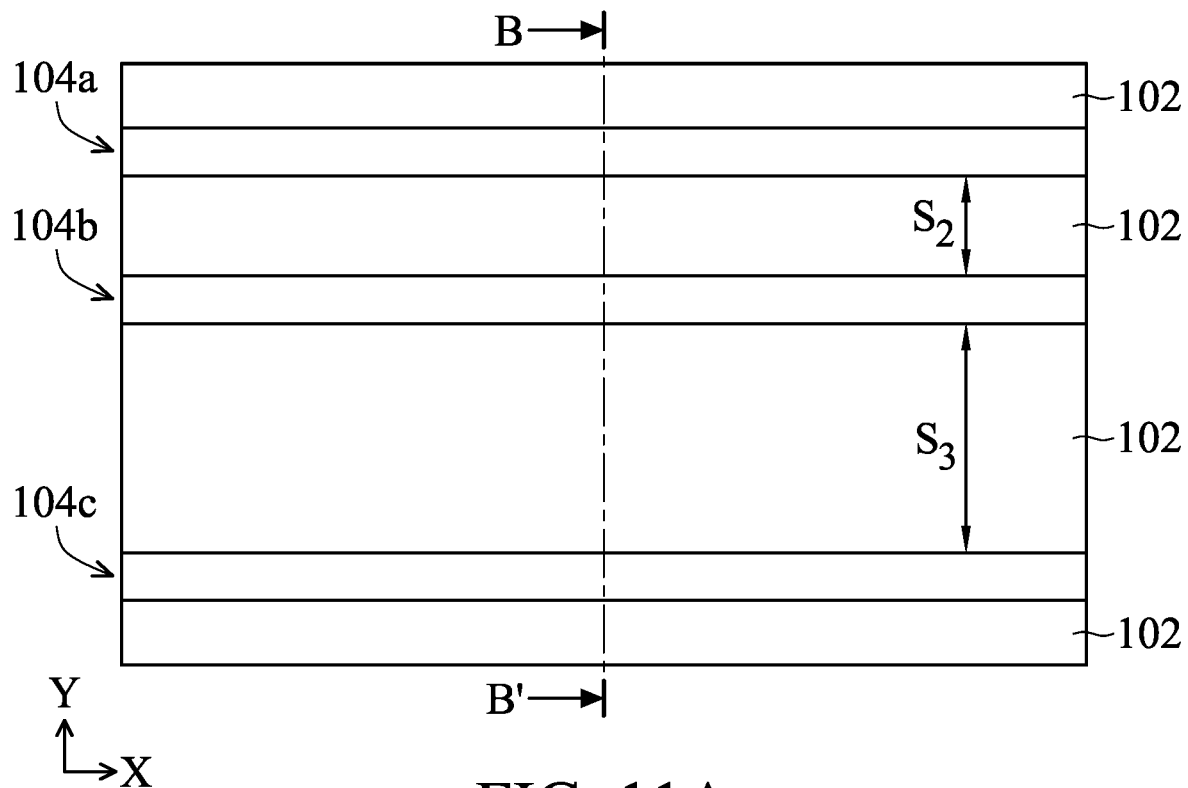
FIGS. 11A to 11G show top-views of intermediate stages of manufacturing a semiconductor device structure, in accordance with some embodiments.
Figures 12A, 12B:
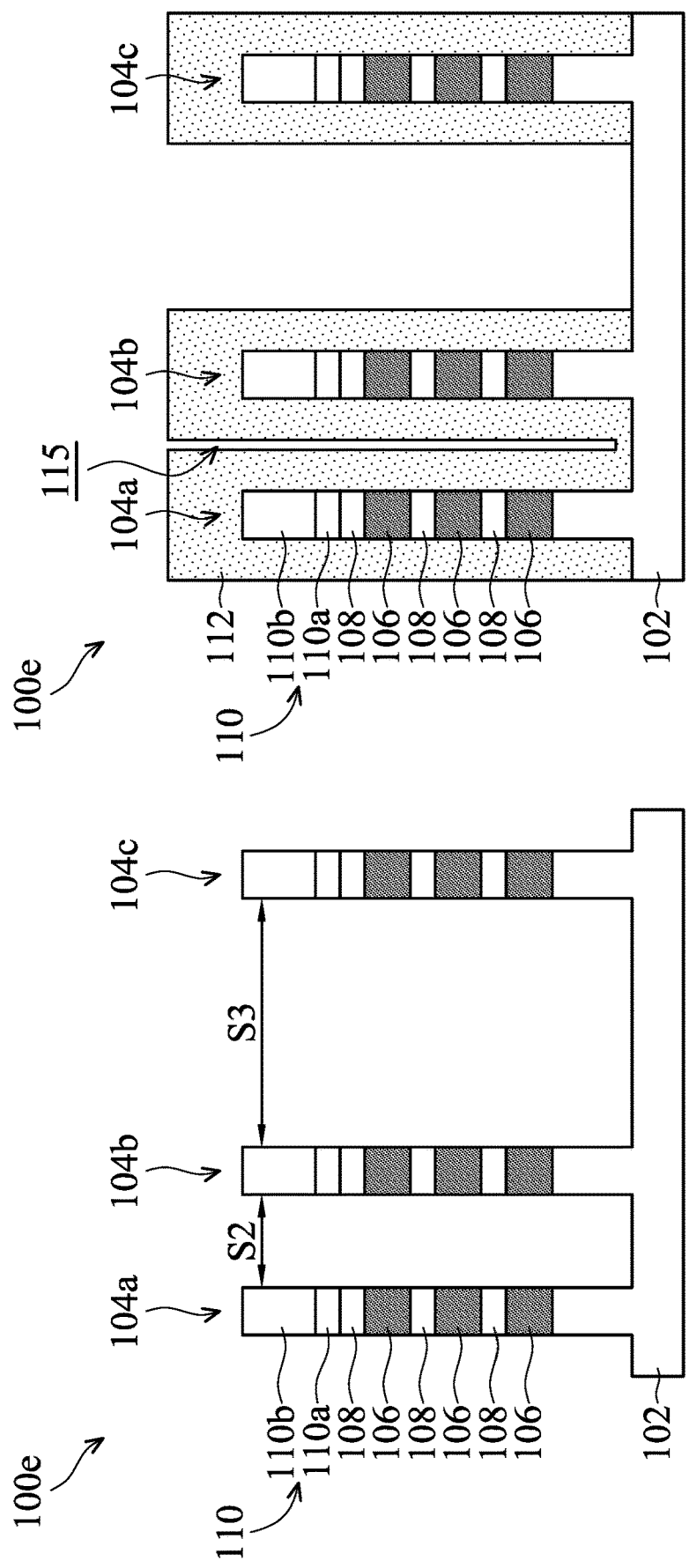

As shown in FIGS. 11A and 12A, the first fin structure 104a, the second fin structure 104b, and the third fin structure 104c are arranged in parallel to each other along the first direction (e.g. X-axis). The mask structures 110 including the pad oxide layer 110a and the nitride layer 110b are formed on the first fin structure 104a, the second fin structure 104b and the third fin structure 104c.

There is a second distance $S_2$ between the sidewall surface of the first fin structure 104a and the sidewall surface of the second fin structure 104b. There is a third distance $S_3$ between the sidewall surface of the second fin structure 104b and the sidewall surface of the third fin structure 104c. In some embodiments, the second distance $S_2$ is smaller than the third distance $S_3$.

Figure 11B:
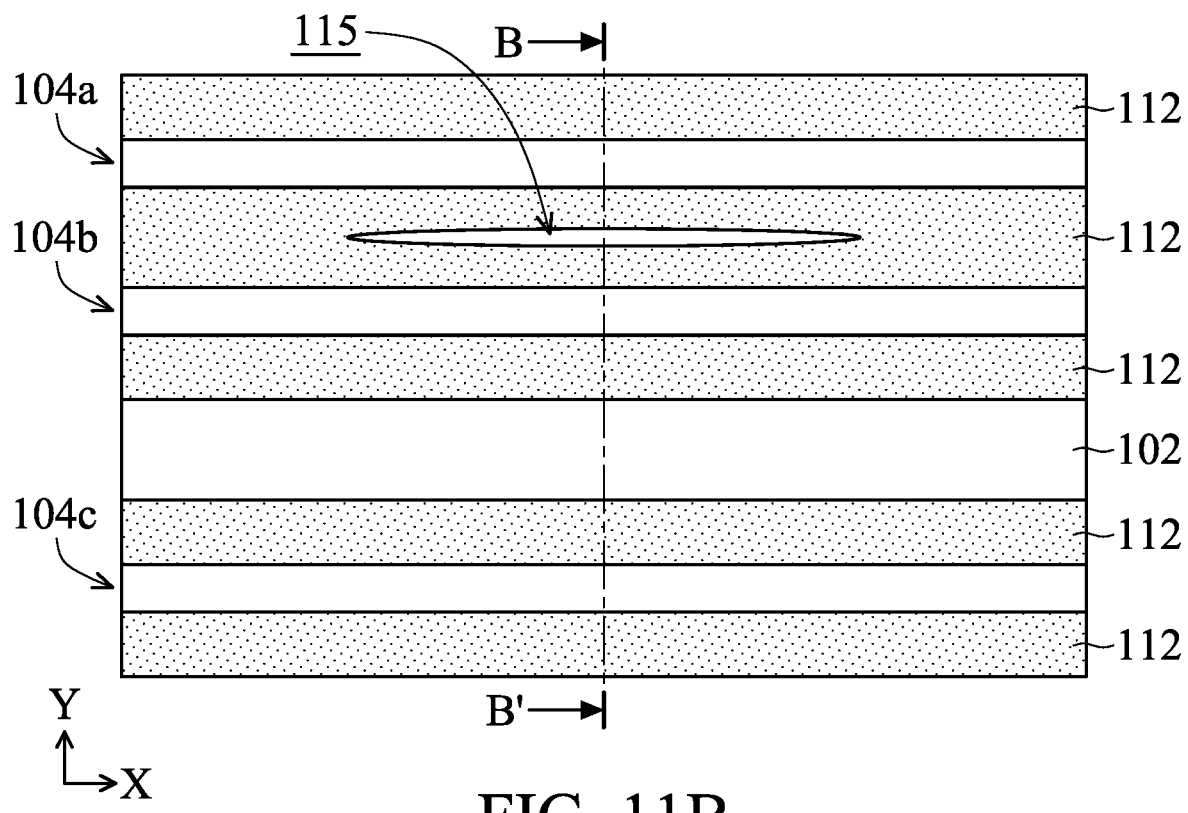

Next, as shown in FIGS. 11B and 12B, the dielectric wall 112 is formed in the recess between the first fin stricter 104a and the second fin structure 104b and over the substrate 102, in accordance with some embodiments. In addition, the dielectric wall 112 is formed on the third fin structure 104c. There is the void 115 is formed in the dielectric wall 112 when depositing the dielectric wall 112. In some other embodiments, no void is formed in the dielectric wall 112.

In some embodiments, the dielectric wall 112 is made of SiN, SiCN, SiOC, SiOCN or applicable material. In some embodiments, the dielectric wall 112 is formed by chemical vapor deposition (CVD), atomic vapor deposition (ALD), physical vapor deposition (PVD), another suitable method, or a combination thereof.

Figure 11C:
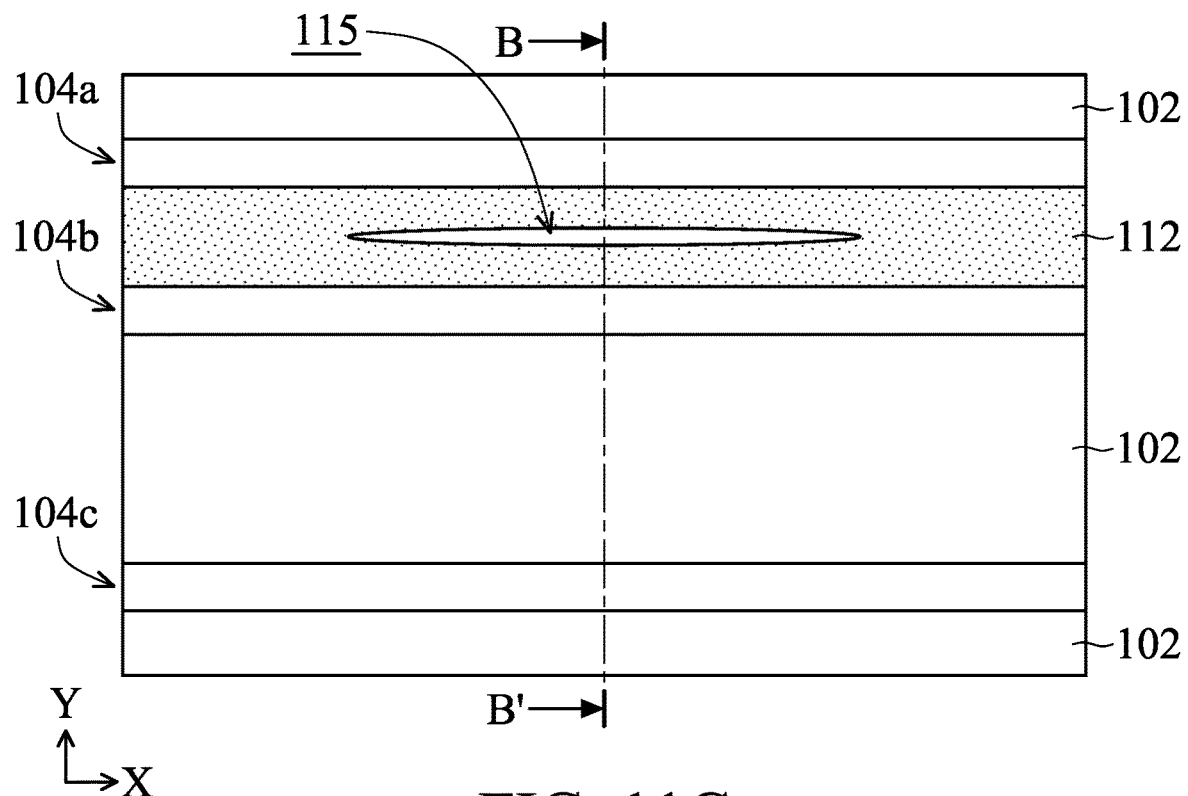
Figures 12C, 12D:
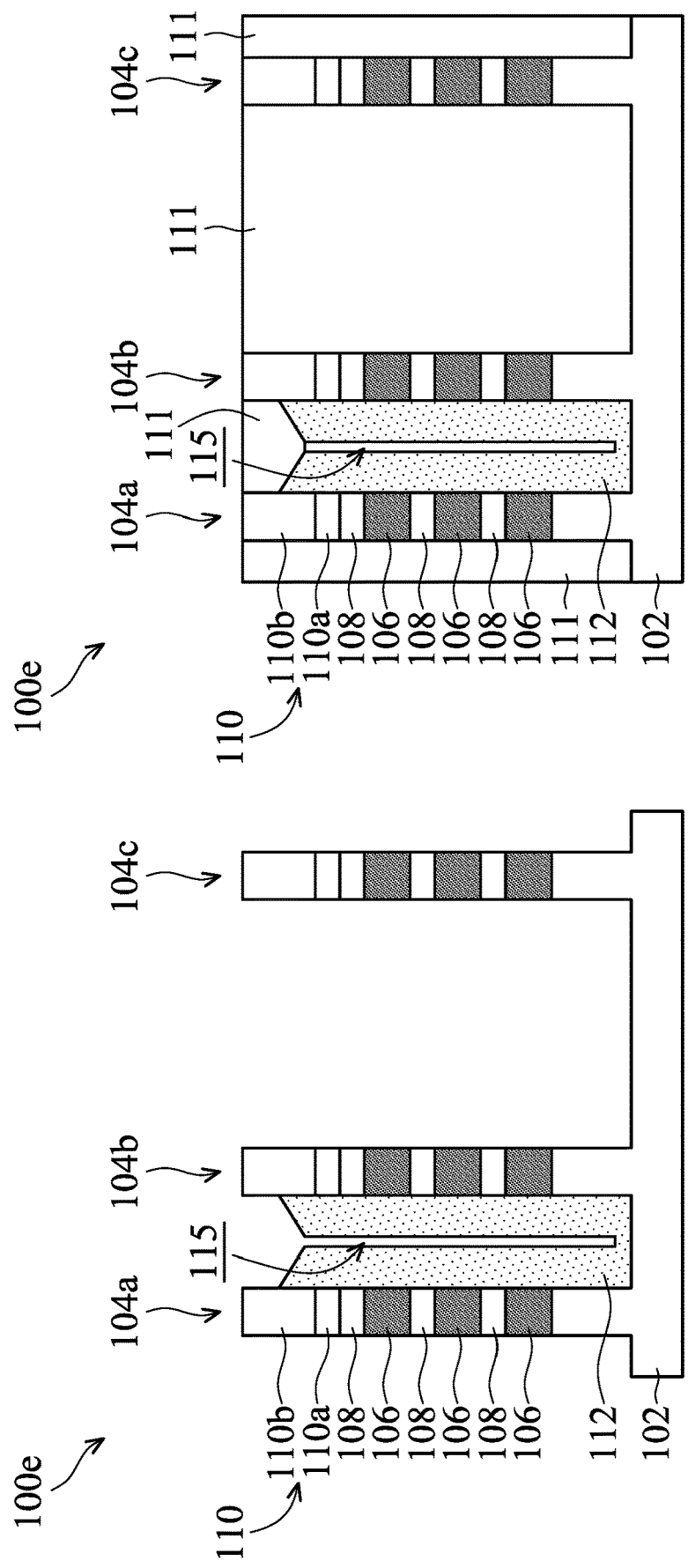

As shown in FIGS. 11C and 12C, the portion of the dielectric wall 112 which is outside of the recess is removed, in accordance with some embodiments. As a result, the remaining dielectric wall 112 is between the first fin structure 104a and the second fin structure 104b. In addition, the top surface of the dielectric wall 112 is lower than the top surface of the mask structure 110, but higher than the top surface of the topmost second semiconductor material layer 108.

Figure 11D:
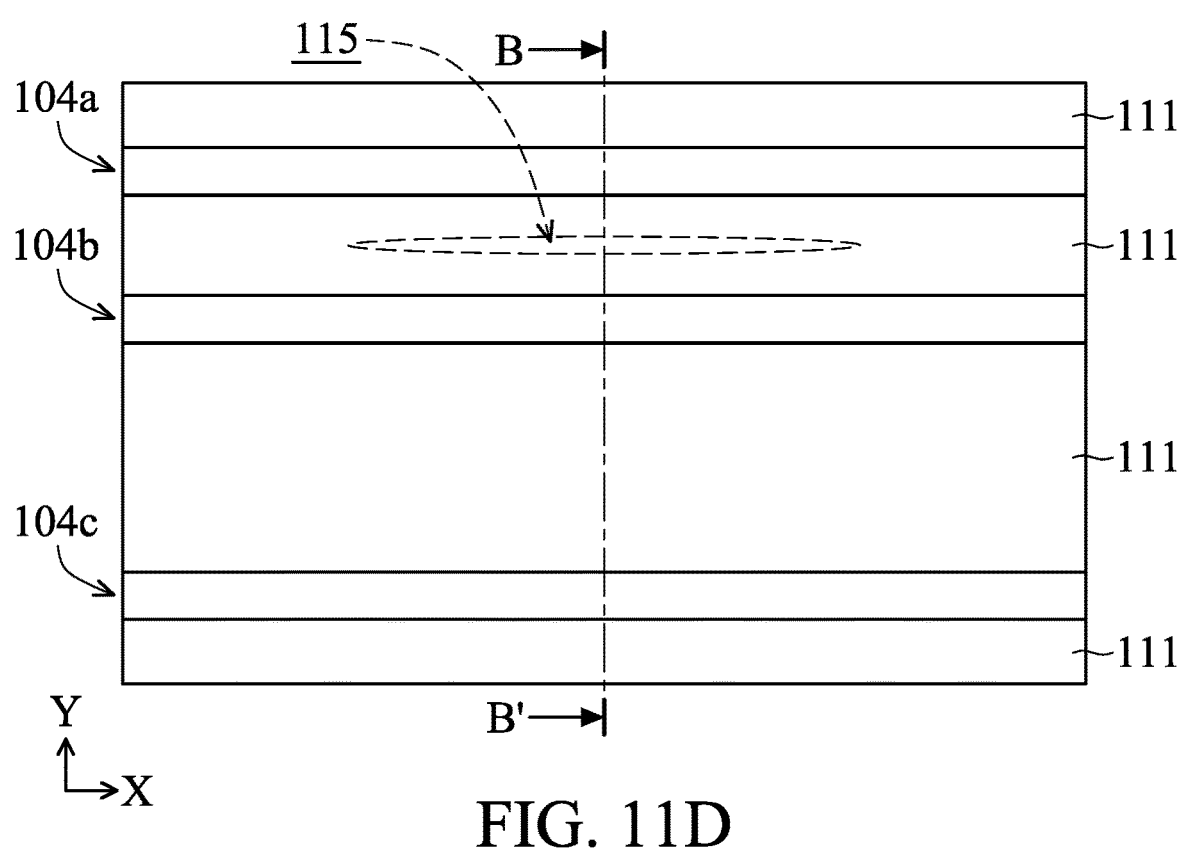

Afterwards, as shown in FIGS. 11D and 12D, the isolation material 111 is formed around the first fin structure 104a and the second fin structure 104b, and over the mask structure 110, in accordance with some embodiments. Next, the top portion of the isolation material 111 is removed by a planarization process such as CMP process.

Figure 11E:
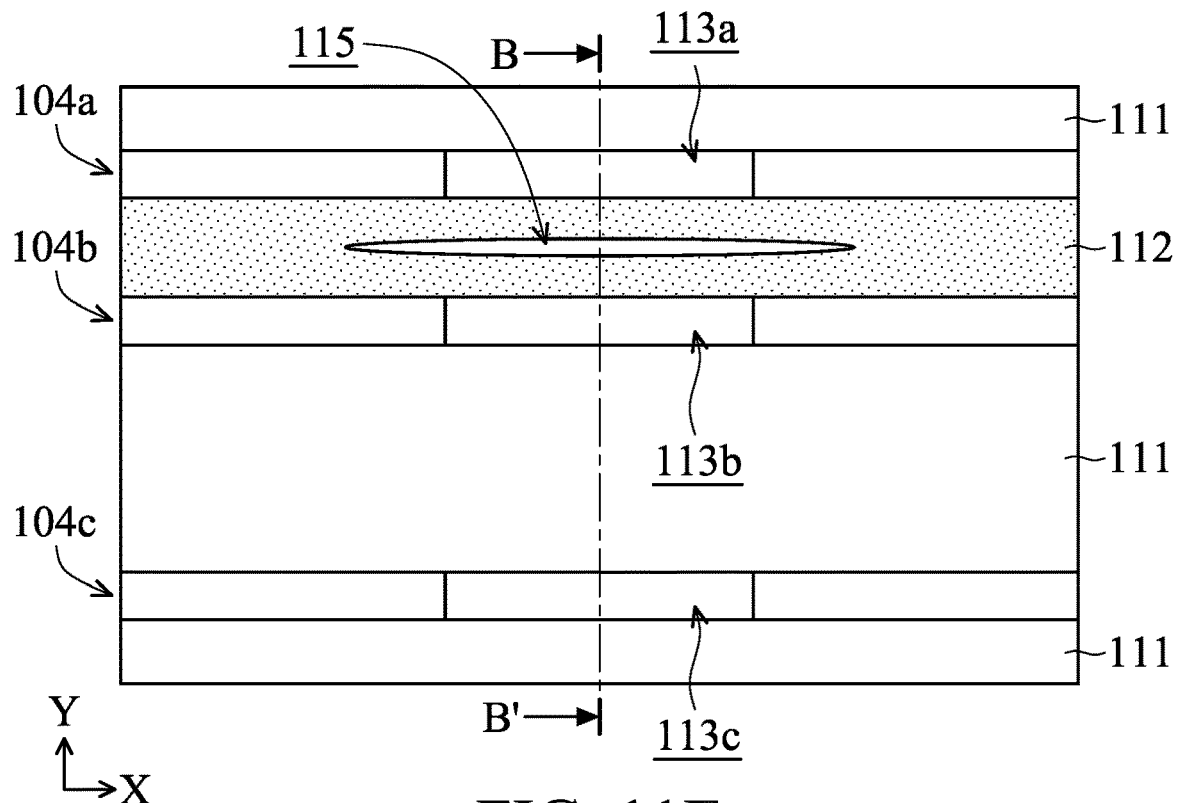

Next, as shown in FIGS. 11E and 12E, the mask structure 110 and the top portions of the first fin structure 104a, the second fin structure 104b and the third fin structure 104c are removed to form the first trench 113a, the second trench 113b and the third trench 113c, in accordance with some embodiments. As a result, the remaining first fin structure 104a, the remaining second fin structure 104b and the remaining third fin structure 104c are exposed by the first trench 113a, the second trench 113b and the third trench 113c. The dielectric wall 112 is not removed and is between the first trench 113a and the second trench 113b.

Figure 11F:
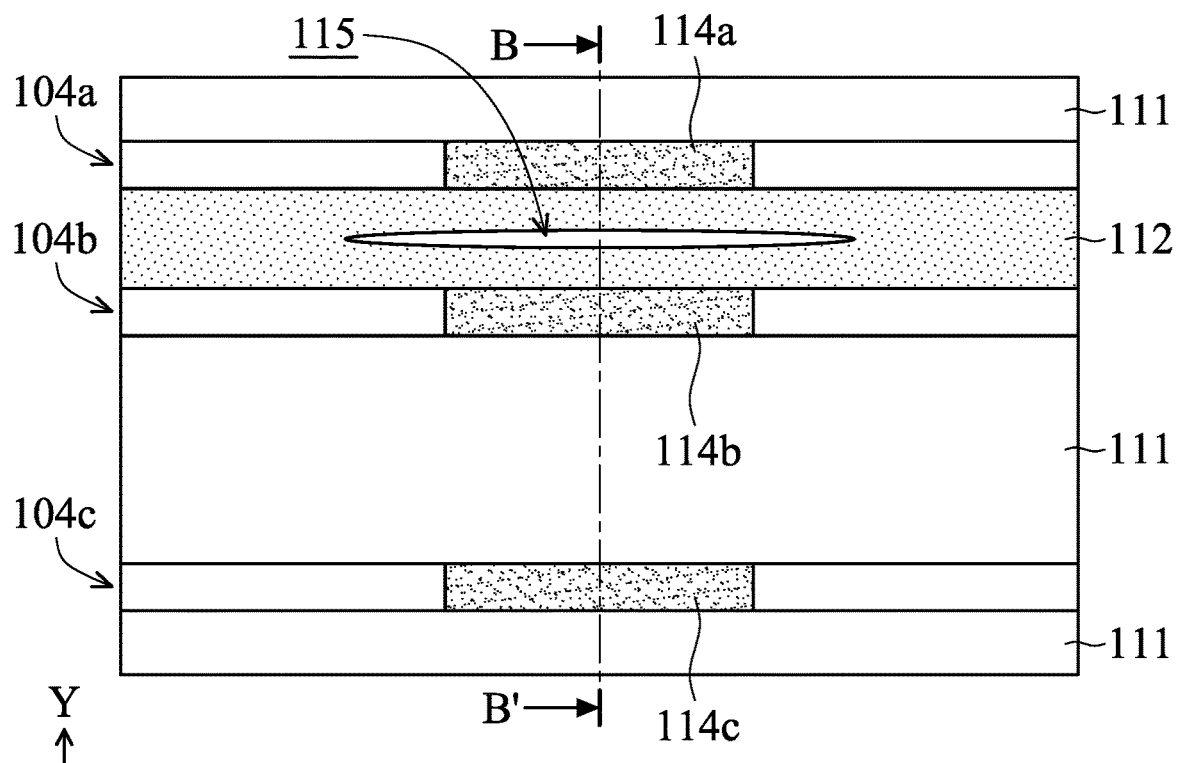

Afterwards, as shown in FIGS. 11F and 12F, a dielectric material (not shown) is formed in the first trench 113a and the second trench 113b, the top portion outside of the first trench 113a and the second trench 113b, and third trench 113c are removed to form the first dielectric structure 114a, the second dielectric structure 114b and the third dielectric structure 114c, in accordance with some embodiments.

The material of the first dielectric structure 114a, the second dielectric structure 114b and the third dielectric structure 114c are different from the first fin structure 104a, the second fin structure 104b and the third fin structure 104c. In addition, the materials of the first dielectric structure 114a, the second dielectric structure 114b and the third dielectric structure 114c are different from the isolation material 111.

Figure 11G:
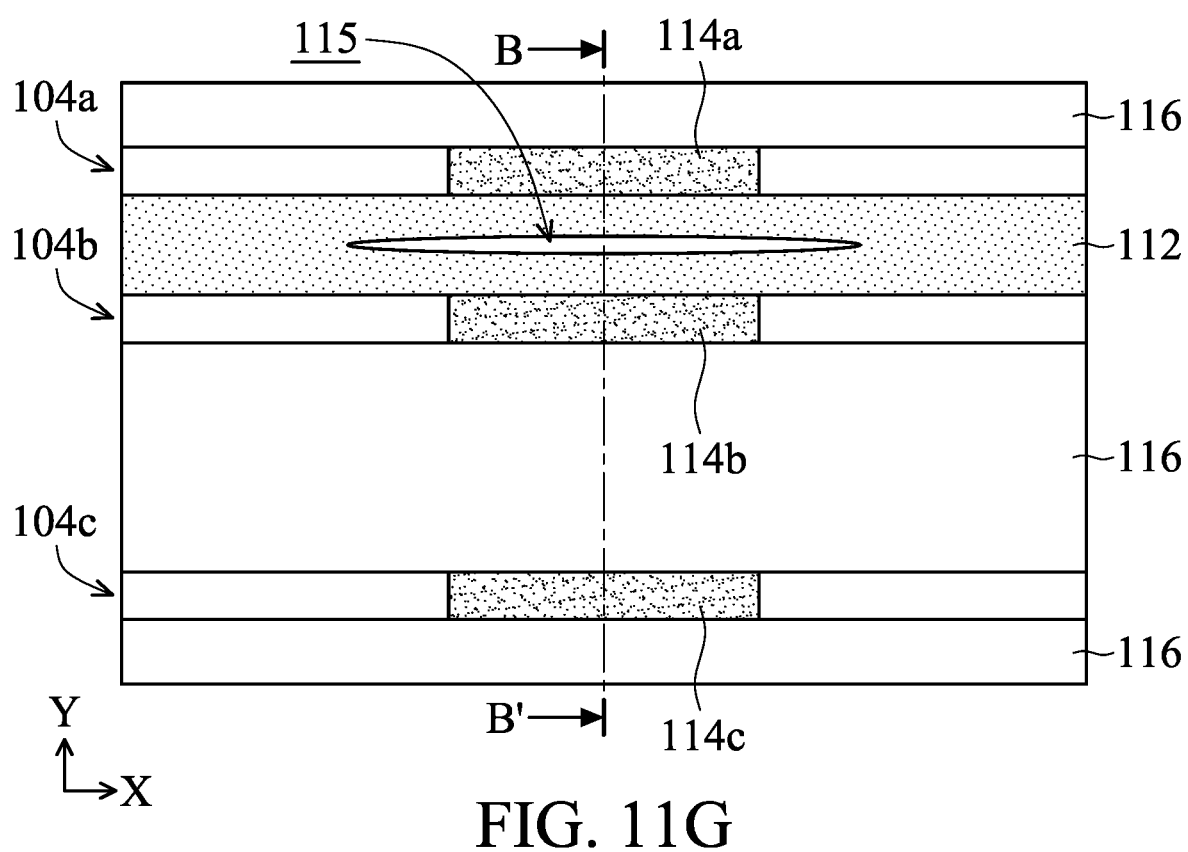
Figure 12G:
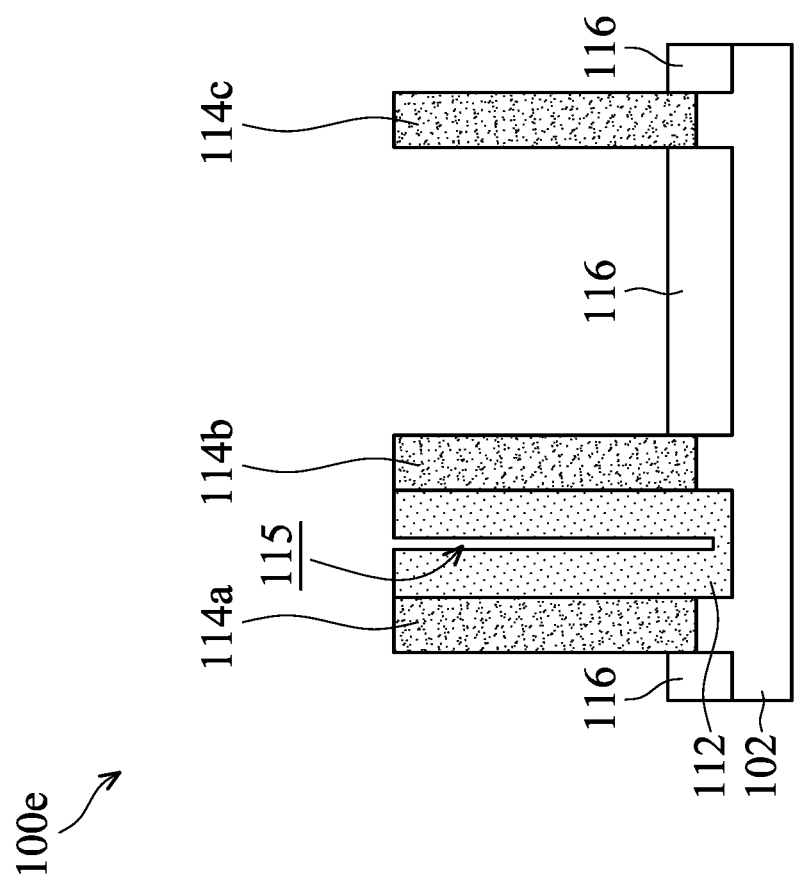

Afterwards, as shown in FIGS. 11G and 12G, the top portion of the isolation material 111 is removed to form the isolation structure 116, in accordance with some embodiments.

The top surface of the isolation structure 116 is higher than the interface between the first dielectric structure 114a and the first fin structure 104a. The top surface of the isolation structure 116 is higher than the interface between the second dielectric structure 114b and the second fin structure 104b. The top surface of the isolation structure 116 is higher than the interface between the third dielectric structure 114c and the third fin structure 104c.

Figure 13:
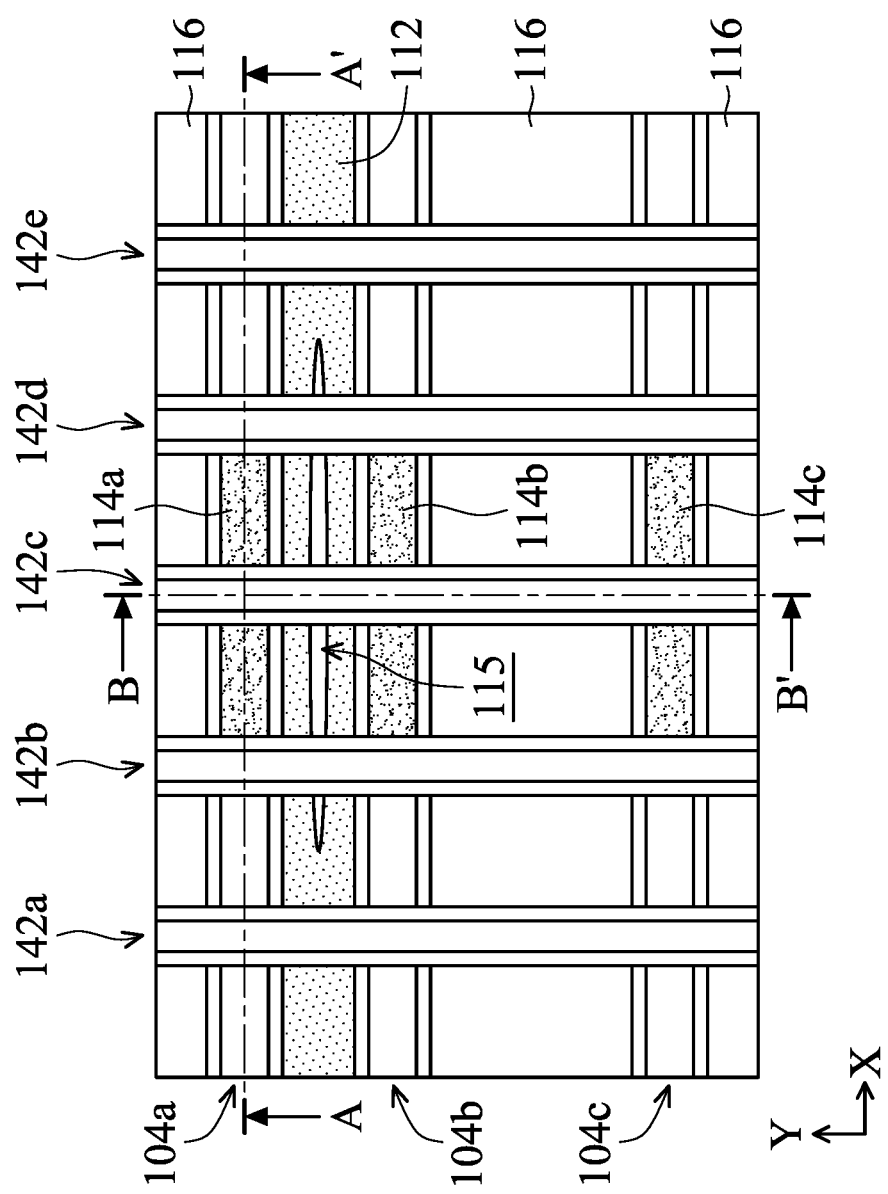
FIG. 13 shows a top-view of manufacturing the semiconductor device structure after FIGS. 11G and 12G, in accordance with some embodiments.

FIG. 13 shows a top-view of manufacturing the semiconductor device structure 100d after FIGS. 11G and 12G, in accordance with some embodiments.

After FIGS. 11G and 12G, as shown in FIG. 13, the dummy gate structures (not shown) are formed across the first fin structure 104a, the second fin structure 104b and the third fin structure 104c and extend over the isolation structure 116, in accordance with some embodiments. Next, performing the steps similar to FIGS. 1F-1G, 3A-3F, the dummy gate structures are replaced with the first gate structure 142a, the second gate structure 142b, the third gate structure 142c, the fourth gate structure 142d and the fifth gate structure 142e, in accordance with some embodiments. The third gate structure 142c which is directly above the first dielectric structure 114a is between the second gate structure 142b and the fourth gate structure 142d. The first gate structure 142a, the second gate structure 142b, the third gate structure 142c, the fourth gate structure 142d and the fifth gate structure 142e are arranged parallel to each other along the second direction (e.g. Y-axis).

Figure 14A:
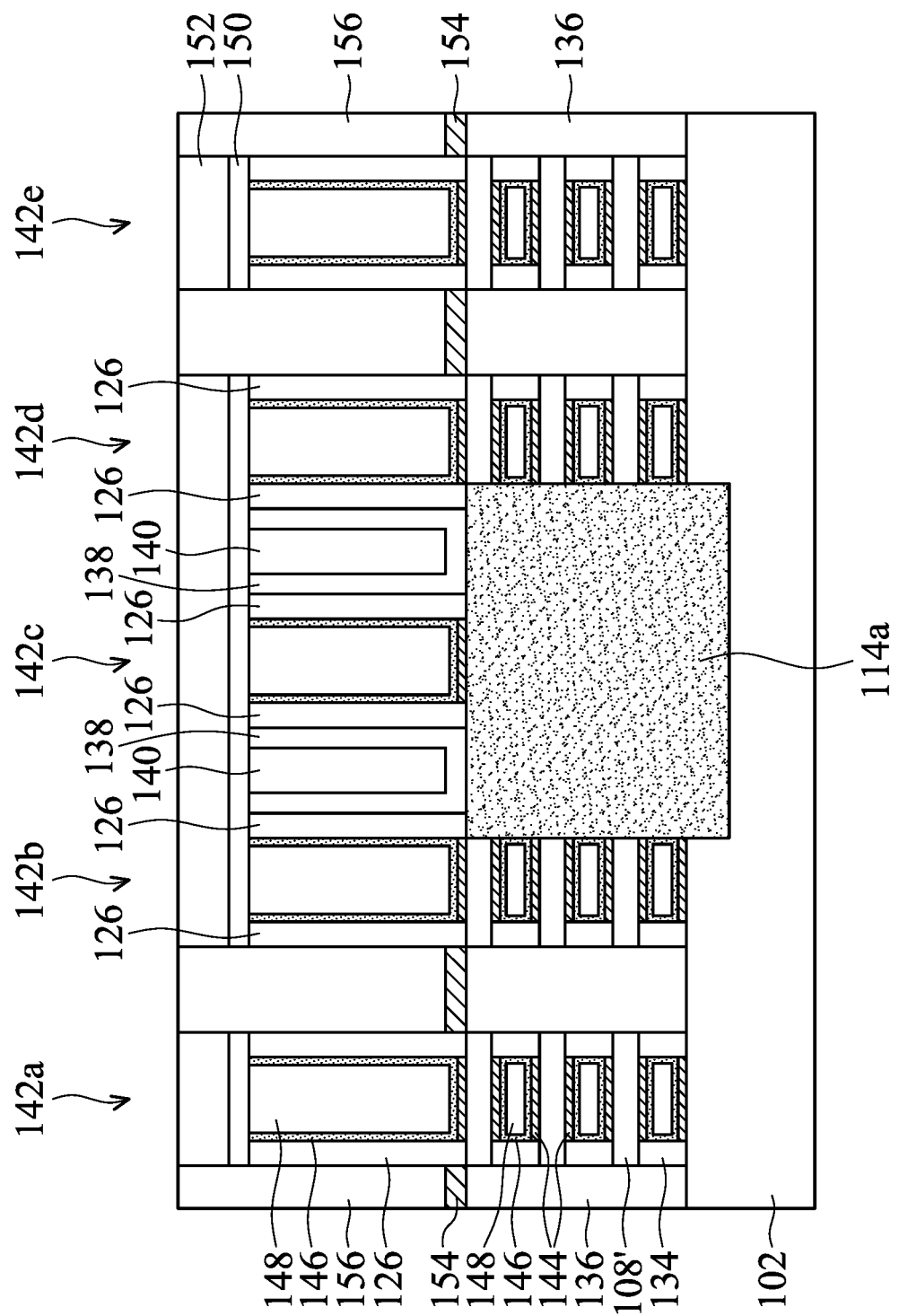
FIG. 14A shows a cross-sectional representation of the semiconductor device structure shown along line A-A' in FIG. 13, in accordance with some embodiments.

FIG. 14A shows a cross-sectional representation of the semiconductor device structure 100e shown along line A-A' in FIG. 13, in accordance with some embodiments.

As shown in FIG. 13A, the semiconductor device structure 100e is similar to semiconductor device structure 100a as shown in FIG. 3G. The third gate structure 142c is directly above the first dielectric structure 114a. The first dielectric structure 114a is in direct contact with the nanostructures 108' of the second gate structure 142b. The S/D structure 136 and the first dielectric structure 114a are formed on opposite sidewall surfaces of the second gate structure 142b.

Figure 14B:
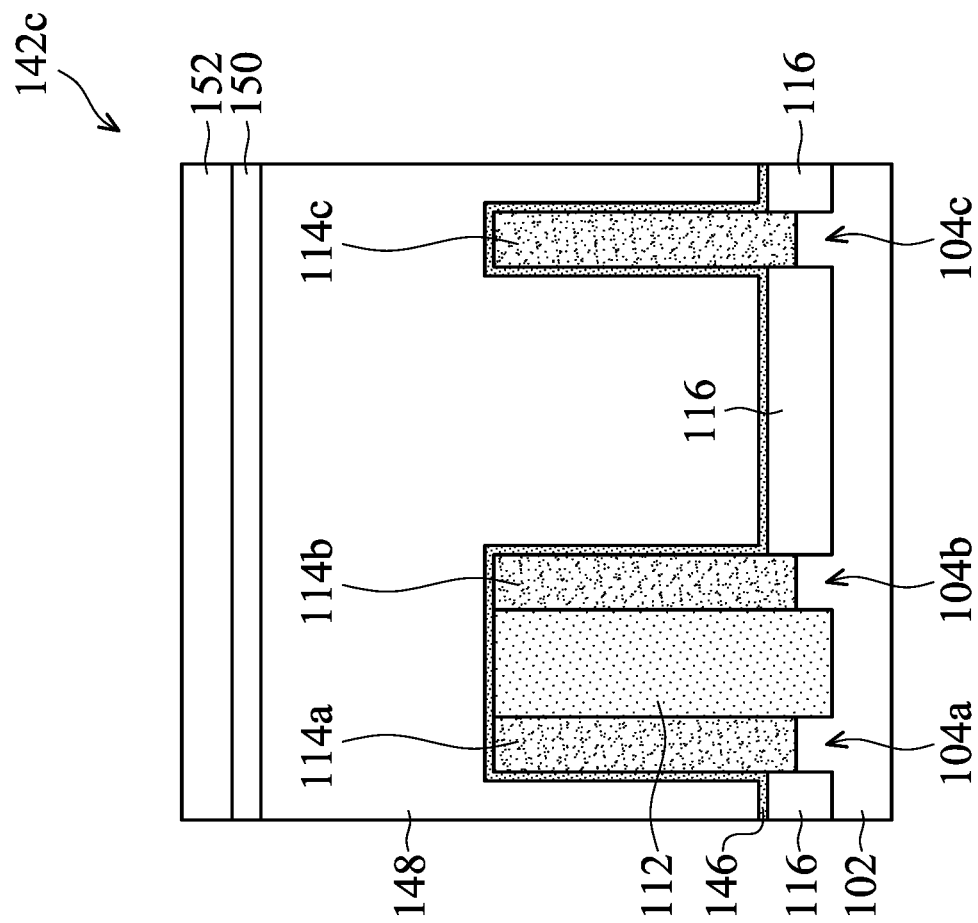
FIG. 14B shows a cross-sectional representation of the semiconductor device structure shown along line B-B' in FIG. 13, in accordance with some embodiments.

FIG. 14B shows a cross-sectional representation of the semiconductor device structure 100e shown along line B-B' in FIG. 13, in accordance with some embodiments.

As shown in FIG. 14B, the dielectric wall 112 is between the first dielectric structure 114a and the second dielectric structure 114b. The interface between the first dielectric structure 114a and the remaining first fin structure 104a is lower than the top surface of the isolation structure 116. The bottom surface of the dielectric wall 112 is lower than the bottom surface of the first dielectric structure 114a.

Figure 15A:
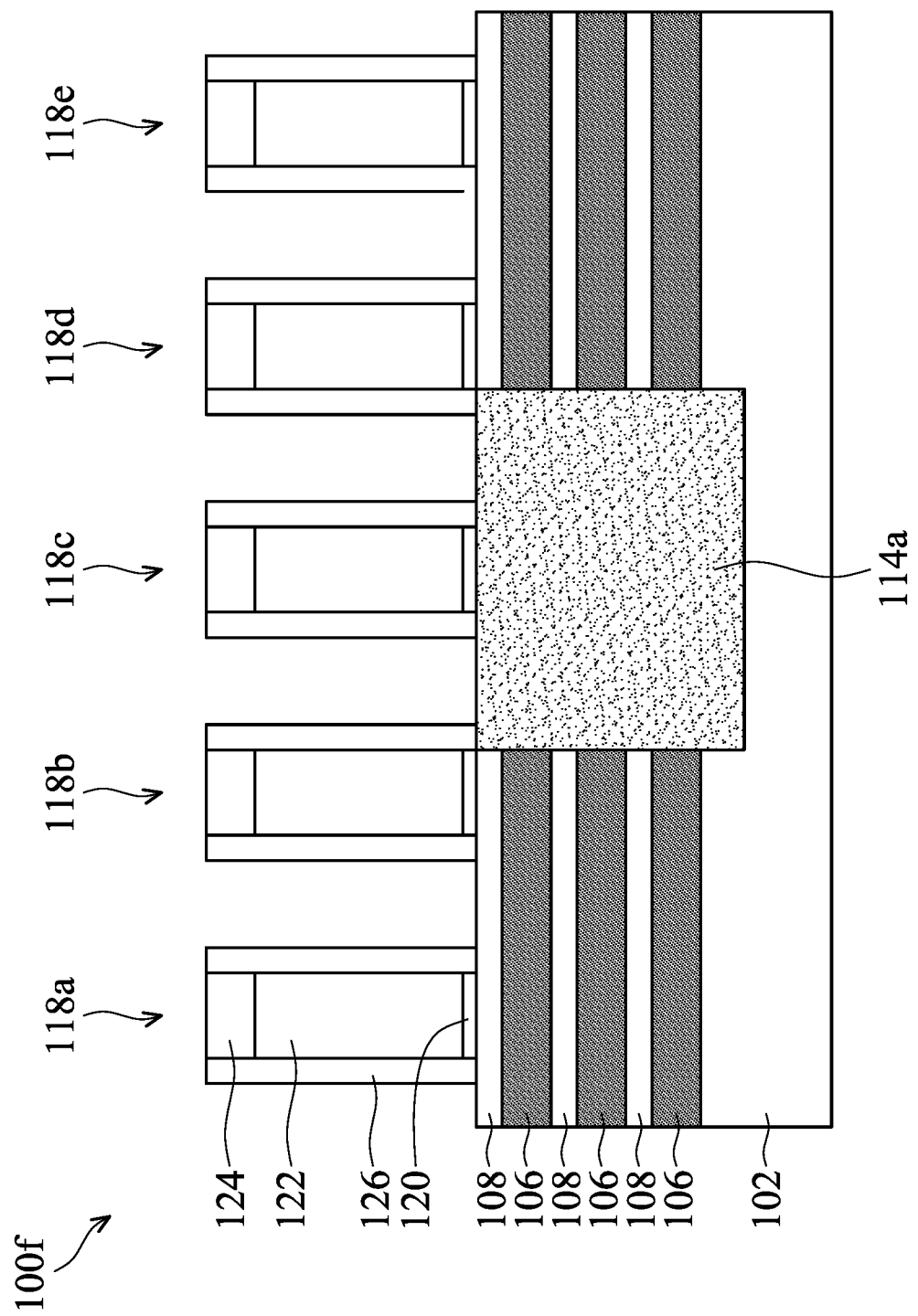
FIGS. 15A-15C shows a cross-sectional representation of a semiconductor device structure, in accordance with some embodiments.
Figure 15B:
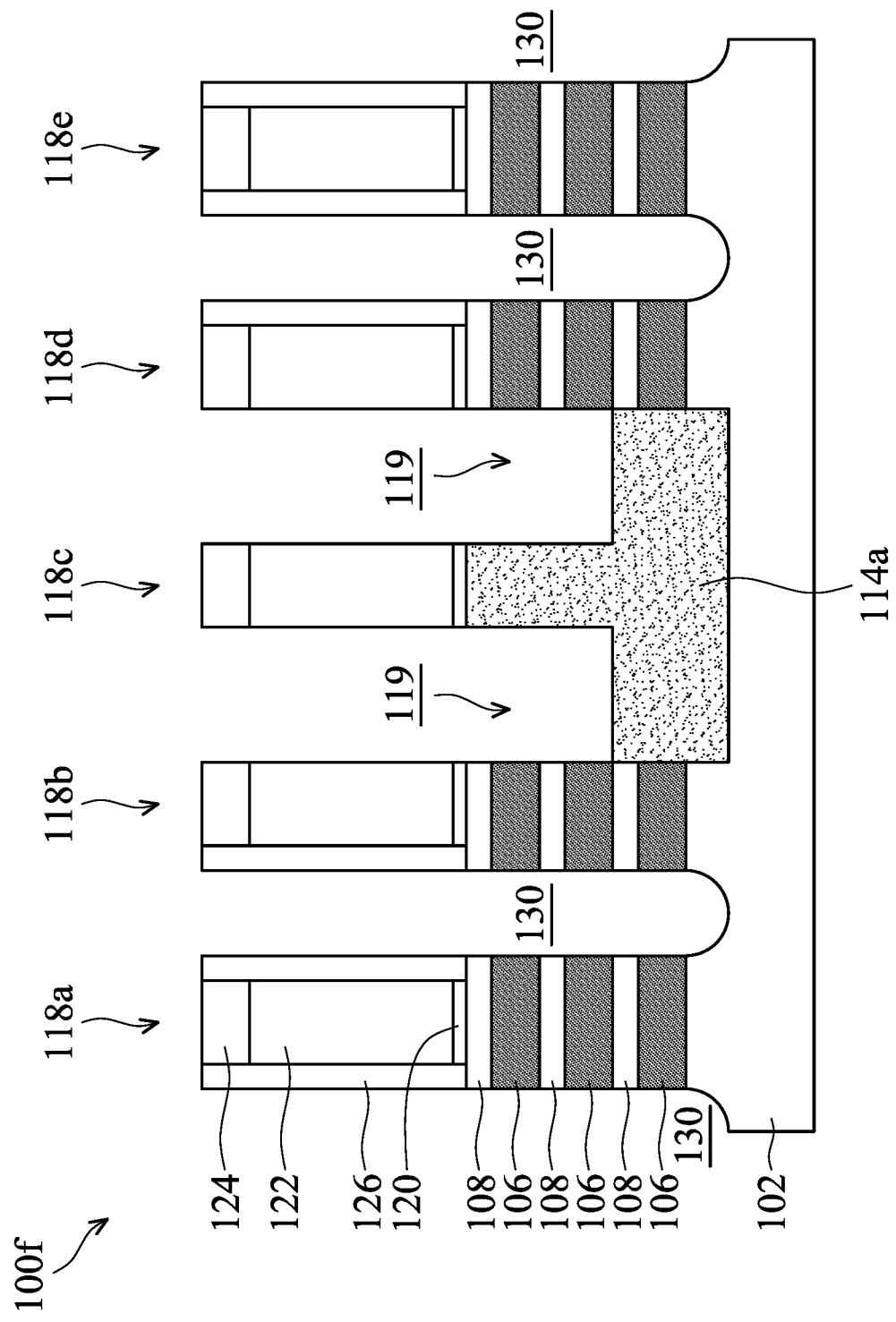
Figure 15C:
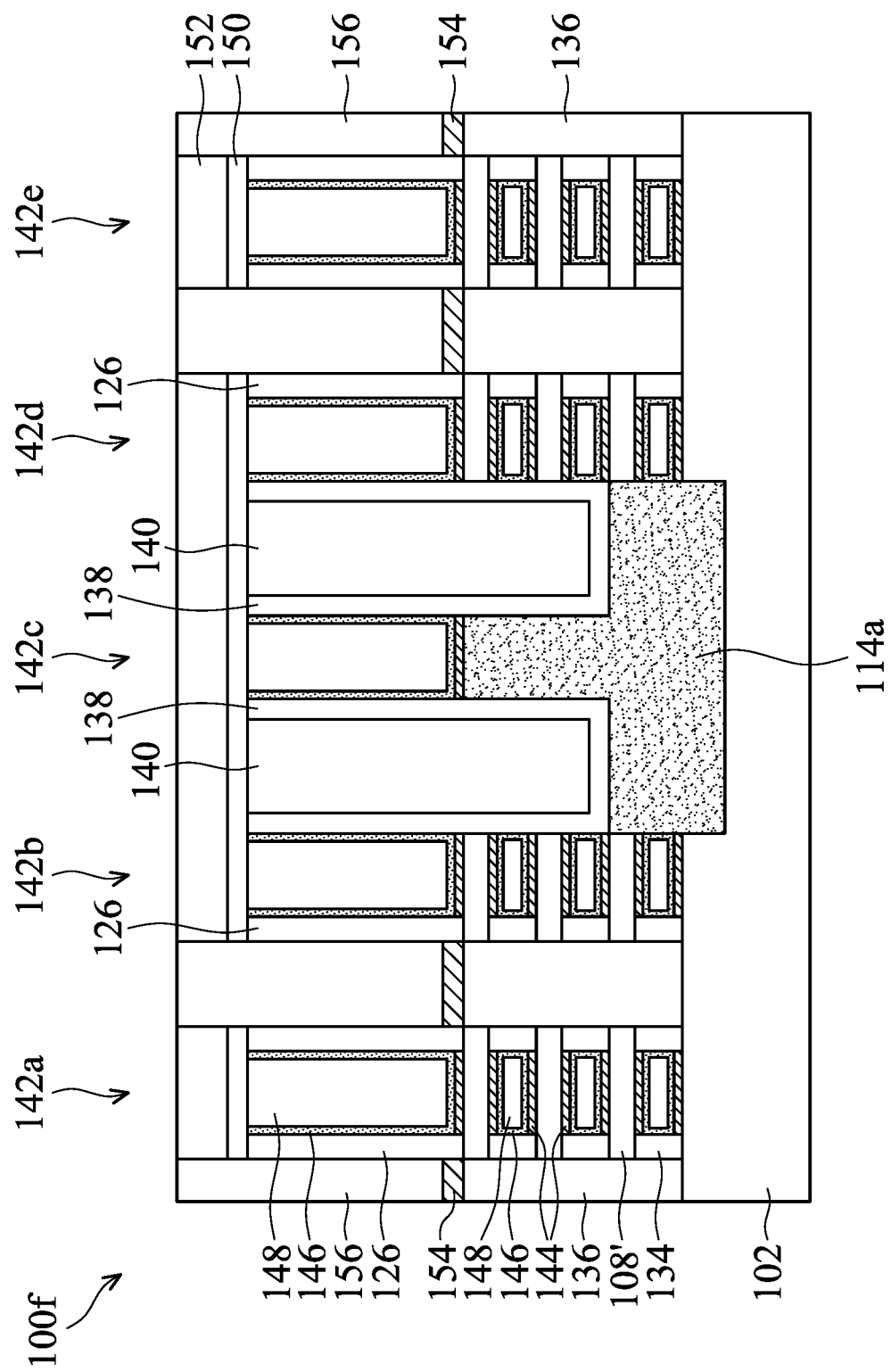

FIGS. 15A-15C shows a cross-sectional representation of a semiconductor device structure 100f, in accordance with some embodiments.

The semiconductor device structure 100f of FIGS. 5A-15C includes elements that are similar to, or the same as, elements of the semiconductor device structure 100a of FIG. 3A-3G, the difference between the FIG. 15C and FIG. 3G is that the top portions of the sidewall portions of the first dielectric structure 114a are removed, and the middle portion directly below the third gate structure 114c is not removed, and the middle portion is higher than two sidewall portions. As a result, the middle portion of the first dielectric structure 114a protrudes from the two sidewall portions of the first dielectric structure 114a.

As shown in FIG. 15A, the semiconductor device structure 100f is similar to the semiconductor device structure 100a shown in FIG. 3A, in accordance with some embodiments.

Next, as shown in FIG. 15B, the top portions of the sidewall portions of the first dielectric structure 114a are removed to form trenches 119, in accordance with some embodiments. As a result, the remaining first dielectric structure 114a has recessed portion at two sides and a protruding portion in middle. The protruding portion of the remaining first dielectric structure 114a is directly below the third dummy gate structure 118c. The recessed portion has the recessed top surface, and the recessed top surface is lower than the top surface of the topmost nanostructure 108'.

Afterwards, as shown in FIG. 15C, the dummy gate structures 118a, 118b, 118c, 118d and 118e are replaced with the first gate structure 142a, the second gate structure 142b, the third gate structure 142c, the fourth gate structure 142d and the fifth gate structure 142e, in accordance with some embodiments. The third gate structure 142c is formed on the protruding portion of the remaining first dielectric structure 114a. The recessed top surface of the sidewall portions of the first dielectric structure 114a is lower than the top surface of the topmost nanostructure 108'. The bottom portions of the CESL 138 and the ILD layer 140 are lower than the topmost surface of the first dielectric structure 114a. The bottom portions of the CESL 138 and the ILD layer 140 are lower than the top surface of the topmost nanostructure 108'. The bottom portions of the CESL 138 and the ILD layer 140 are lower than the top surface of the S/D structure 136.

Figure 16:
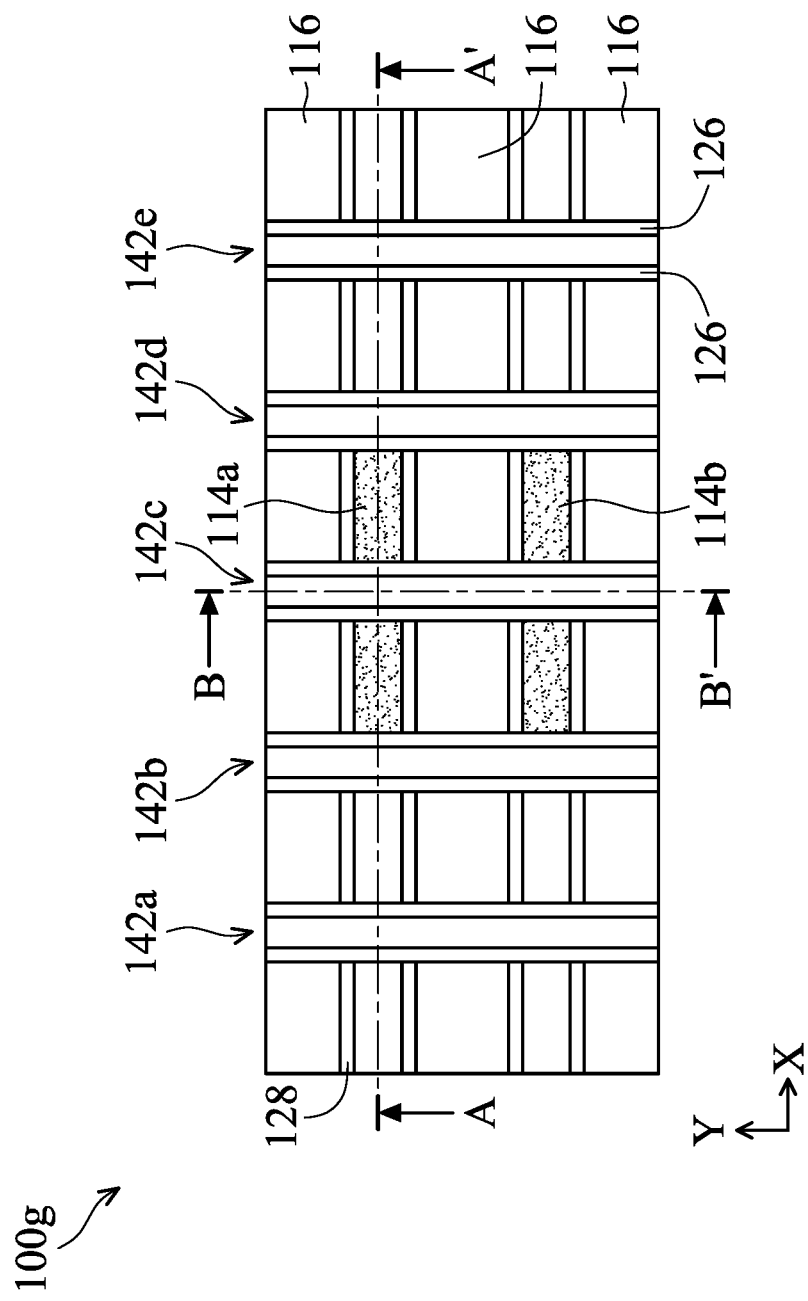
FIG. 16 shows a top-view of manufacturing the semiconductor device structure, in accordance with some embodiments.
Figure 17:
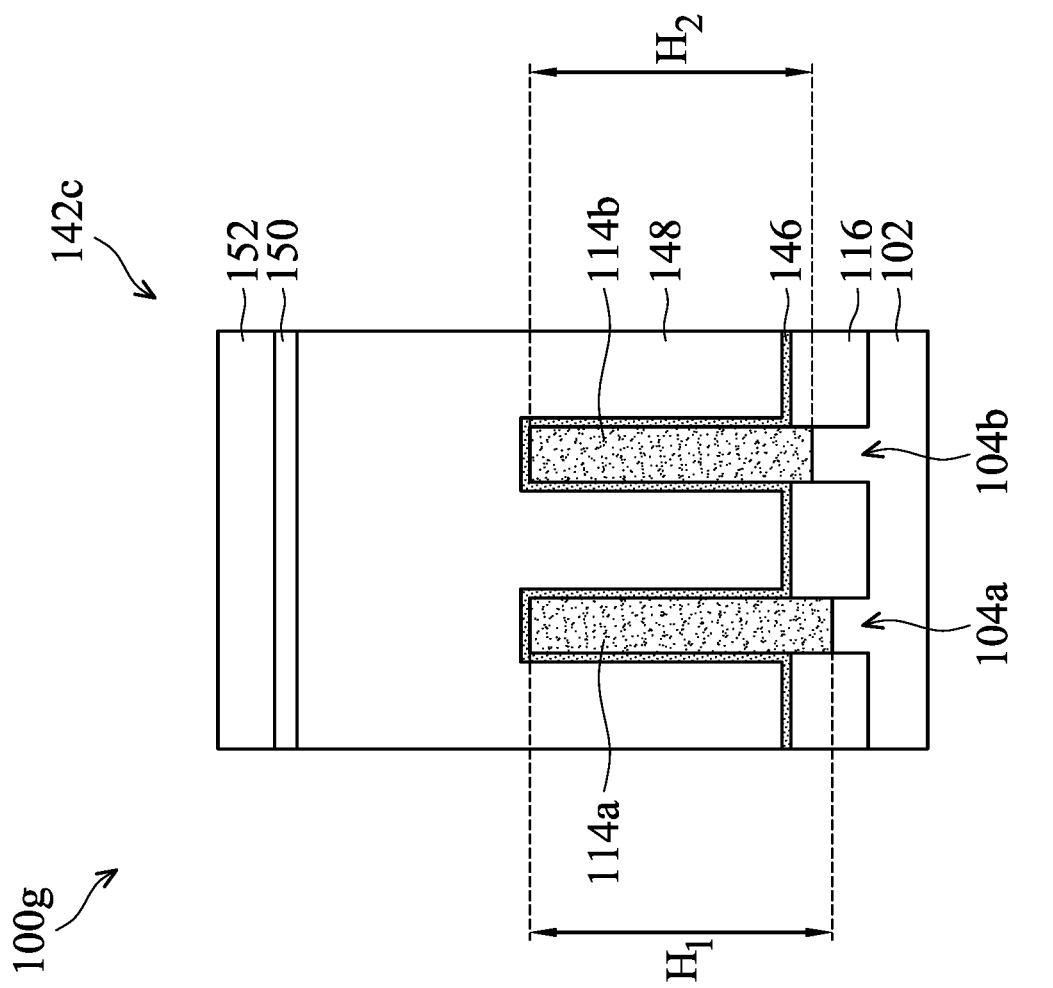
FIG. 17 shows a cross-sectional representation of the semiconductor device structure shown along line B-B' in FIG. 16, in accordance with some embodiments.

FIG. 16 shows a top-view of manufacturing the semiconductor device structure 100g, in accordance with some embodiments. FIG. 17 shows a cross-sectional representation of the semiconductor device structure 100g shown along line B-B' in FIG. 16, in accordance with some embodiments. The semiconductor device structure 100g of FIGS. 16 and 17 includes elements that are similar to, or the same as, elements of the semiconductor device structure 100a of FIGS. 2A-2G and 3A-3G.

As shown in FIGS. 16 and 17, the first dielectric structure 114a and the second dielectric structure 114b have different heights. In some embodiments, the first height $H_1$ of the first dielectric structure 114a is greater than the second height $H_2$ of the second dielectric structure 114b. The top surface of the first dielectric structure 114a is substantially leveled with the top surface of the second dielectric structure 114b. Therefore, the first interface of the first dielectric structure ee114a and the first fin structure 104a is lower than the second interface of the second dielectric structure 114b and the second fin structure 104b. In some embodiments, the first height $H_1$ of the first dielectric structure 114a is in a range from about 5 nm to about 100 nm.

Figure 18:
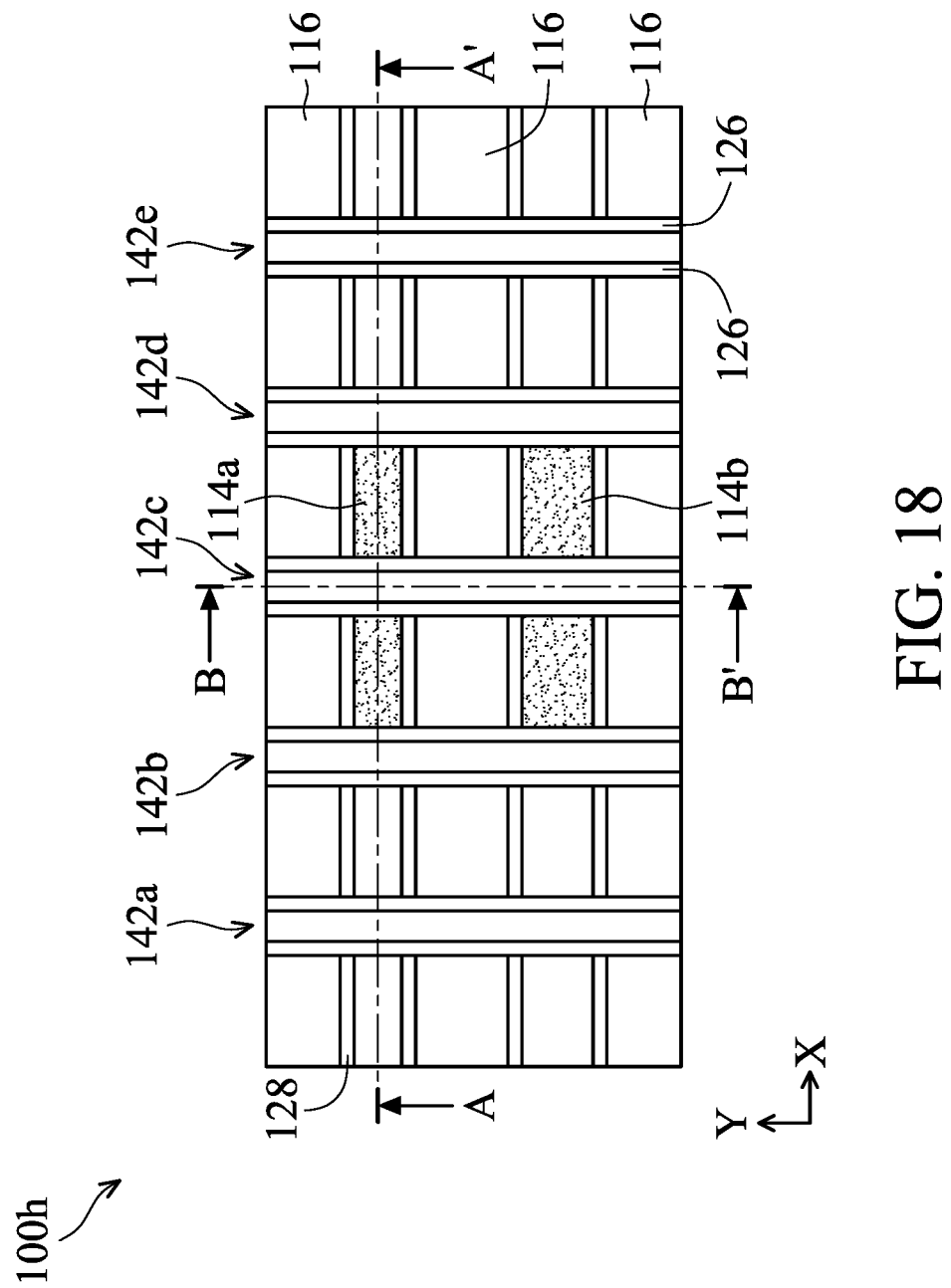
FIG. 18 shows a top-view of manufacturing the semiconductor device structure, in accordance with some embodiments.
Figure 19:
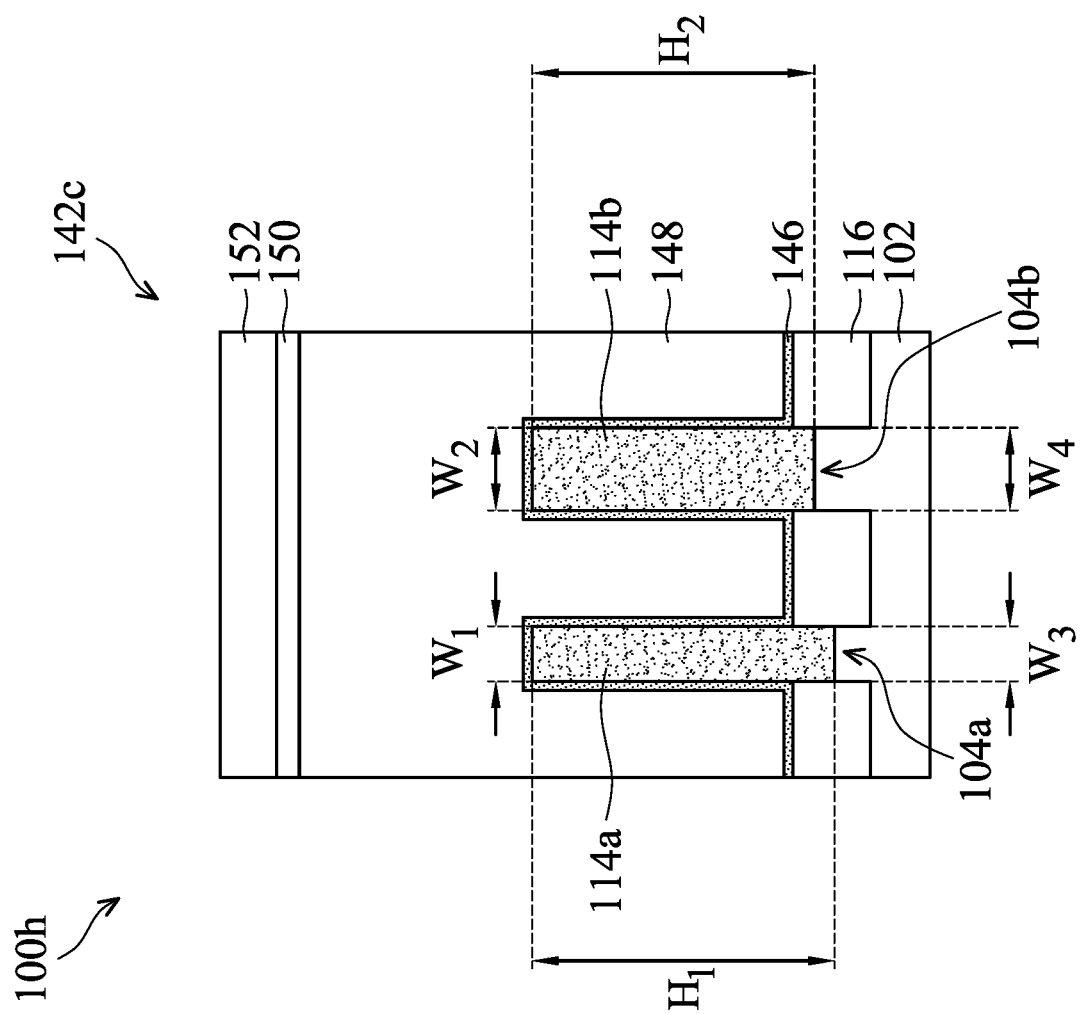
FIG. 19 shows a cross-sectional representation of the semiconductor device structure shown along line B-B' in FIG. 18, in accordance with some embodiments.

FIG. 18 shows a top-view of manufacturing the semiconductor device structure 100h, in accordance with some embodiments. FIG. 19 shows a cross-sectional representation of the semiconductor device structure 100h shown along line B-B' in FIG. 18, in accordance with some embodiments. The semiconductor device structure 100h of FIGS. 18 and 19 includes elements that are similar to, or the same as, elements of the semiconductor device structure 100a of FIGS. 2A-2G and 3A-3G.

As shown in FIGS. 18 and 19, the first dielectric structure 114a and the second dielectric structure 114b have different heights and different widths. In some embodiments, the first height $H_1$ of the first dielectric structure 114a is greater than the second height $H_2$ of the second dielectric structure 114b. In some embodiments, the first width $W_1$ of the first dielectric structure 114a is smaller than the second width $W_2$ of the second dielectric structure 114b. Furthermore, the third width $W_3$ of the first fin structure 104a is substantially equal to the first width $W_1$ of the first dielectric structure 114a. The fourth width $W_4$ of the second fin structure 104b is substantially equal to the second width $W_2$ of the second dielectric structure 114b.

Figure 20:
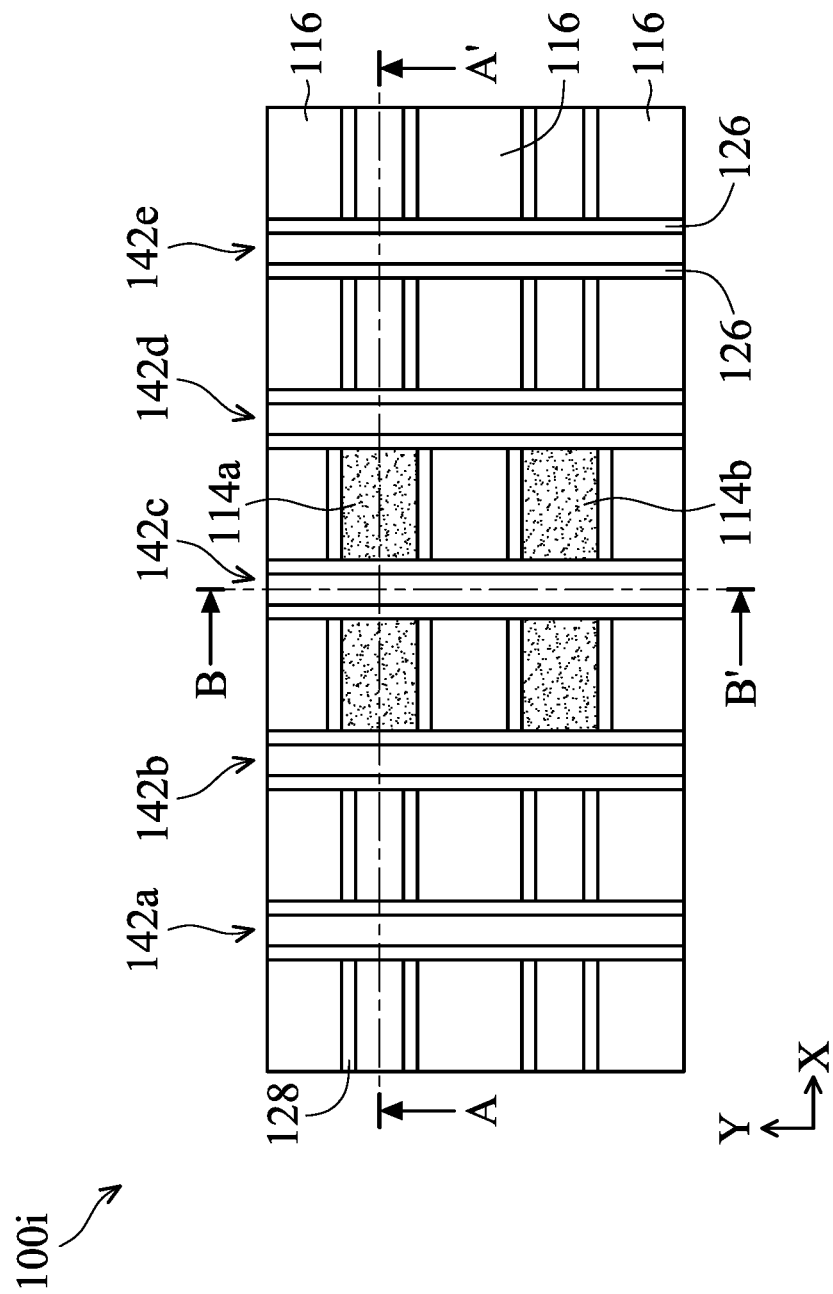
FIG. 20 shows a top-view of manufacturing the semiconductor device structure, in accordance with some embodiments.
Figure 21:
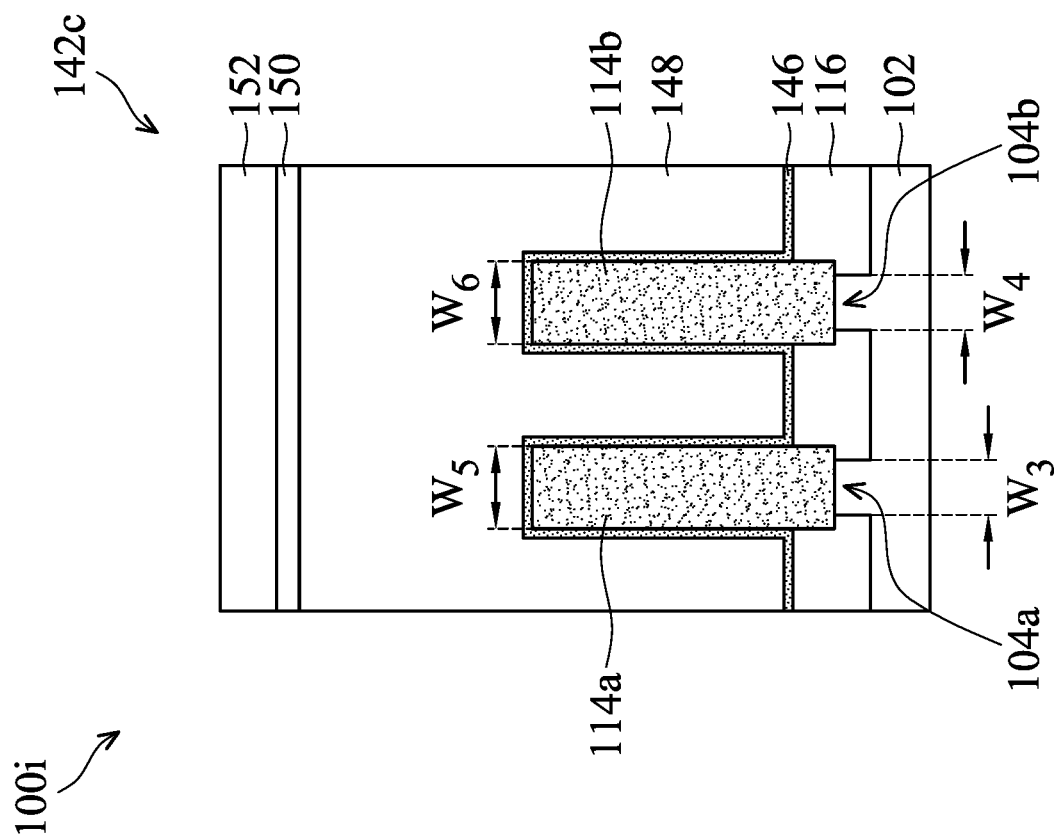
FIG. 21 shows a cross-sectional representation of the semiconductor device structure shown along line B-B' in FIG. 20, in accordance with some embodiments.

FIG. 20 shows a top-view of manufacturing the semiconductor device structure 100i, in accordance with some embodiments. FIG. 21 shows a cross-sectional representation of the semiconductor device structure 100i shown along line B-B' in FIG. 20, in accordance with some embodiments. The semiconductor device structure 100i of FIGS. 20 and 21 includes elements that are similar to, or the same as, elements of the semiconductor device structure 100a of FIGS. 2A-2G and 3A-3G.

As shown in FIGS. 20 and 21, the fifth width $W_5$ of the first dielectric structure 114a and the sixth width $W_6$ of second dielectric structure 114b are greater than the third width $W_3$ of the first fin structure 104a and the width $W_4$ of the second fin structure 104b. In some embodiments, the fifth width $W_5$ of the first dielectric structure 114a and the sixth width $W_6$ of second dielectric structure 114b are the same. In some other embodiments, the fifth width $W_5$ of the first dielectric structure 114a and the sixth width $W_6$ of second dielectric structure 114b are different.

The first dielectric structure 114a and the second dielectric structure 114b are formed along the first direction (e.g. X-axis). In some embodiments, the height of the first dielectric structure 114a and the height of the second dielectric structure 114b may be the same or different. In some embodiments, the width of the first dielectric structure 114a and the width of the second dielectric structure 114b may be the same or different. In some embodiments, the width of the first dielectric structure 114a may be greater than the remaining first fin structure 104a. The interface of the first dielectric structure 114a and the remaining first fin structure 104a is lower than the top surface of the isolation structure 116.

In a comparable embodiment, an isolation region is formed by removing a portion of the fin structure and leaving the remaining fin structure, and the gate structure is formed on the remaining fin structure. Since the remaining fin structure is lower than the real fin structure, the dummy gate structure which was formed on the low remaining fin structure should be higher than the real gate structure which was formed on the real fin structure. The dummy gate structure may easily collapse due to the height. In order to prevent such a collapse, the dielectric structures 114a, 114b are formed in the remaining first fin structure 104a and the remaining second fin structure 104b. Since the first dielectric structure 104a and the second dielectric structure 104b are higher than the top surface of the isolation structure 116, the first dielectric structure 104a and the second dielectric structure 104b provide support for the dummy gate structure 142c. Accordingly, the performance of the semiconductor device structure is improved.

It should be noted that same elements in FIGS. 1A to 21 may be designated by the same numerals and may include similar or the same materials and may be formed by similar or the same processes; therefore such redundant details are omitted in the interest of brevity. In addition, although FIGS. 1A to 21 are described in relation to the method, it will be appreciated that the structures disclosed in FIGS. 1A to 21 are not limited to the method but may stand alone as structures independent of the method. Similarly, although the methods shown in FIGS. 1A to 21 are not limited to the disclosed structures but may stand alone independent of the structures. Furthermore, the nanostructures described above may include nanowires, nanosheets, or other applicable nanostructures in accordance with some embodiments.

Also, while disclosed methods are illustrated and described below as a series of acts or events, it will be appreciated that the illustrated ordering of such acts or events may be altered in some other embodiments. For example, some acts may occur in different orders and/or concurrently with other acts or events apart from those illustrated and/or described above. In addition, not all illustrated acts may be required to implement one or more aspects or embodiments of the description above. Further, one or more of the acts depicted above may be carried out in one or more separate acts and/or phases.

Furthermore, the terms "approximately," "substantially," "substantial" and "about" describe above account for small variations and may be varied in different technologies and be in the deviation range understood by the skilled in the art. For example, when used in conjunction with an event or circumstance, the terms can refer to instances in which the event or circumstance occurs precisely as well as instances in which the event or circumstance occurs to a close approximation.

Embodiments for forming semiconductor device structures may be provided. The semiconductor device structure includes a cut region to provide an isolation function. The first fin structure and the second fin structure including stacking layers are formed over the substrate. The top portion of the first fin structure and the top portion of the second fin structure in the cut region are removed to form the first trench and the second trench. The first dielectric structure and the second dielectric structure are formed in the first trench and the second trench, respectively. The top surface of the first dielectric structure and the top surface of the second dielectric structure are higher than the top surface of the isolation structure. The first dielectric structure and the second dielectric structure provide enough support, and the gate structure formed on the first dielectric structure and the second dielectric structure does not easily collapse. In addition, the damage of the dielectric wall is prevented sine the dielectric wall is formed between the first dielectric structure and the second dielectric structure in the forksheet device. Accordingly, the performance of the semiconductor device structure is improved.

In some embodiments, a semiconductor device structure is provided. The semiconductor device structure includes an isolation structure formed over a substrate, and first nanostructures formed over the isolation structure along a first direction. The semiconductor device structure includes a first gate structure formed over the first nanostructures along a second direction, and a first dielectric structure formed adjacent to the first nanostructures along the first direction. The first dielectric structure is in direct contact with the first nanostructures. The semiconductor device structure includes a second gate structure formed adjacent to the first gate structure, and the second gate structure is formed directly over the first dielectric structure.

In some embodiments, a semiconductor device structure is provided. The semiconductor device structure includes an isolation structure formed over a substrate, and first nanostructures formed over the isolation structure along a first direction. The semiconductor device structure includes a first dielectric structure formed adjacent to the first nanostructures along the first direction, and the first dielectric structure is in direct contact with the first nanostructures. The semiconductor device structure includes a first gate structure wrapped around the first nanostructures along a second direction, and a first S/D structure formed adjacent to the first gate structure. The first S/D structure and the first dielectric structure are formed on opposite sidewall surfaces of the first nanostructures.

In some embodiments, a method for manufacturing a semiconductor device structure is provided. The method includes forming a first fin structure and a second fin structure, and each of the first fin structure and the second fin structure includes first semiconductor material layers and second semiconductor layers alternately stacked. The method includes forming an isolation material over the first fin structure and the second fin structure, and removing a portion of the first fin structure and a portion of the second fin structure to form a first trench and a second trench. The method includes filling a dielectric material into the first trench and the second trench to form a first dielectric structure over a remaining first fin structure and a second dielectric structure over a remaining second fin structure. The method includes removing a portion of the isolation material to form an isolation structure, and a top surface of the isolation structure is higher than a first interface between the first dielectric structure and the remaining first fin structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device structure, comprising:
an isolation structure formed over a substrate;
first nanostructures formed over the isolation structure along a first direction;
a first gate structure formed over the first nanostructures along a second direction;

a first dielectric structure formed adjacent to the first nanostructures along the first direction, wherein the first dielectric structure is in direct contact with the first nanostructures; and a second gate structure formed adjacent to the first gate structure, wherein second gate structure is formed directly over the first dielectric structure.

2. The semiconductor device structure as claimed in claim 1, wherein the first dielectric structure and the isolation structure are made of different materials.

3. The semiconductor device structure as claimed in claim 1, further comprising:
a source/drain (S/D) structure formed adjacent to the first gate structure, wherein the S/D structure and the first dielectric structure are formed on opposite sidewall surfaces of the first nanostructure.

4. The semiconductor device structure as claimed in claim 1, further comprising:
a fin structure formed over the substrate, wherein the first dielectric structure is formed over the fin structure, and a top surface of the fin structure is lower than a bottom surface of a bottommost nanostructure.

5. The semiconductor device structure as claimed in claim 4, wherein a width of the first dielectric structure along the second direction is greater than a width of the fin structure.

6. The semiconductor device structure as claimed in claim 1, wherein a top surface of the first dielectric structure is higher than a top surface of a topmost first nanostructure.

7. The semiconductor device structure as claimed in claim 1, further comprising:
a second dielectric structure adjacent to the first dielectric structure; and
a dielectric wall between the first dielectric structure and the second dielectric structure, wherein the dielectric wall and the first dielectric structure are made of different materials.

8. The semiconductor device structure as claimed in claim 1, further comprising:
second nanostructures formed adjacent to the first nanostructure, wherein the first dielectric structure is between the first nanostructures and the second nanostructures.

9. The semiconductor device structure as claimed in claim 8, wherein a width of the first dielectric structure along the second direction is smaller than a width of the second dielectric structure.

10. The semiconductor device structure as claimed in claim 1, wherein the first dielectric structure has a recessed top surface, and the recessed top surface is lower than a top surface of a topmost nanostructure.

11. A semiconductor device structure, comprising:
an isolation structure formed over a substrate;
first nanostructures formed over the isolation structure along a first direction;
a first dielectric structure formed adjacent to the first nanostructures along the first direction, wherein the first dielectric structure is in direct contact with the first nanostructures;
a first gate structure wrapped around the first nanostructures along a second direction; and
a first S/D structure formed adjacent to the first gate structure, wherein the first S/D structure and the first dielectric structure are formed on opposite sidewall surfaces of the first nanostructures.

12. The semiconductor device structure as claimed in claim 11, further comprising:
an inner spacer layer between the S/D structure and the first gate structure, wherein no inner spacer layer is between the first gate structure and the dielectric structure.

13. The semiconductor device structure as claimed in claim 11, further comprising:
a second gate structure formed over the dielectric structure; and
a third gate structure formed adjacent to the second gate structure, wherein the second gate structure is between the first gate structure and the third gate structure.

14. The semiconductor device structure as claimed in claim 11, further comprising:
a gate spacer layer formed adjacent to the first gate structure, wherein a sidewall surface of the first dielectric structure is aligned with an inner sidewall surface of the gate spacer layer.

15. The semiconductor device structure as claimed in claim 11, further comprising:
a second dielectric structure adjacent to the first dielectric structure; and
a dielectric wall between the first dielectric structure and the second dielectric structure, wherein a bottom surface of the dielectric wall is lower than a bottom surface of the first dielectric structure.

16. The semiconductor device structure as claimed in claim 11, further comprising:
a fin structure formed over the substrate, wherein the first dielectric structure is formed over the fin structure, and an interface between the fin structure and the first dielectric structure is lower than a top surface of the isolation structure.

17. A method for forming a semiconductor device structure, comprising:
forming a first fin structure and a second fin structure, wherein each of the first fin structure and the second fin structure comprises first semiconductor material layers and second semiconductor layers alternately stacked;
forming an isolation material over the first fin structure and the second fin structure;
removing a portion of the first fin structure and a portion of the second fin structure to form a first trench and a second trench;
filling a dielectric material into the first trench and the second trench to form a first dielectric structure over a remaining first fin structure and a second dielectric structure over a remaining second fin structure; and
removing a portion of the isolation material to form an isolation structure, wherein a top surface of the isolation structure is higher than a first interface between the first dielectric structure and the remaining first fin structure.

18. The method for forming the semiconductor device structure as claimed in claim 17, further comprising:
forming a dielectric wall between the first dielectric structure and the second dielectric structure.

19. The method for forming the semiconductor device structure as claimed in claim 17, further comprising:
forming a first gate structure on the first dielectric structure, wherein first gate structure is in direct contact with the first dielectric structure.

20. The method for forming the semiconductor device structure as claimed in claim 19, further comprising:
forming a second gate structure adjacent to the first gate structure; and forming an S/D structure adjacent to the second gate structure, wherein the second gate structure is between the S/D structure and the first dielectric structure.

* * * * *